US012648139B2

(12) United States Patent
Tsuchiya

(10) Patent No.: US 12,648,139 B2
(45) Date of Patent: Jun. 2, 2026

(54) SEMICONDUCTOR MEMORY DEVICE AND METHOD OF MANUFACTURING THE SAME

(71) Applicant: Kioxia Corporation, Tokyo (JP)

(72) Inventor: Yuta Tsuchiya, Yokkaichi Mie (JP)

(73) Assignee: Kioxia Corporation, Tokyo (JP)

( * ) Notice: Subject to any disclaimer, the term of this patent is extended or adjusted under 35 U.S.C. 154(b) by 602 days.

(21) Appl. No.: 18/080,963

(22) Filed: Dec. 14, 2022

(65) Prior Publication Data

US 2023/0413549 A1 Dec. 21, 2023

(30) Foreign Application Priority Data

May 19, 2022 (JP) ................................. 2022-082463

(51) Int. Cl.
*H10B 43/27* (2023.01)
*H10B 43/35* (2023.01)
(52) U.S. Cl.
CPC ............. *H10B 43/27* (2023.02); *H10B 43/35* (2023.02)
(58) Field of Classification Search
CPC ................................. H10B 43/10; H10B 43/27
See application file for complete search history.

(56) References Cited

U.S. PATENT DOCUMENTS

| | | | |
|---|---|---|---|
| 9,646,975 B2 | 5/2017 | Peri et al. | |
| 10,854,620 B2 | 12/2020 | Mori et al. | |
| 2020/0295020 A1* | 9/2020 | Mori ...................... | H10B 41/27 |

FOREIGN PATENT DOCUMENTS

JP 2020-150218 A 9/2020

* cited by examiner

*Primary Examiner* — Brent A. Fairbanks
*Assistant Examiner* — Molly K Reida
(74) *Attorney, Agent, or Firm* — Foley & Lardner LLP

(57) ABSTRACT

A semiconductor memory device includes finger structures arranged in a first direction, a bit line disposed on one side in a stacking direction with respect to the finger structures, and an inter-finger insulating layer disposed between two finger structures. A first finger structure includes conductive layers, a semiconductor layer opposed to the conductive layers, a first insulating layer disposed between the bit line and the conductive layers, and a second insulating layer disposed between the first insulating layer and the conductive layers. A distance between the first insulating layer and the inter-finger insulating layer at a position corresponding to a surface on a side of the bit line of the first insulating layer is larger than a distance between the second insulating layer and the inter-finger insulating layer at a position corresponding to a surface on an opposite side of the bit line of the second insulating layer.

16 Claims, 47 Drawing Sheets

104
103
SHE
106
ST { 142
141
102
121
110
101
110
101
110
101
110
101
110
101
110
101
110
101
110
101
110
101
110
101
110
101
110
101
110
101
110
101
110
101
110
101
120
130
125
122
112

SEMICONDUCTOR MEMORY DEVICE AND METHOD OF MANUFACTURING THE SAME

CROSS-REFERENCE TO RELATED APPLICATIONS

This application is based upon and claims the benefit of Japanese Patent Application No. 2022-082463, filed on May 19, 2022, the entire contents of which are incorporated herein by reference.

BACKGROUND

Field

Embodiments described herein relate generally to a semiconductor memory device and a method of manufacturing the same.

Description of the Related Art

There has been known a semiconductor memory device including a plurality of conductive layers arranged in a stacking direction, a semiconductor layer opposed to these plurality of conductive layers, and an electric charge accumulating film disposed between the conductive layers and the semiconductor layer.

BRIEF DESCRIPTION OF THE DRAWINGS

Figure 10:
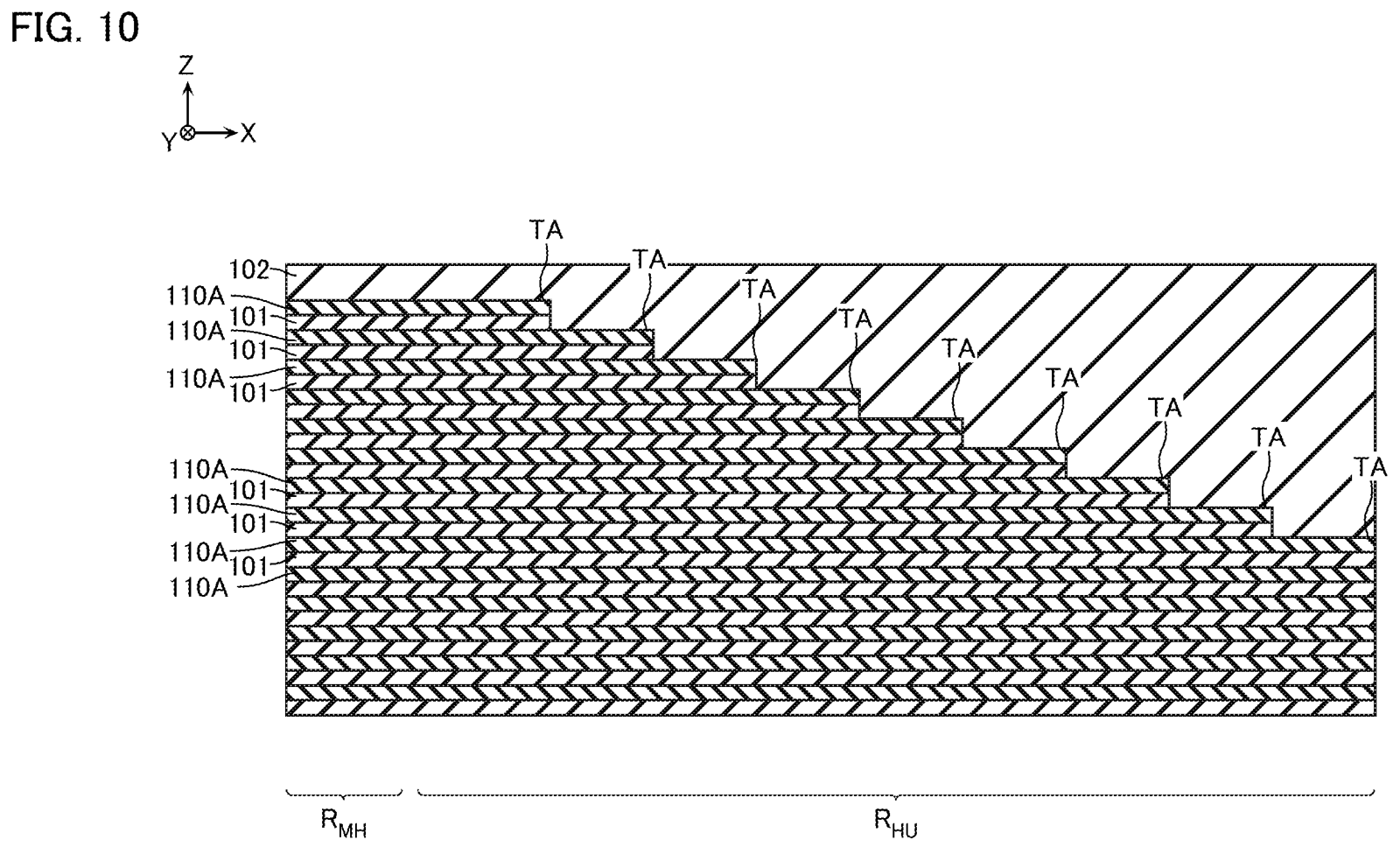

FIG. 10 is a schematic cross-sectional view for describing the same manufacturing method;

FIG. 40 is a schematic cross-sectional view for describing a manufacturing process of the semiconductor memory device according to the comparative example;

FIG. 41 is a schematic cross-sectional view for describing the manufacturing process of the semiconductor memory device according to the comparative example;

DETAILED DESCRIPTION

Figure 1:
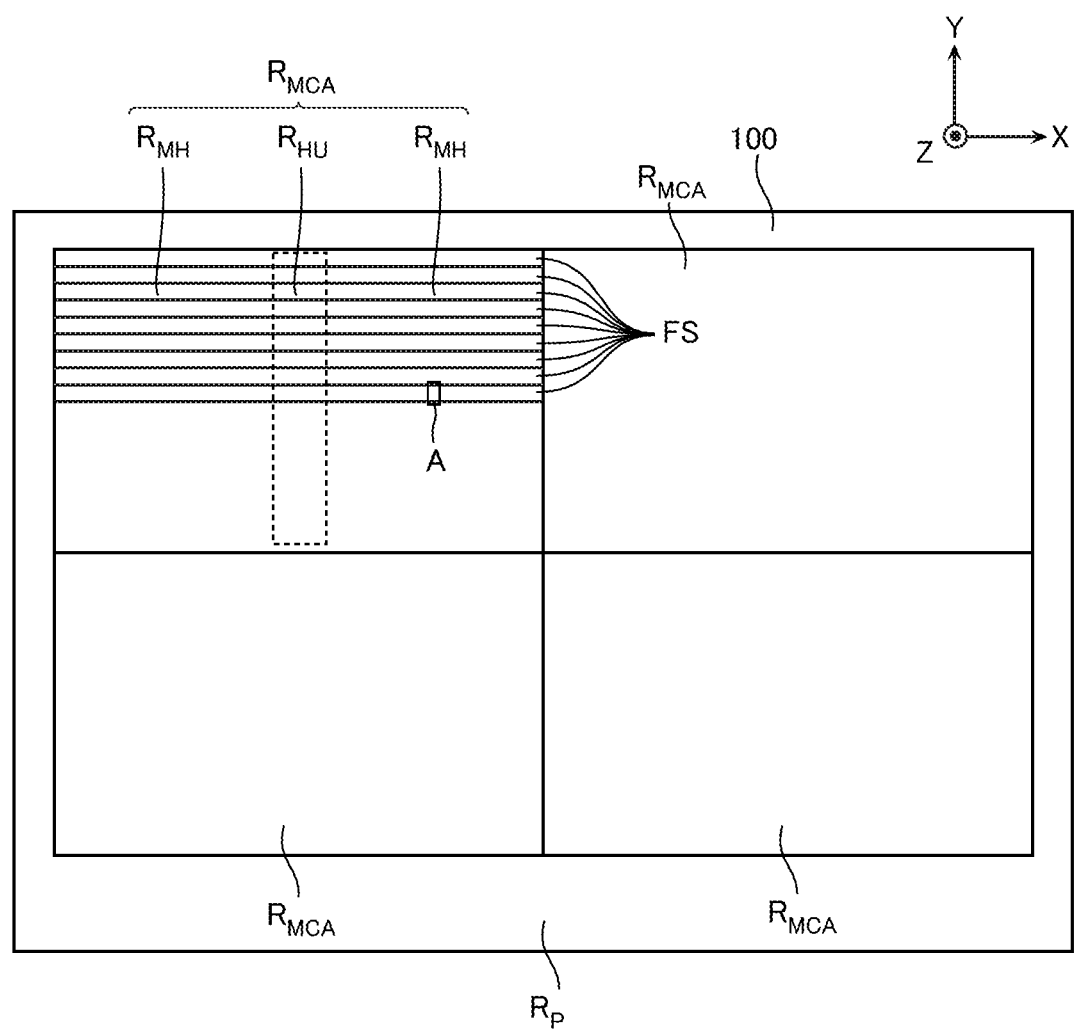
FIG. 1 is a schematic plan view illustrating a configuration of a semiconductor memory device according to a first embodiment.

A semiconductor memory device according to one embodiment comprises: a plurality of finger structures arranged in a first direction; a bit line extending in the first direction and disposed on one side in a stacking direction intersecting with the first direction with respect to the plurality of finger structures; and an inter-finger insulating layer disposed between a first finger structure and a second finger structure adjacent in the first direction of the plurality of finger structures. The first finger structure includes: a plurality of conductive layers arranged in the stacking direction; a semiconductor layer extending in the stacking direction and opposed to the plurality of conductive layers, the semiconductor layer being electrically connected to the bit line; and an electric charge accumulating film disposed between the plurality of conductive layers and the semiconductor layer. The first finger structure includes: a first insulating layer disposed between the bit line and the plurality of conductive layers, the first insulating layer containing nitrogen (N) and silicon (Si); and a second insulating layer disposed between the first insulating layer and the plurality of conductive layers. The inter-finger insulating layer extends in the stacking direction from a position closer to the bit line than the plurality of conductive layers to a position farther from the bit line than the plurality of conductive layers along a surface on a side of the second finger structure in the first direction of the plurality of conductive layers. The first insulating layer and the second insulating layer are made of mutually different materials. When a distance in the first direction between the first insulating layer and the inter-finger insulating layer at a first position corresponding to a surface on a side of the bit line in the stacking direction of the first insulating layer is a first distance, and when a distance in the first direction between the second insulating layer and the inter-finger insulating layer at a second position corresponding to a surface on an opposite side of the bit line in the stacking direction of the second insulating layer is a second distance, the first distance is larger than the second distance.

Next, the semiconductor memory devices according to embodiments are described in detail with reference to the drawings. The following embodiments are only examples, and not described for the purpose of limiting the present invention. The following drawings are schematic, and for convenience of description, a part of a configuration and the like is sometimes omitted. Parts common in a plurality of embodiments are attached by the same reference numerals and their descriptions may be omitted.

In this specification, when referring to a "semiconductor memory device", it may mean a memory die and may mean a memory system including a controller die, such as a memory chip, a memory card, and a Solid State Drive (SSD). Further, it may mean a configuration including a host computer, such as a smartphone, a tablet terminal, and a personal computer.

In this specification, when it is referred that a first configuration "is electrically connected" to a second configuration, the first configuration may be directly connected to the second configuration, and the first configuration may be connected to the second configuration via a wiring, a semiconductor member, a transistor, or the like. For example, when three transistors are connected in series, even when the second transistor is in OFF state, the first transistor is "electrically connected" to the third transistor.

In this specification, a predetermined direction parallel to a surface of a substrate is referred to as an X-direction, a direction parallel to the surface of the substrate and perpendicular to the X-direction is referred to as a Y-direction, and a direction perpendicular to the surface of the substrate is referred to as a Z-direction.

In this specification, a direction that intersects with the surface of the substrate may be referred to as a stacking direction. A direction along a predetermined plane intersecting with the stacking direction may be referred to as a first direction, a direction along this predetermined plane and intersecting with the first direction may be referred to as a second direction. The stacking direction may correspond to the Z-direction and need not correspond to the Z-direction. The first direction and second direction may each correspond to any of the X-direction and the Y-direction or need not correspond to these directions.

Expressions such as "above" and "below" in this specification are based on the substrate. For example, a direction away from the substrate along the Z-direction is referred to as above and a direction approaching the substrate along the Z-direction is referred to as below. A lower surface and a lower end of a certain configuration mean a surface and an end portion at the substrate side of this configuration. An upper surface and an upper end of a certain configuration mean a surface and an end portion at a side opposite to the substrate of this configuration. A surface intersecting with the X-direction or the Y-direction is referred to as a side surface and the like.

First Embodiment

[Configuration]

Figure 2:
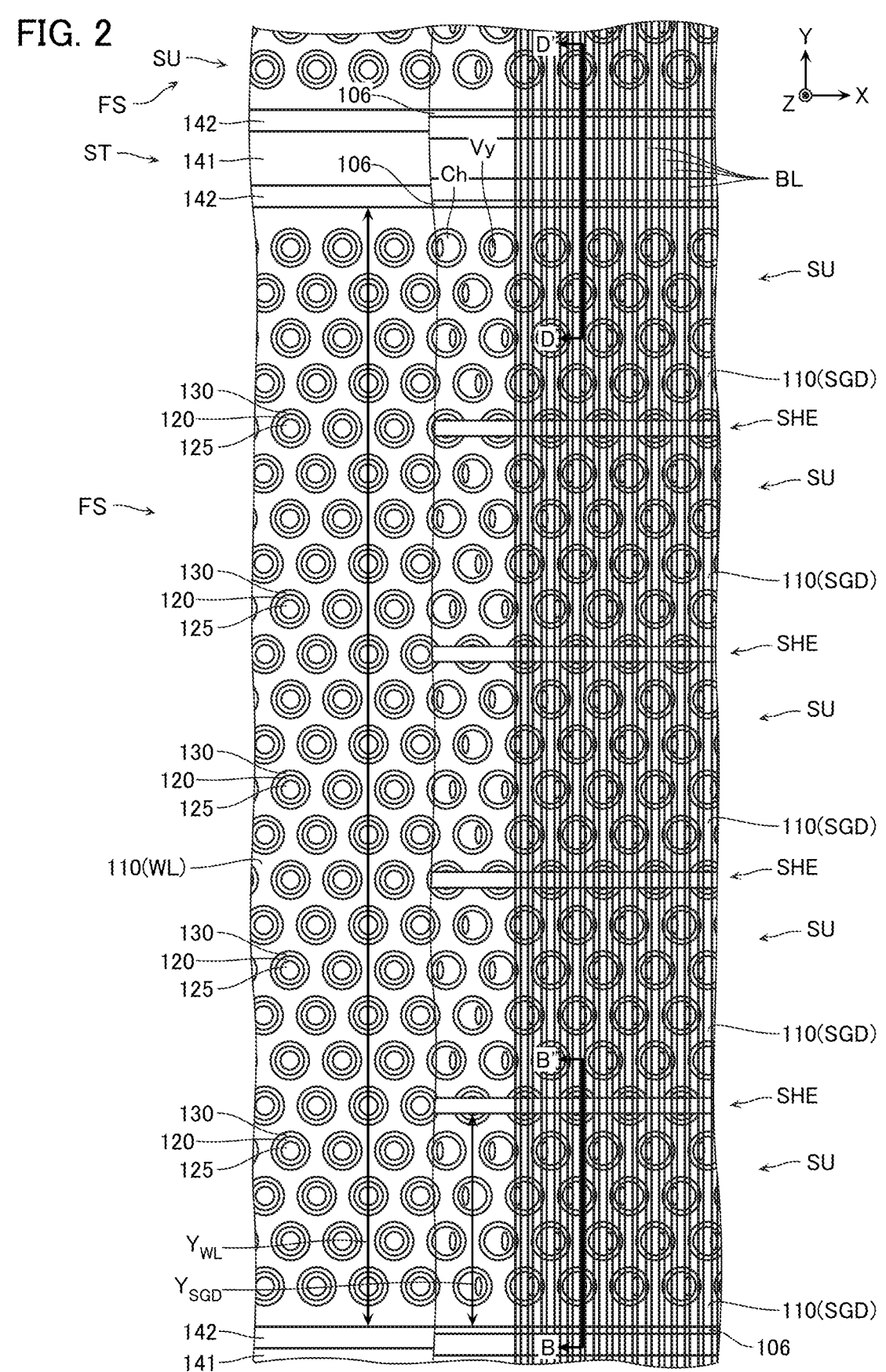
FIG. 2 is a schematic plan view illustrating the configuration of the same semiconductor memory device.
Figure 3:
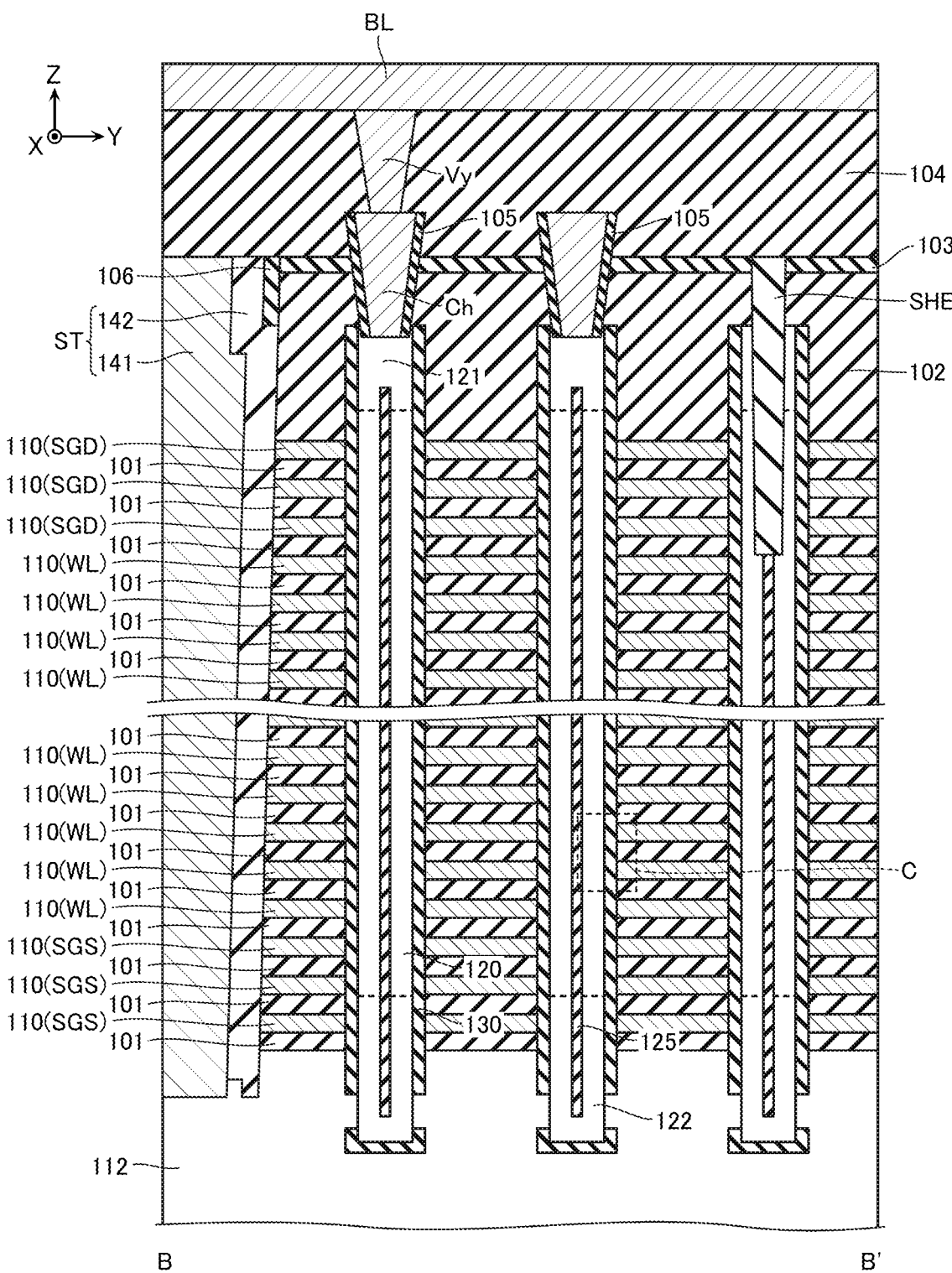
FIG. 3 is a schematic cross-sectional view illustrating the configuration of the same semiconductor memory device.
Figure 4:
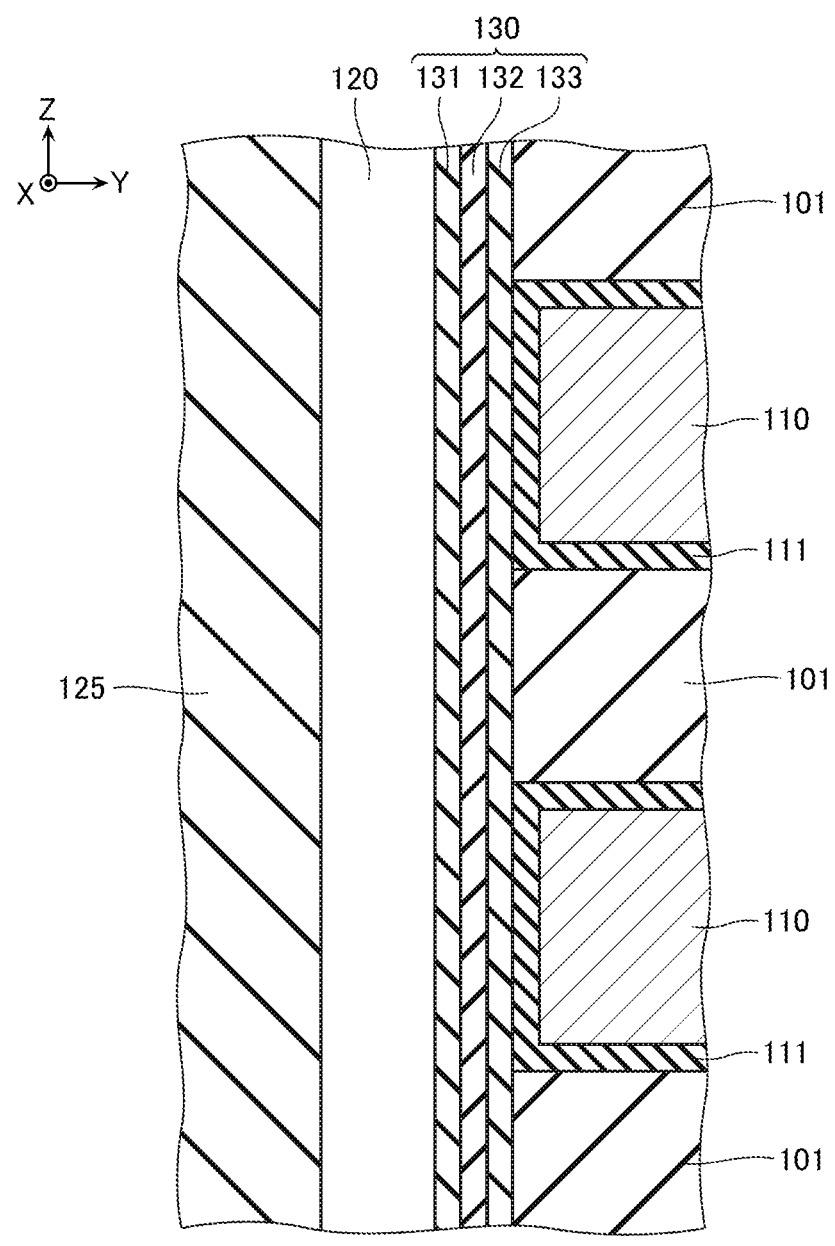
FIG. 4 is a schematic cross-sectional view illustrating the configuration of the same semiconductor memory device.
Figure 5:
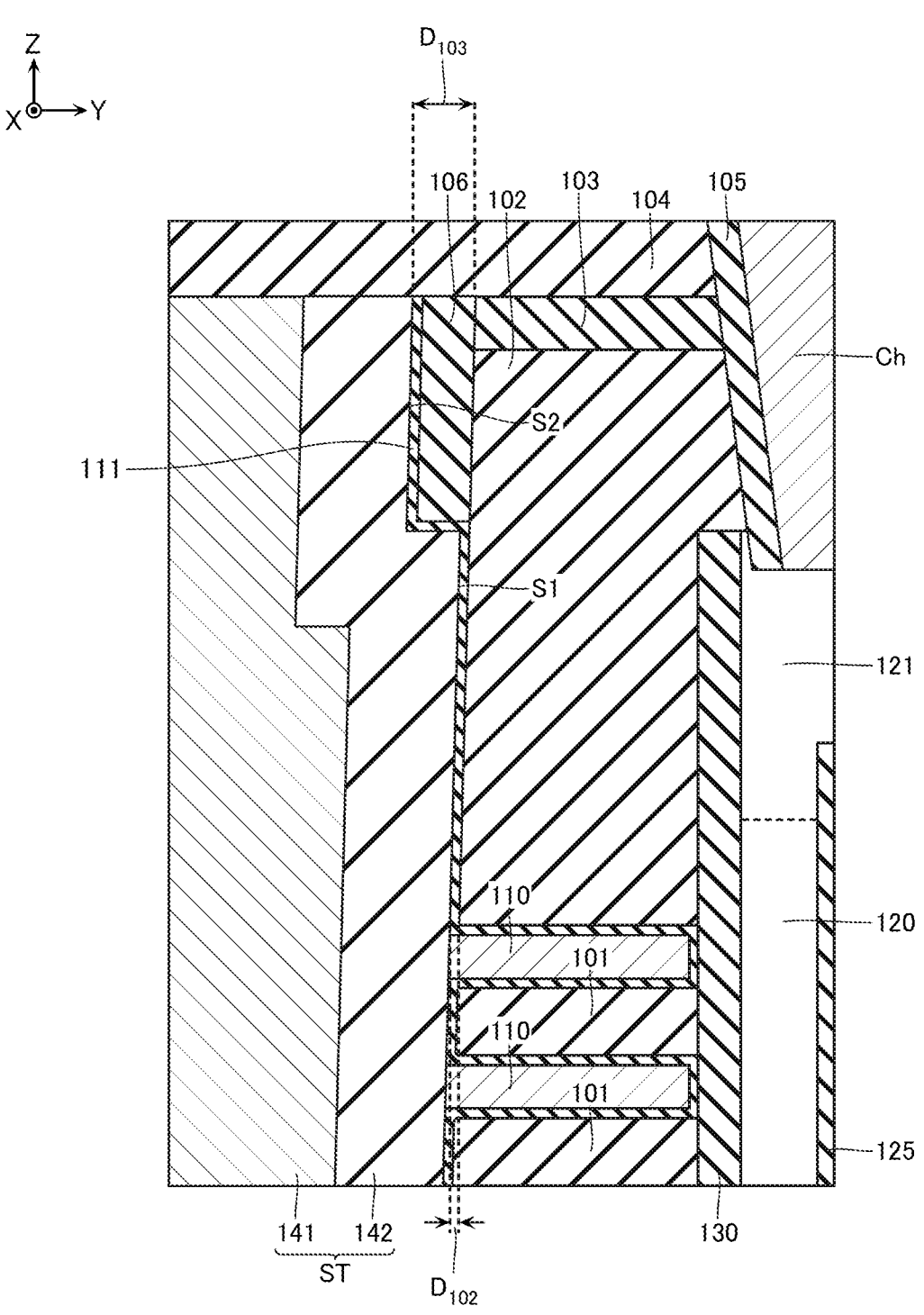
FIG. 5 is a schematic cross-sectional view illustrating the configuration of the same semiconductor memory device.
Figure 6:
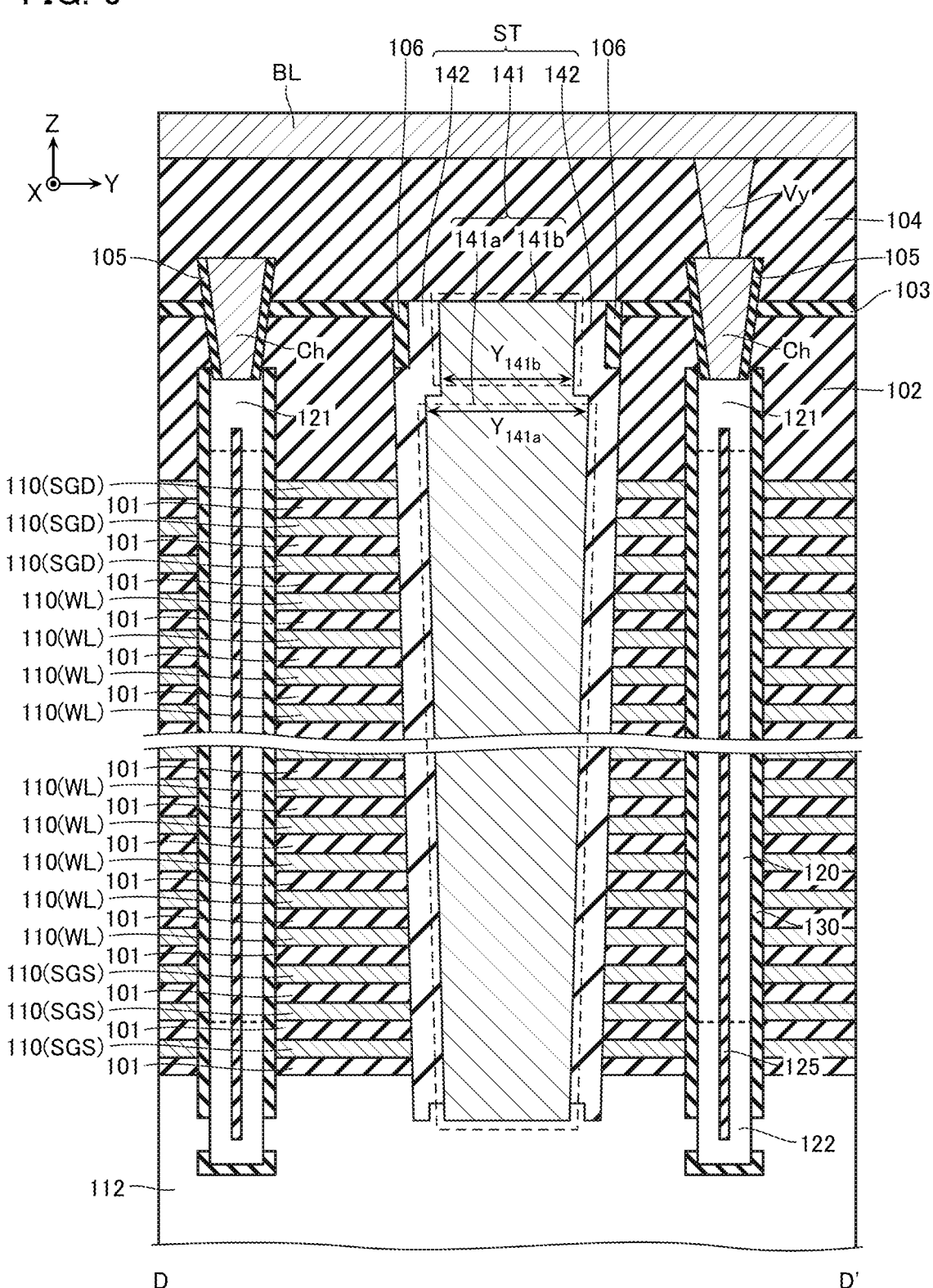
FIG. 6 is a schematic cross-sectional view illustrating the configuration of the same semiconductor memory device.
Figure 7:
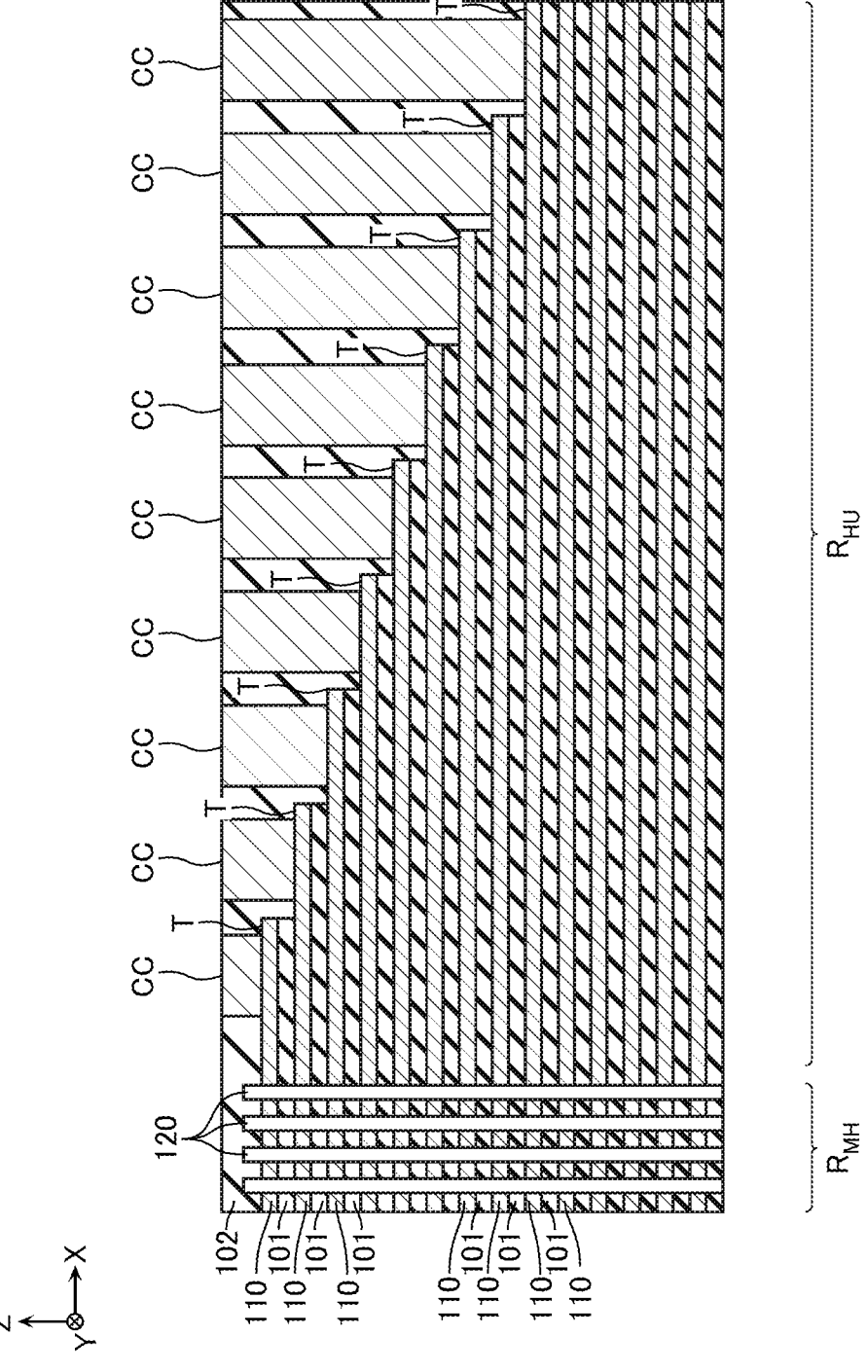
FIG. 7 is a schematic cross-sectional view illustrating the configuration of the same semiconductor memory device.

FIG. 1 is a schematic plan view illustrating a configuration of a semiconductor memory device according to a first embodiment. FIG. 2 is a schematic plan view illustrating the configuration of the same semiconductor memory device and illustrates an enlarged part indicated by A in FIG. 1. FIG. 3 is a schematic cross-sectional view illustrating the configuration of the same semiconductor memory device and illustrates a cross-sectional surface that takes the structure illustrated in FIG. 2 along the line B-B' and viewed along the direction of the arrow. FIG. 4 is a schematic cross-sectional view illustrating the configuration of the same semiconductor memory device, and illustrates an enlarged part indicated by C in FIG. 3. Note that, while FIG. 4 illustrates a YZ cross-sectional surface, when a cross-sectional surface (for example, an XZ cross-sectional surface) along the central axis of a semiconductor layer 120 other than the YZ cross-sectional surface is observed, a structure similar to that in FIG. 4 is observed. FIG. 5 is a schematic cross-sectional view illustrating the configuration of the same semiconductor memory device, and illustrates an enlarged part in FIG. 3. FIG. 6 is a schematic cross-sectional view illustrating the configuration of the same semiconductor memory device, and illustrates a cross-sectional surface that takes the structure illustrated in FIG. 2 along the line D-D' and viewed along the direction of the arrow. FIG. 7 is a schematic cross-sectional view illustrating the configuration of the same semiconductor memory device.

As illustrated in FIG. 1, the semiconductor memory device according to the embodiment includes a semiconductor substrate 100. In the illustrated example, the semiconductor substrate 100 includes four memory cell array regions R MCA arranged in the X-direction and the Y-direction. The memory cell array region $R_{MCA}$ includes two memory hole regions $R_{MH}$ arranged in the X-direction and a hook-up region $R_{HU}$ disposed between these two memory hole regions $R_{MH}$. A peripheral region $R_P$ is disposed in an end portion in the Y-direction of the semiconductor substrate 100.

Note that, in the illustrated example, the hook-up region $R_{HU}$ is disposed in the center in the X-direction of the memory cell array region $R_{MCA}$. However, such a configuration is merely an example, and the specific configuration is adjustable as necessary. For example, the hook-up region $R_{HU}$ may be disposed at both end portions or one end portion in the X-direction of the memory cell array region $R_{MCA}$.

The memory cell array region R MCA includes a plurality of finger structures FS arranged in the Y-direction. The finger structure FS includes, for example, as illustrated in FIG. 2, a plurality of string units SU arranged in the Y-direction. Between two finger structures FS adjacent in the Y-direction, an inter-finger structure ST is disposed. Between two string units SU adjacent in the Y-direction, an inter-string unit insulating layer (an inter-conductive layer insulating layer) SHE of, for example, silicon oxide ($SiO_2$) is disposed.

In this embodiment, one finger structure FS functions as one block of a NAND flash memory. However, the plurality of finger structures FS may function as one block. The finger structure FS may include only one string unit SU.

[Structure of Memory Hole Region $R_{MH}$]

The finger structure FS includes, for example, as illustrated in FIG. 3, a plurality of conductive layers 110 arranged in the Z-direction, a wiring layer 112 disposed below these plurality of conductive layers 110, and a plurality of semiconductor layers 120 extending in the Z-direction. Respective gate insulating films 130 are disposed between the plurality of conductive layers 110 and the plurality of semiconductor layers 120.

The conductive layer 110 has an approximately plate shape extending in the X-direction. The conductive layer 110 may include, for example, a stacked film of a barrier conductive film, such as titanium nitride (TiN), and a metal film, such as tungsten (W). The conductive layer 110 may contain, for example, polycrystalline silicon that contains impurities, such as phosphorus (P) or boron (B). Between the plurality of conductive layers 110 arranged in the Z-direction, insulating layers 101 of silicon oxide ($SiO_2$) or the like are disposed. On an upper surface of the conductive layer 110 as the uppermost layer, an insulating layer 102 of silicon oxide ($SiO_2$) or the like, an insulating layer 103 of silicon nitride (SiN) or the like, and an insulating layer 104 of silicon oxide ($SiO_2$) or the like are disposed in the order. At both the end portions in the Y-direction of the finger structure FS, insulating layers 106 of silicon oxide ($SiO_2$) or the like are disposed on Y-direction side surfaces of the insulating layers 102 and 103 which are made of mutually different materials. The insulating layer 106 has a lower end in the Z-direction positioned above a lower surface of the insulating layer 102 and below an upper surface of the insulating layer 102. The insulating layer 106 has an upper end in the Z-direction positioned approximately coinciding with a Z-direction position of an upper surface of the insulating layer 103. However, a Z-direction position of an upper end of the insulating layer 106 may be lower than the Z-direction position of the upper surface of the insulating layer 103. Note that the insulating layer 103 may be another layer containing nitrogen (N) and silicon (Si), such as silicon oxynitride (SiON).

The plurality of conductive layers 110 function as word lines WL and gate electrodes of a plurality of memory cells (memory transistors) connected to the word lines WL of the NAND flash memory. In the following description, such conductive layers 110 are referred to as conductive layers 110 (WL) in some cases. These plurality of conductive layers 110 (WL) are each electrically independent in every finger structure FS. When two finger structures FS adjacent in the Y-direction are focused on, the plurality of conductive layers 110 (WL) arranged in the Z-direction and the plurality of insulating layers 101 disposed on upper surfaces and lower surfaces of the plurality of conductive layers 110 (WL) in these two finger structures FS are separated in the Y-direction via the inter-finger structure ST.

One or a plurality of conductive layers 110 positioned below the plurality of conductive layers 110 (WL) function as a source-side select gate line SGS and gate electrodes of the plurality of select transistors connected to the source-side select gate line SGS of the NAND flash memory. In the following description, such conductive layers 110 are referred to as conductive layers 110 (SGS) in some cases. When two finger structures FS adjacent in the Y-direction is focused on, one or a plurality of conductive layers 110 (SGS) and a plurality of insulating layers 101 disposed on upper surfaces and lower surfaces of the one or plurality of the conductive layers 110 (SGS) in these two finger structures FS are separated in the Y-direction via the inter-finger structure ST.

One or a plurality of conductive layers 110 positioned above the plurality of conductive layers 110 (WL) each function as a drain-side select gate line SGD and gate electrodes of the plurality of select transistors connected to the drain-side select gate line SGD of the NAND flash memory. In the following description, such conductive layers 110 are referred to as conductive layers 110 (SGD) in some cases.

As illustrated in FIG. 2, these plurality of conductive layers 110 (SGD) have widths $Y_{SGD}$ in the Y-direction that are smaller than a width $Y_{WL}$ in the Y-direction of the conductive layer 110 (WL). Similarly, the insulating layers 101 disposed on upper surfaces and lower surfaces of the one or plurality of the conductive layers 110 (SGD) and the insulating layers 102 (FIG. 3) and 103 (FIG. 3) have widths in the Y-direction smaller than the width $Y_{WL}$ in the Y-direction of the conductive layer 110 (WL).

The plurality of conductive layers 110 (SGD) are each electrically independent in every string unit SU. When two string units SU adjacent in the Y-direction are focused on in each finger structure FS, one or a plurality of conductive layers 110 (SGD), a plurality of insulating layers 101 disposed on upper surfaces and lower surfaces of the one or plurality of the conductive layers 110 (SGD), and insulating layers 102 and 103 in these two string units SU are separated in the Y-direction via the inter-string unit insulating layer SHE. When focusing on two string units SU adjacent in the Y-direction in two finger structures FS adjacent in the Y-direction, one of which includes a string unit SU positioned closest to the other finger structure FS among the plurality of string units SU, and the other of which includes a string unit SU positioned closest to the one finger structure FS among the plurality of string units SU, one or a plurality of conductive layers 110 (SGD), a plurality of insulating layers 101 disposed on upper surfaces and lower surfaces of the one or plurality of the conductive layers 110 (SGD), and insulating layers 102 and 103 in these two string units SU are separated in the Y-direction via the inter-finger structure ST.

As illustrated in FIG. 4, on an upper surface, a lower surface, and an opposed surface to the semiconductor layer 120 of the conductive layer 110, a high-dielectric-constant insulating layer 111 is disposed. The high-dielectric-constant insulating layer 111 contains, for example, a metal oxide, such as alumina ($Al_2O_3$). The high-dielectric-constant insulating layer 111 has, for example, a dielectric constant larger than that of silicon oxide ($SiO_2$). The high-dielectric-constant insulating layer 111 has, for example, a dielectric constant larger than that of silicon nitride (SiN). The high-dielectric-constant insulating layer 111 is disposed on Y-direction side surfaces of the insulating layers 101 as illustrated in FIG. 5. The high-dielectric-constant insulating layers 111 are formed along steps (a step Stp1 described later with reference to FIG. 20) formed by the insulating layers 102 and 106 at both the end portions in the Y-direction of the finger structure FS. That is, the high-dielectric-constant insulating layer 111 is disposed on the portion on the Y-direction side surface of the insulating layer 102 on which the insulating layer 106 is not disposed and on a lower surface and a Y-direction side surface of the insulating layer 106. A Z-direction position of an upper end of the high-dielectric-constant insulating layer 111 approximately coincides with the Z-direction position of the upper surface of the insulating layer 103. However, the Z-direction position of the upper end of the high-dielectric-constant insulating layer 111 may be lower than the Z-direction position of the upper surface of the insulating layer 103. The high-dielectric-constant insulating layer 111 is not necessarily formed as a continuous film along the side surfaces and the like of the insulating layers 101, 102, and 106.

The wiring layer 112 (FIG. 3) may, for example, contain polycrystalline silicon or the like containing N-type impurities, such as phosphorus (P). The wiring layer 112 has a lower surface that may be provided with a conductive member of a metal, such as tungsten (W), tungsten silicide, or the like, or another conductive member. The wiring layer 112 functions as a part of a source line of the NAND flash memory.

The semiconductor layers 120 are arranged in a predetermined pattern in the X-direction and the Y-direction as illustrated in FIG. 2. The semiconductor layers 120 function as channel regions of memory cells (memory transistors) and the select transistors of the NAND flash memory. The semiconductor layer 120 has an approximately cylindrical shape and has a center portion provided with an insulating layer 125 (FIG. 3) of, for example, silicon oxide. Each of the semiconductor layers 120 has an outer peripheral surface surrounded by the conductive layers 110 and opposed to the conductive layers 110.

The semiconductor layer 120 contains, for example, polycrystalline silicon (Si). The region opposed to the conductive layers 110 (WL) of the semiconductor layer 120 may be non-doped. The region opposed to the conductive layers 110 (SGD) of the semiconductor layer 120 may be non-doped or may contain P-type impurities, such as boron (B). At least a part of the region opposed to the conductive layers 110 (SGS) of the semiconductor layer 120 may be non-doped. A part of the region opposed to the conductive layers 110 (SGS) of the semiconductor layer 120 may contain N-type impurities, such as phosphorus (P).

The semiconductor layer 120 has an upper end portion provided with an impurity region 121 containing N-type impurities, such as phosphorus (P). This impurity region 121 is connected to bit line BL via via-contact electrodes Ch and Vy. Note that, as illustrated in FIG. 2, all of the plurality of semiconductor layers 120 corresponding to one string unit SU are connected to different bit lines BL. In the example of FIG. 2, four rows including the plurality of semiconductor layers 120 arranged in the X-direction are arranged in the Y-direction correspondingly to one string unit SU. All of the plurality of semiconductor layers 120 included in these four rows are connected to the different bit lines BL.

As illustrated in FIG. 3, the semiconductor layer 120 has a lower end portion provided with an impurity region 122 containing the N-type impurities, such as phosphorus (P). This impurity region 122 is connected to the above-described wiring layer 112. Note that all of the plurality of semiconductor layers 120 corresponding to one memory cell array region $R_{MCA}$ (FIG. 1) are connected to the common wiring layer 112.

The gate insulating film 130 has an approximately cylindrical shape covering the outer peripheral surface of the semiconductor layer 120. The gate insulating film 130 includes a tunnel insulating film 131, an electric charge accumulating film 132, and a block insulating film 133 stacked between the semiconductor layer 120 and the conductive layers 110, for example, as illustrated in FIG. 4. The tunnel insulating film 131 and the block insulating film 133 include, for example, silicon oxide ($SiO_2$). The electric charge accumulating film 132 includes, for example, a film that can accumulate an electric charge, such as silicon nitride (SiN). The tunnel insulating film 131, the electric charge accumulating film 132, and the block insulating film 133 have approximately cylindrical shapes, and, for example, as illustrated in FIG. 3, extend in the Z-direction along the outer peripheral surface of the semiconductor layer 120 excluding the contact portion between the semiconductor layer 120 and the wiring layer 112.

Note that, FIG. 4 illustrates the example in which the gate insulating film 130 includes the electric charge accumulating film 132 of silicon nitride or the like. However, the electric charge accumulating film included in the gate insulating film 130 may, for example, be a floating gate of polycrystalline silicon or the like containing the N-type or the P-type impurities.

The inter-string unit insulating layer SHE extends in the X-direction and the Z-direction, for example, as illustrated in FIG. 2 and FIG. 3. The inter-string unit insulating layer SHE contains, for example, silicon oxide ($SiO_2$). The inter-string unit insulating layer SHE has a lower end positioned above a lower surface of the conductive layer 110 (WL) positioned at the uppermost layer. The lower end of the inter-string unit insulating layer SHE is positioned below a lower surface of the conductive layer 110 (SGD) positioned at the lowermost layer. A Z-direction position of an upper end of the inter-string unit insulating layer SHE approximately coincides with the Z-direction position of the upper surface of the insulating layer 103. However, the Z-direction position of the upper end of the inter-string unit insulating layer SHE may be lower than the Z-direction position of the upper surface of the insulating layer 103.

The inter-finger structure ST includes, for example, as illustrated in FIG. 2 and FIG. 6, an inter-finger electrode 141 extending in the X-direction and the Z-direction, and inter-finger insulating layers (inter-stacked structure insulating layers) 142 of silicon oxide ($SiO_2$) or the like disposed on both Y-direction side surfaces of the inter-finger electrode 141. The inter-finger electrode 141 is spaced in the Y-direction from the plurality of conductive layers 110 arranged in the Z-direction and the plurality of insulating layers 101 disposed between each two of the plurality of conductive layers 110, and the insulating layers 102 and 103 via the inter-finger insulating layers 142. The inter-finger electrode 141 and the inter-finger insulating layers 142 have lower ends connected to the wiring layer 112. Z-direction positions of upper ends of the inter-finger electrode 141 and the inter-finger insulating layers 142 approximately coincide with the Z-direction position of the upper surface of the insulating layer 103. However, the Z-direction positions of the upper ends of the inter-finger electrode 141 and the inter-finger insulating layers 142 may be lower than the Z-direction position of the upper surface of the insulating layer 103. The inter-finger electrode 141 may, for example, be a conductive member including a stacked film or the like of a barrier conductive film, such as titanium nitride (TiN), and a metal film, such as tungsten (W). The inter-finger electrode 141 may, for example, be a semiconductor member, such as polycrystalline silicon, containing the impurities, such as phosphorus (P) or boron (B). The inter-finger electrode 141 may include both the conductive member and the semiconductor member. The inter-finger electrode 141 functions as a part of the source line of the NAND flash memory.

Here, the inter-finger electrode 141 and the inter-finger insulating layers 142 extend in the Z-direction along the Y-direction side surfaces of the plurality of conductive layers 110 and insulating layers 101 alternately arranged in the Z-direction. The inter-finger insulating layer 142 is disposed on Y-direction side surfaces of the plurality of conductive layers 110 and the high-dielectric-constant insulating layer 111 alternately arranged in the Z-direction, as illustrated in FIG. 5. The inter-finger electrode 141 and the inter-finger insulating layer 142 are formed along a step (the step Stp1 described later with reference to FIG. 20) formed by the insulating layers 102 and 106. Accordingly, steps are formed also on both the Y-direction side surfaces of the inter-finger electrode 141 and the inter-finger insulating layers 142.

For example, in the illustrated example, the inter-finger insulating layer 142 has a Y-direction side surface, on the opposite side of the inter-finger electrode 141, having a surface S1 opposed to the insulating layer 102 via the high-dielectric-constant insulating layer 111 and a surface S2 opposed to the insulating layer 106 via the high-dielectric-constant insulating layer 111.

The surface S1 continues in the Z-direction from a height position corresponding to the lower surface of the insulating layer 102 to a height position corresponding to the proximity of the lower end of the insulating layer 106 (a height position of a lower surface of the high-dielectric-constant insulating layer 111 in a portion covering a lower surface of the insulating layer 106). The surface S2 continues in the Z-direction from a height position corresponding to an upper end of the surface S1 to a height position corresponding to the upper end of the insulating layer 106. A Y-direction position of a lower end of the surface S2 is disposed on a side of the inter-finger electrode 141 with respect to a Y-direction position of the upper end of the surface S1.

In the illustrated example, a distance D 102 in the Y-direction between the insulating layer 102 and the inter-finger insulating layer 142 is approximately the same as a length (a layer thickness) in the Y-direction of the high-dielectric-constant insulating layer 111 from the height position corresponding to the lower surface of the insulating layer 102 to the height position corresponding to the upper end of the surface S1. The distance in the Y-direction between the insulating layer 102 and the inter-finger insulating layer 142 and a distance D 103 in the Y-direction between the insulating layer 103 and the inter-finger insulating layer 142 are approximately the same as a total length (a total layer thickness) in the Y-direction of the high-dielectric-constant insulating layer 111 and the insulating layer 106 from the height position corresponding to the upper end of the surface S1 to the height position corresponding to the upper end of the insulating layer 106. Accordingly, the distance $D_{103}$ is larger than the distance $D_{102}$. Even though variations are present in the distances $D_{102}$ and $D_{103}$, a minimum value of the distance $D_{103}$ is larger than the maximum value of the distance $D_{102}$.

A Y-direction width of the inter-finger electrode 141 in a portion disposed at a height position corresponding to the insulating layer 106 is decreased by lengths (layer thicknesses) in the Y-direction of the insulating layers 106 disposed on one side and the other side in the Y-direction with respect to the inter-finger electrode 141. For example, FIG. 6 exemplarily illustrates a portion 141a disposed below a certain height position of the inter-finger electrode 141 and a portion 141b disposed above this height position. These portions 141a and 141b are arranged in the Z-direction. Z-direction position corresponding to an upper end of the portion 141a and a lower end of the portion 141b is disposed above Z-direction position of the upper surface of the conductive layer 110 at the uppermost layer and below the Z-direction position of the lower end of the insulating layer 106. A Y-direction width $Y_{141b}$ of the lower end of the portion 141b is smaller than a Y-direction width $Y_{141a}$ of the upper end of the portion 141a. Note that, the step (the step Stp1 described later with reference to FIG. 20) formed between the portions 141a and 141b and the difference between the distances $D_{103}$ and $D_{102}$ (FIG. 5), which are between the insulating layers 103 and 102 and the inter-finger insulating layers 142, are approximately equal to one another on both Y-direction side surfaces of the inter-finger structure ST.

The via-contact electrodes Ch are arranged in a predetermined pattern in the X-direction and the Y-direction corresponding to the semiconductor layers 120, for example, as illustrated in FIG. 2. On an outer peripheral surface of the via-contact electrode Ch, as illustrated in FIG. 3, an insulating layer 105 is disposed. The via-contact electrode Ch and the insulating layer 105 extend in the Z-direction passing through a part of the insulating layer 104, the insulating layer 103, and a part of the insulating layer 102, and have lower ends connected to the impurity region 121 of the semiconductor layer 120 and upper ends connected to the via-contact electrode Vy. In the embodiment, Z-direction positions of the upper ends of the via-contact electrode Ch and the insulating layer 105 are disposed above the Z-direction position of the upper surface of the insulating layer 103.

The bit lines BL extend in the Y-direction and are arranged in the X-direction, as illustrated in FIG. 2. The pitch in the X-direction of the bit lines BL is a quarter of the pitch in the X-direction of the plurality of semiconductor layers 120 arranged in the X-direction. The bit line BL may, for example, include a stacked film or the like of a barrier conductive film, such as titanium nitride (TiN), and a metal film, such as copper (Cu). The above-described via-contact electrode Vy is disposed at a position where the bit line BL and the via-contact electrode Ch overlap viewing from the Z-direction.

[Structure of Hook-Up Region $R_{HU}$]

As illustrated in FIG. 7, the hook-up region $R_{HU}$ is provided with terrace portions T of the plurality of conductive layers 110. The terrace portions T are, for example, portions of the upper surfaces of the conductive layers 110 not overlapping with the other conductive layers 110 viewed from above. These plurality of terrace portions T are covered with the insulating layer 102.

As illustrated in FIG. 7, the hook-up region $R_{HU}$ is provided with a plurality of via-contact electrodes CC corresponding to the plurality of conductive layers 110. These plurality of via-contact electrodes CC extend in the Z-direction passing through the insulating layer 102 and have lower end portions connected to the terrace portions T of the conductive layers 110. The via-contact electrode CC may, for example, include a stacked film or the like of a barrier conductive film, such as titanium nitride (TiN), and a metal film, such as tungsten (W).

[Manufacturing Method]

Next, a method of manufacturing the semiconductor memory device according to the embodiment is described with reference to FIG. 8 to FIG. 38. FIG. 8 and FIG. 11 to FIG. 38 are schematic cross-sectional views for describing the same manufacturing method, and illustrating the cross-sectional surfaces corresponding to FIG. 3. FIG. 9 and FIG. 10 are schematic cross-sectional views for describing the same manufacturing method, and illustrating cross-sectional surfaces corresponding to FIG. 7.

Figure 8:
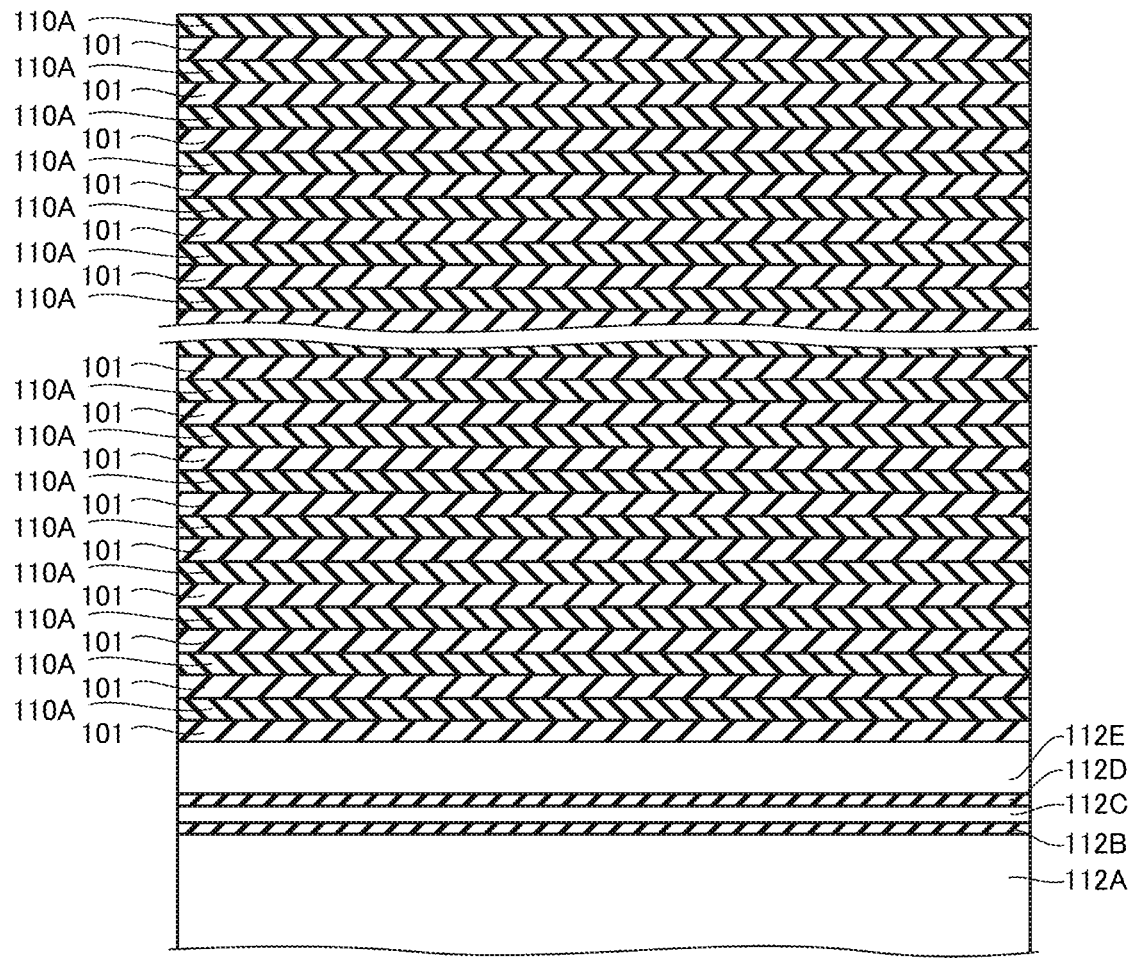
FIG. 8 is a schematic cross-sectional view for describing a method of manufacturing the same semiconductor memory device.
Figure 9:
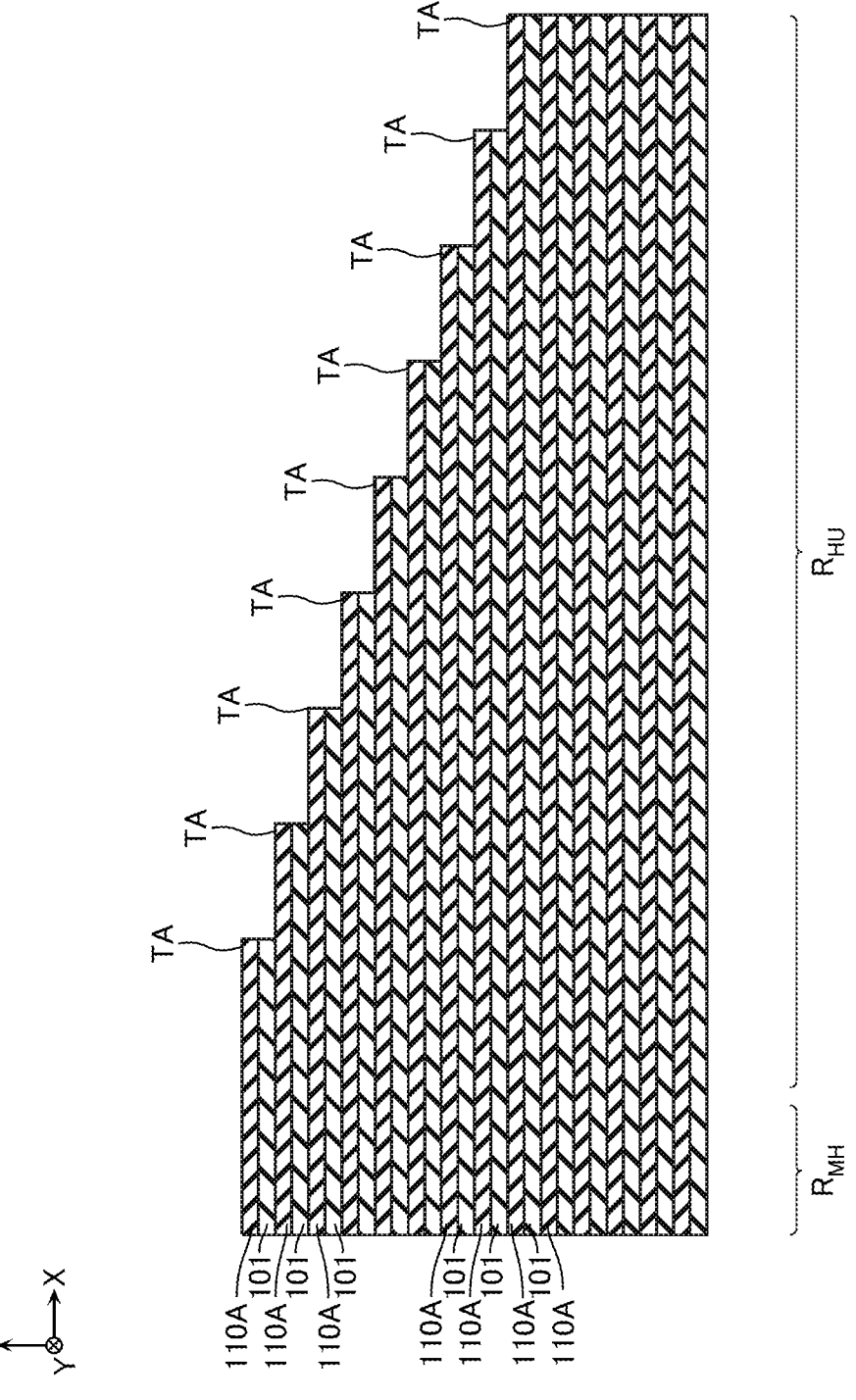
FIG. 9 is a schematic cross-sectional view for describing the same manufacturing method.

In manufacturing the semiconductor memory device according to the embodiment, for example, as illustrated in FIG. 8, a semiconductor layer 112A of silicon or the like, a sacrifice layer 112B of silicon oxide or the like, a sacrifice layer 112C of silicon or the like, a sacrifice layer 112D of silicon oxide or the like, a semiconductor layer 112E of silicon or the like are formed. The plurality of insulating layers 101 and a plurality of sacrifice layers 110A are alternately formed. The sacrifice layer 110A contains, for example, silicon nitride (SiN). This process is, for example, performed by a method, such as Chemical Vapor Deposition (CVD).

Next, for example, as illustrated in FIG. 9, parts of the plurality of insulating layers 101 and the plurality of sacrifice layers 110A are removed in the hook-up region $R_{HU}$ to form a plurality of terrace portions TA. The terrace portions TA are, for example, portions of upper surfaces of the sacrifice layers 110A not overlapping with the other sacrifice layers 110A viewed from above. In this process, for example, a resist is formed on an upper surface of the structure illustrated in FIG. 8. The removal of the sacrifice layers 110A, the removal of the insulating layers 101, and the removal of a part of the resist are repeatedly performed. Note that, the removal of the resist is performed by isotropic etching, such as wet etching.

Next, for example, as illustrated in FIG. 10, the insulating layer 102 of silicon oxide ($SiO_2$) or the like covering plurality of terrace portions TA is formed. This process is, for example, performed by a method, such as CVD.

Figure 11:
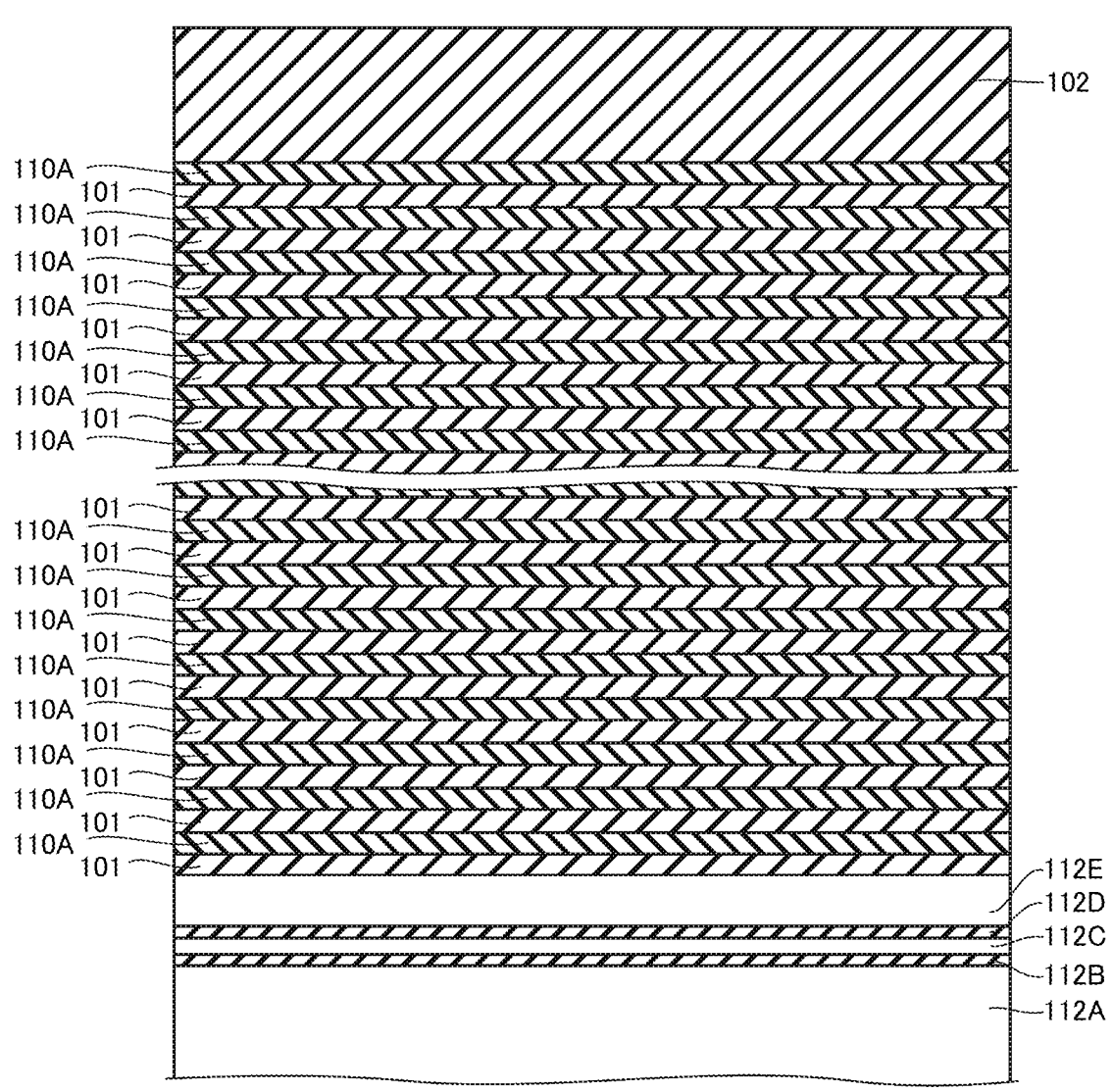
FIG. 11 is a schematic cross-sectional view for describing the same manufacturing method.
Figure 12:
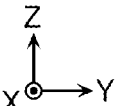
FIG. 12 is a schematic cross-sectional view for describing the same manufacturing method.

Next, for example, as illustrated in FIG. 11 and FIG. 12, a plurality of memory holes MH are formed at positions corresponding to the semiconductor layers 120. The memory hole MH is a through-hole that extends in the Z-direction, passes through the insulating layers 101 and the sacrifice layers 110A, the semiconductor layer 112E, and the sacrifice layers 112D, 112C, and 112B, and exposes an upper surface of the semiconductor layer 112A. This process is, for example, performed by a method, such as RIE.

Figure 13:
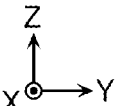
FIG. 13 is a schematic cross-sectional view for describing the same manufacturing method.
Figure 13:
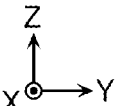

Next, for example, as illustrated in FIG. 13, the semiconductor layers 120, the gate insulating films 130, and the insulating layers 125 are formed inside the plurality of memory holes MH. This process is, for example, performed by CVD and RIE.

Figure 14:
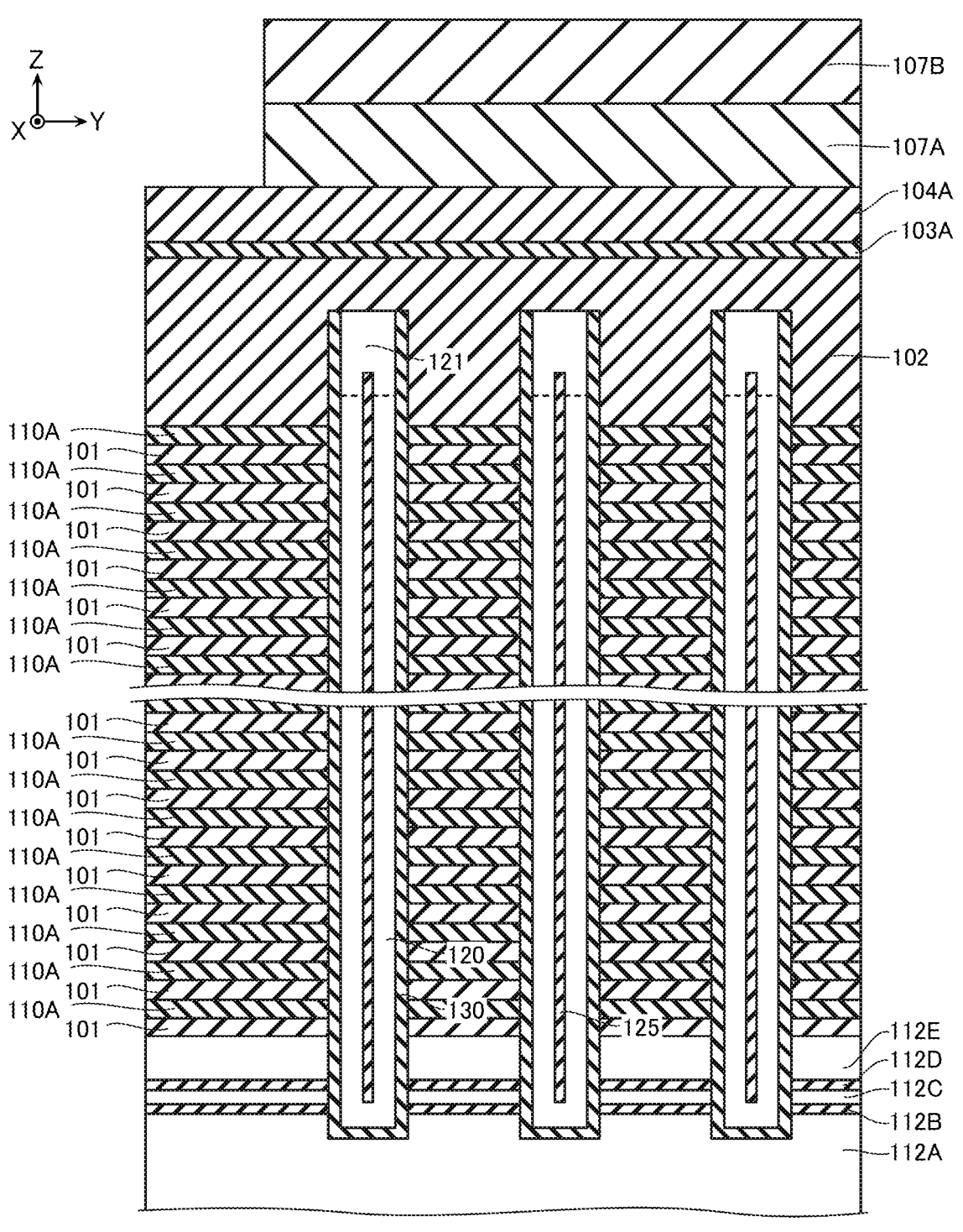
FIG. 14 is a schematic cross-sectional view for describing the same manufacturing method.

Next, for example, as illustrated in FIG. 14, the insulating layer 102 and an insulating layer 103A are formed on an upper surface of the structure as illustrated in FIG. 13. An insulating layer 104A (a protective layer) of silicon oxide ($SiO_2$) or the like is formed on an upper surface of the insulating layer 103A. Insulating layers 107A and 107B are formed on an upper surface of the insulating layer 104A. The insulating layer 107A contains, for example, carbon (C). The insulating layer 107B contains, for example, silicon oxynitride (SiON). This process is, for example, performed by a method, such as CVD. At a position corresponding to the inter-finger structure ST (FIG. 3), the insulating layers 107A and 107B are removed.

Figure 15:
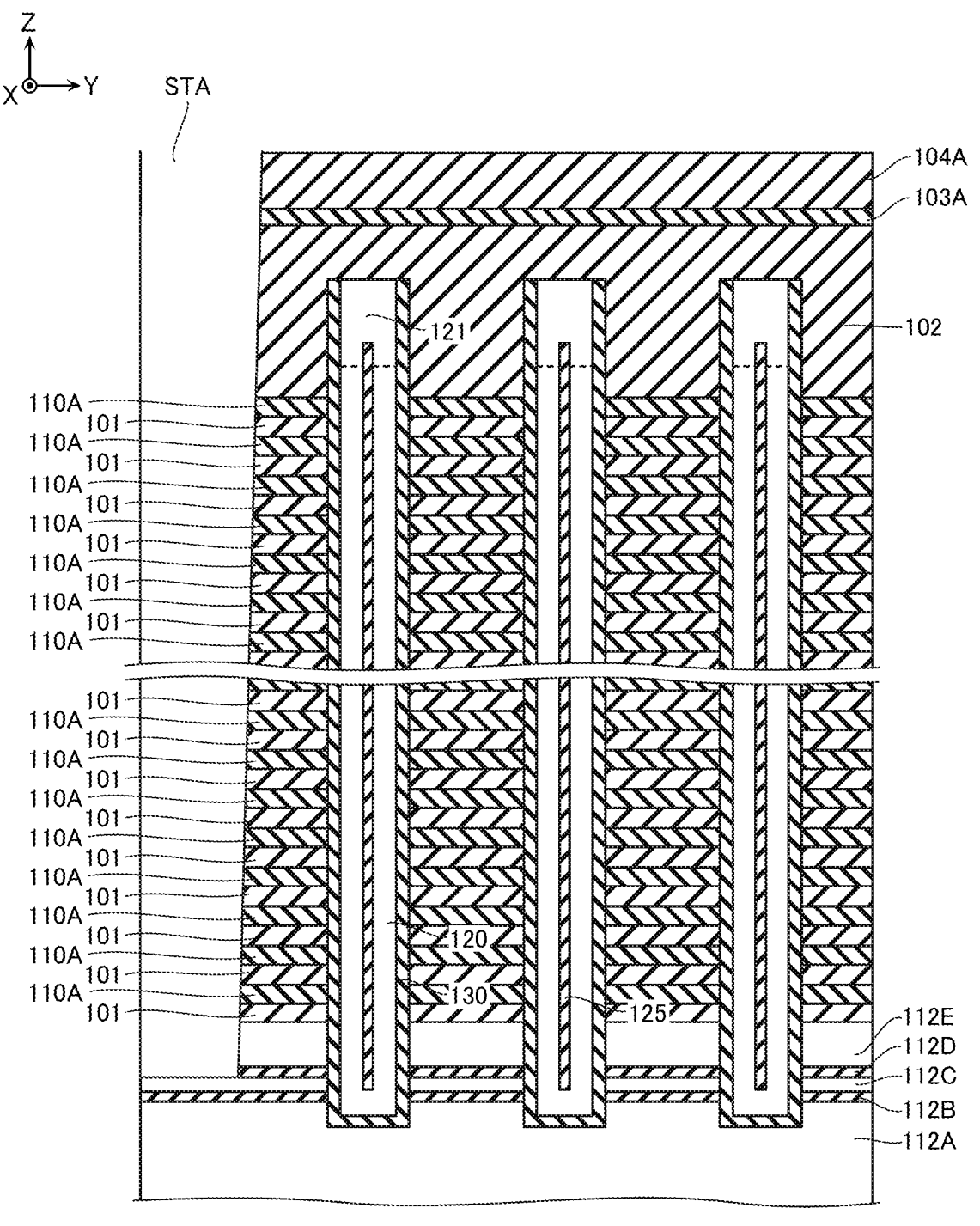
FIG. 15 is a schematic cross-sectional view for describing the same manufacturing method.

Next, for example, as illustrated in FIG. 15, at the position corresponding to the inter-finger structure ST, a trench STA is formed. The trench STA extends in the Z-direction and the X-direction, separates the insulating layers 104A, 103A, and 102, the insulating layers 101 and the sacrifice layers 110A, the semiconductor layer 112E, and the sacrifice layer 112D in the Y-direction, and exposes an upper surface of the sacrifice layer 112C. This process is, for example, performed by a method, such as RIE, using the insulating layers 107A and 107B as a mask. The insulating layers 107A and 107B are removed.

Figure 16:
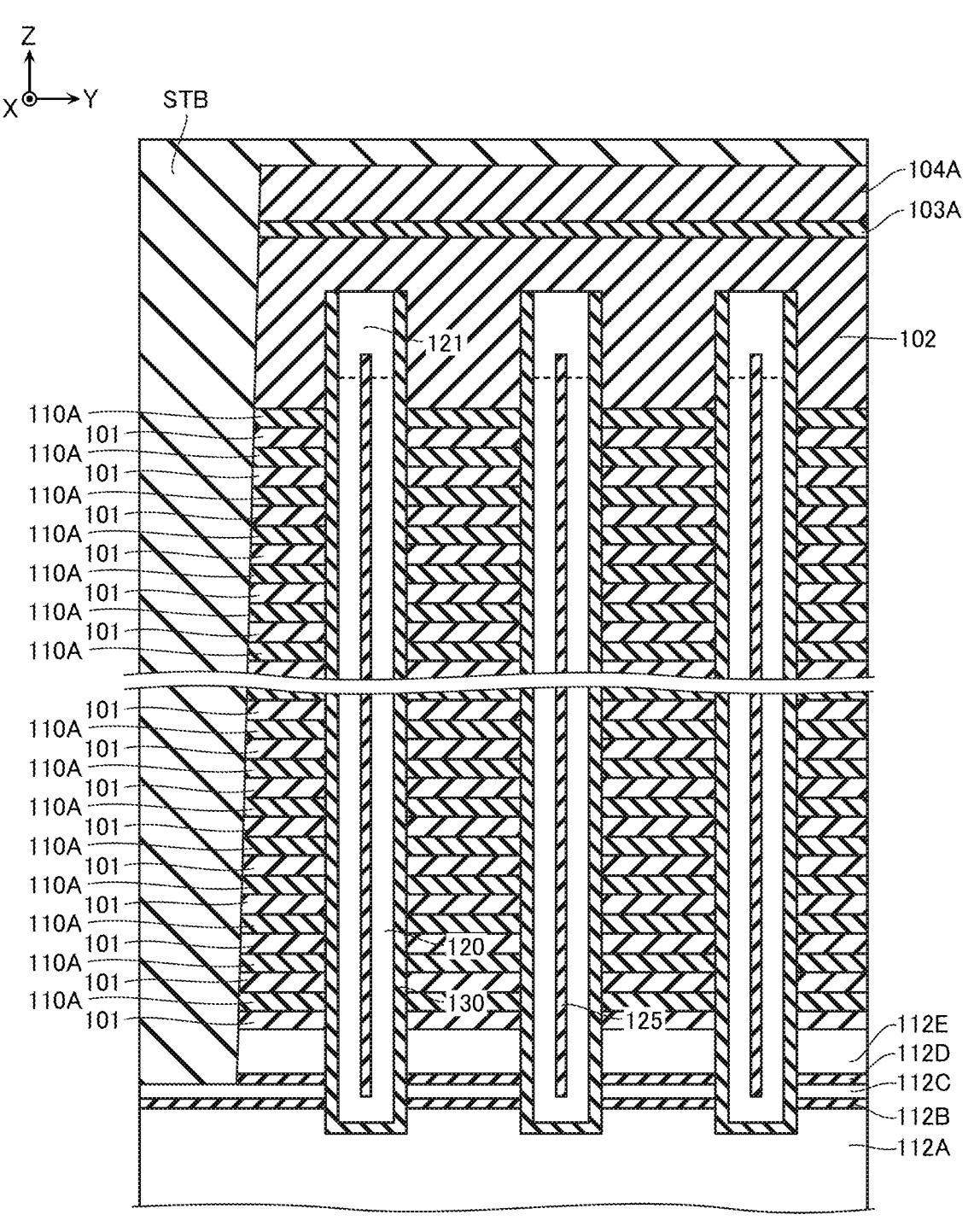
FIG. 16 is a schematic cross-sectional view for describing the same manufacturing method.

Next, for example, as illustrated in FIG. 16, a resist STB (a protective layer) is formed inside the trench STA and on the upper surface of the insulating layer 104A.

Figure 17:
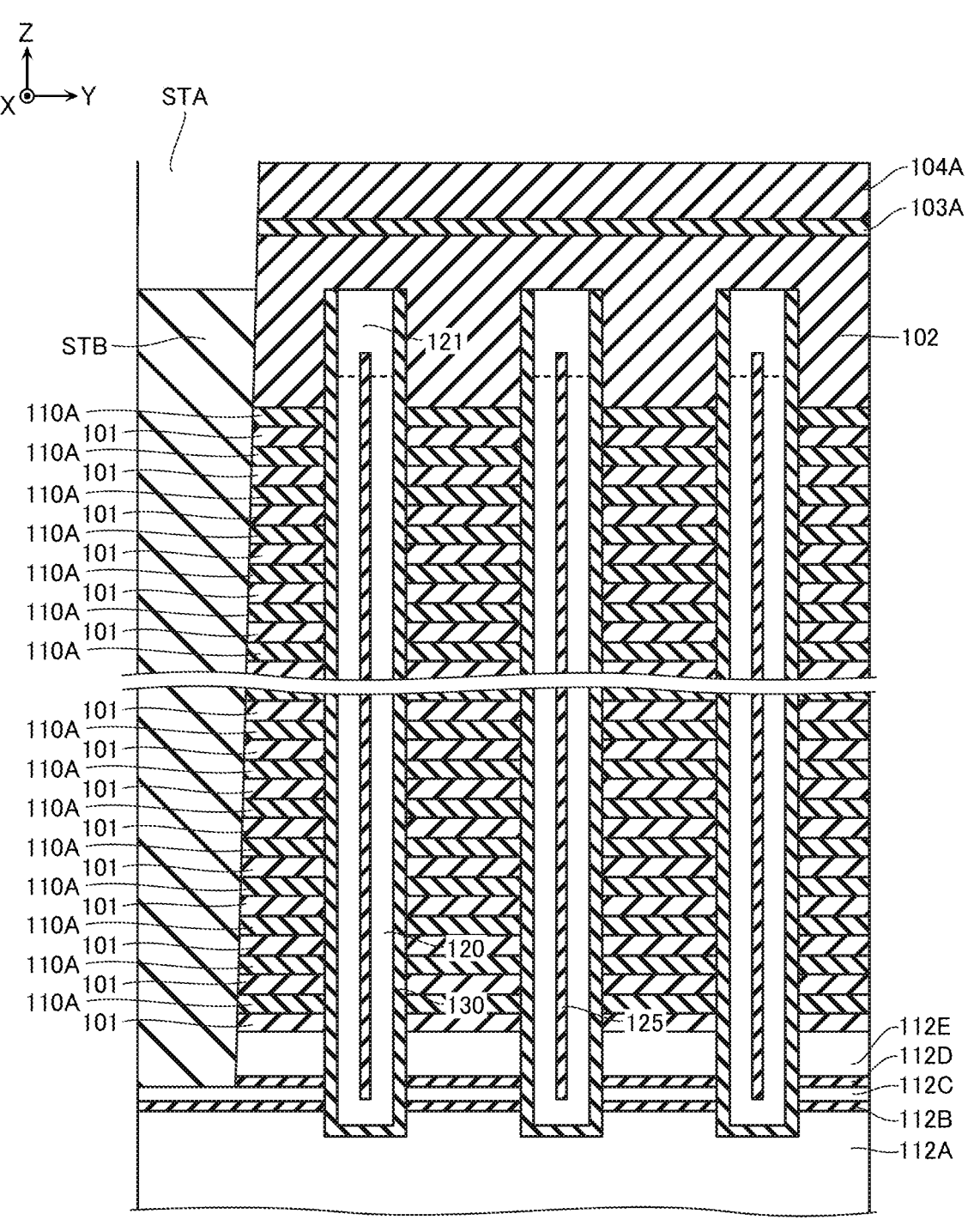
FIG. 17 is a schematic cross-sectional view for describing the same manufacturing method.

Next, for example, as illustrated in FIG. 17, a part of the resist STB is removed. In this process, a structure is formed such that Y-direction side surfaces of the plurality of sacrifice layers 110A and insulating layers 101 arranged in the Z-direction are covered with the resist STB and Y-direction side surfaces of the insulating layers 104A and 103A and a part of the Y-direction side surface of the insulating layer 102 are exposed to the inside of the trench STA. This process is performed such that Z-direction position of an upper surface of the resist STB is positioned below a Z-direction position of a lower surface of the insulating layer 103A and positioned above a Z-direction position of an upper surface of the sacrifice layer 110A at the uppermost layer. This process is, for example, performed by anisotropic etching, such as RIE.

Figure 18:
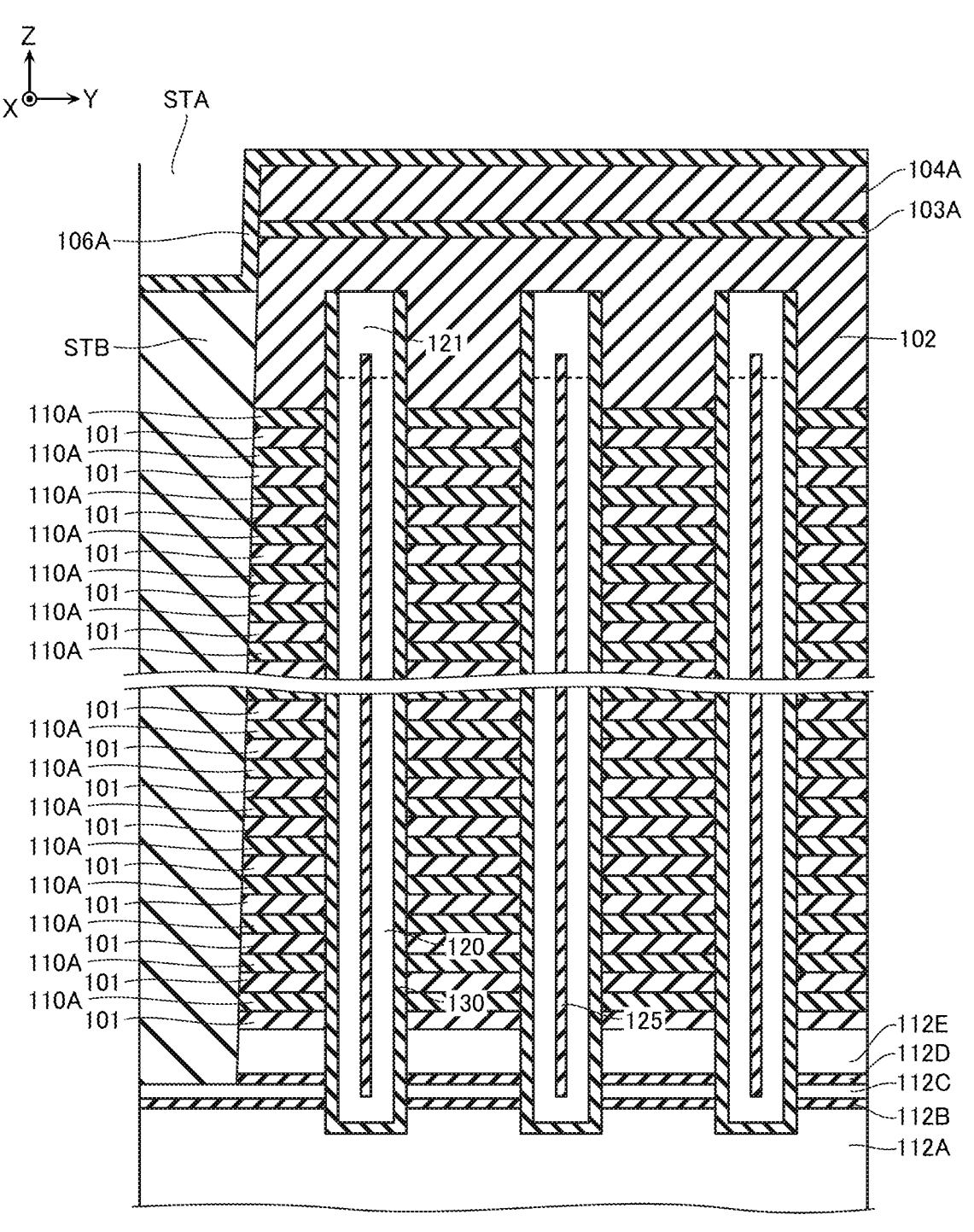
FIG. 18 is a schematic cross-sectional view for describing the same manufacturing method.

Next, for example, as illustrated in FIG. 18, an insulating layer 106A (a protective layer) is formed on the upper surface of the insulating layer 104A, the Y-direction side surfaces of the insulating layers 104A and 103A, the part of the Y-direction side surface of the insulating layer 102, and the upper surface of the resist STB. This process is, for example, performed by a method, such as CVD.

Figure 19:
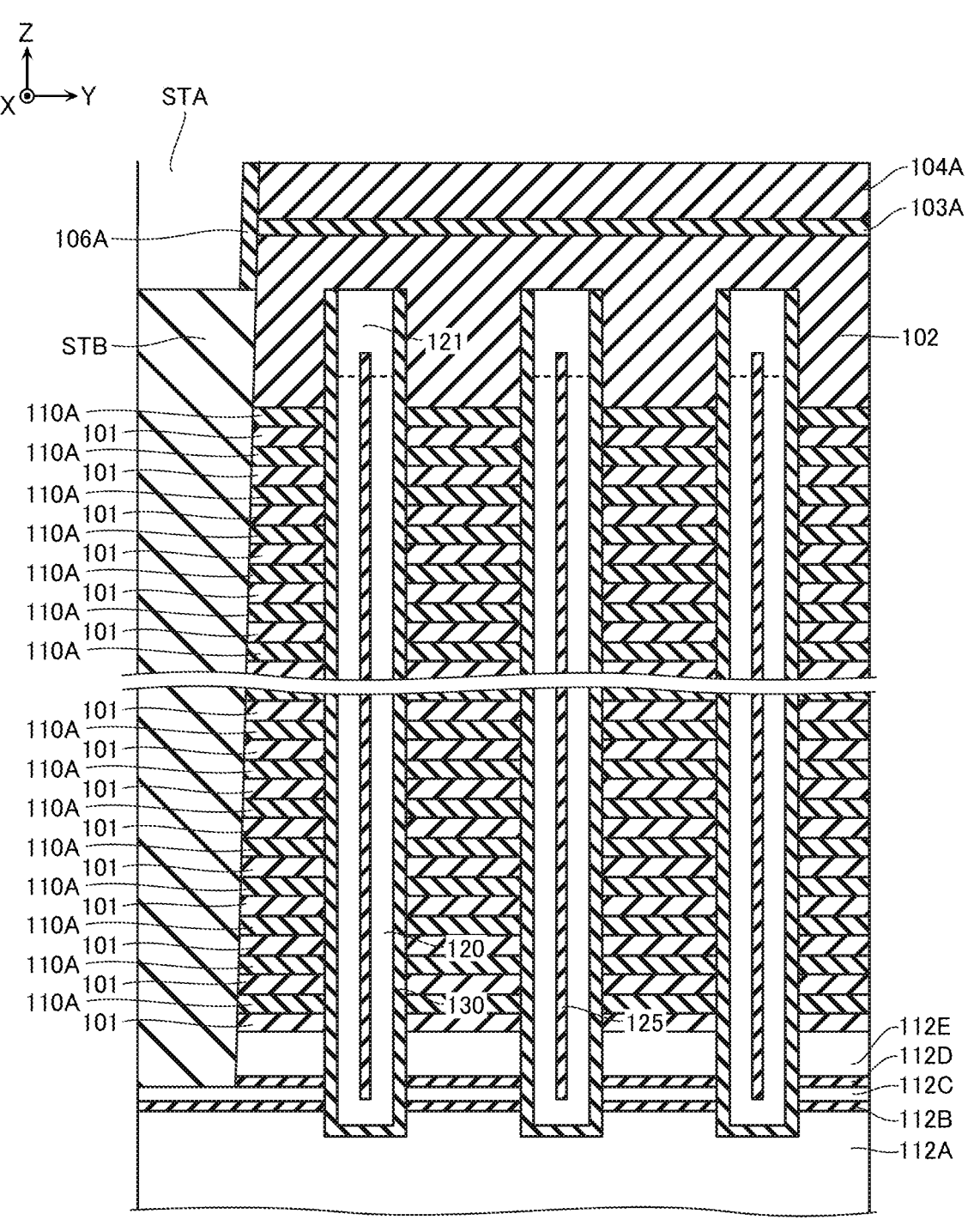
FIG. 19 is a schematic cross-sectional view for describing the same manufacturing method.

Next, for example, as illustrated in FIG. 19, parts of the insulating layer 106A are removed to expose the upper surfaces of the insulating layer 104A and the resist STB. This process is performed such that a portion of the insulating layer 106A disposed on the Y-direction side surfaces of the insulating layers 104A and 103A and a part of the Y-direction side surface of the insulating layer 102 remains. This process is, for example, performed by anisotropic etching, such as RIE.

Figure 20:
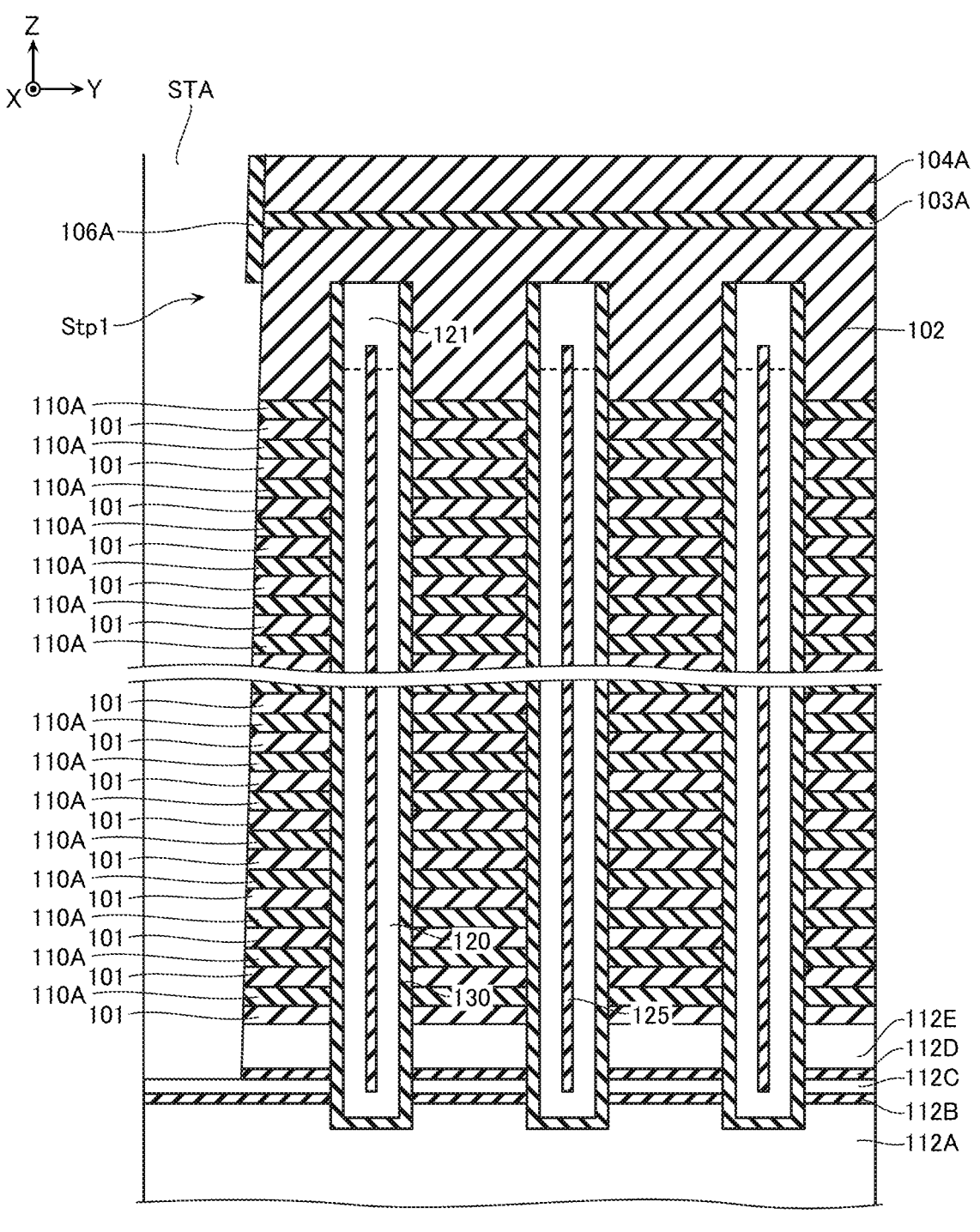
FIG. 20 is a schematic cross-sectional view for describing the same manufacturing method.

Next, for example, as illustrated in FIG. 20, the resist STB is removed. In this process, a structure is formed such that the Y-direction side surfaces of the plurality of sacrifice layers 110A and insulating layers 101 arranged in the Z-direction and Y-direction side surfaces of the sacrifice layer 112D and the semiconductor layer 112E are exposed to the inside of the trench STA and the Y-direction side surface of the insulating layer 103A is covered with the insulating layer 106A. This process is, for example, performed by a method, such as asking. Note that, in this process, the step Stp1 is formed between a portion where the insulating layer 106A is formed and a portion without the insulating layer 106A of a Y-direction side surface of the trench STA.

Figure 21:
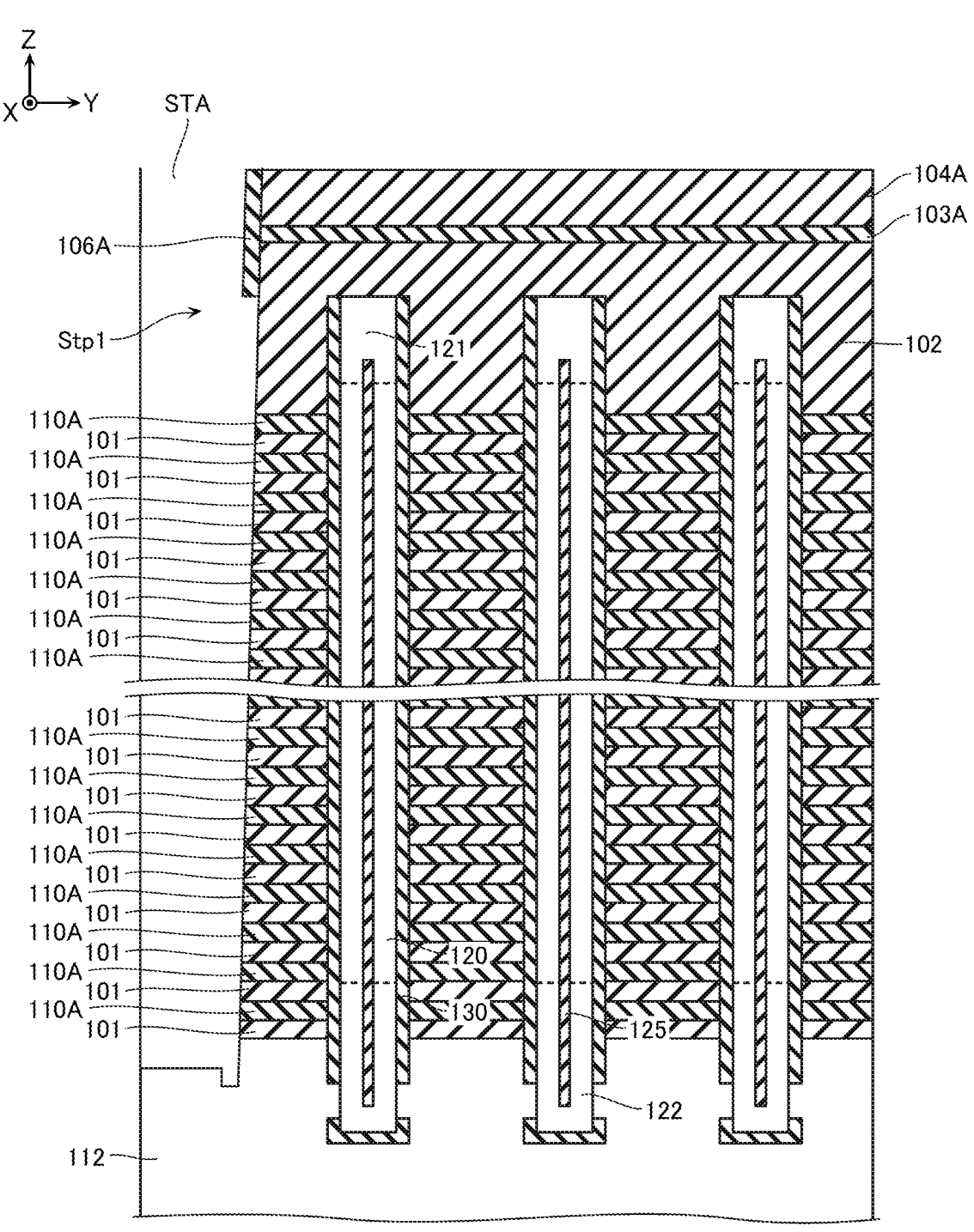
FIG. 21 is a schematic cross-sectional view for describing the same manufacturing method.

Next, for example, as illustrated in FIG. 21, the wiring layer 112 is formed. In this process, for example, the sacrifice layers 112B, 112C, and 112D are removed by a method, such as wet etching. A part of the gate insulating film 130 is removed by a method, such as wet etching, to expose a part of the outer peripheral surface of the semiconductor layer 120. The wiring layer 112 is formed by a method, such as epitaxial growth.

Figure 22:
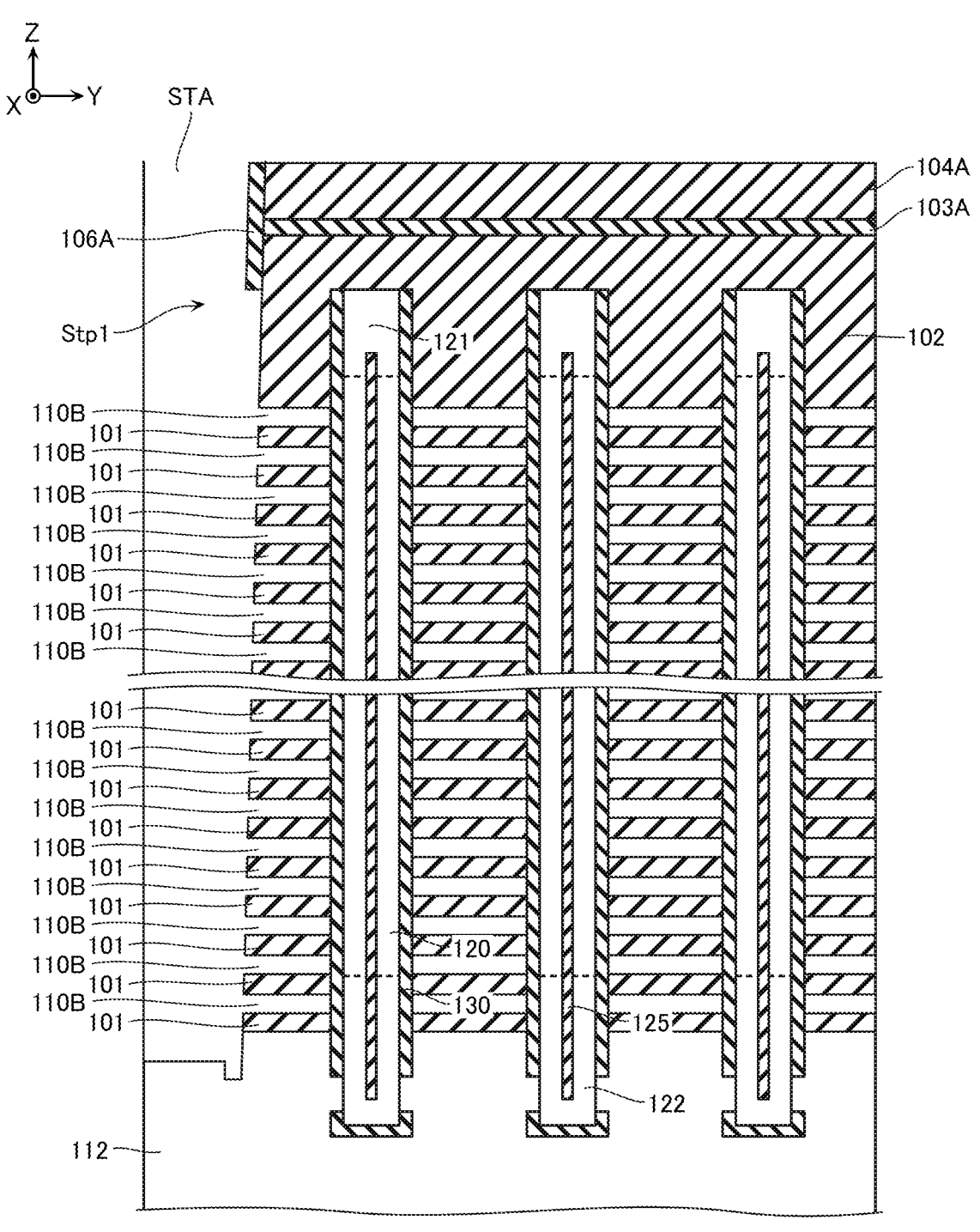
FIG. 22 is a schematic cross-sectional view for describing the same manufacturing method.

Next, for example, as illustrated in FIG. 22, the sacrifice layers 110A are removed via the trench STA. This forms a plurality of cavities 110B arranged in the Z-direction. In other words, a hollow structure including the plurality of insulating layers 101 arranged in the Z-direction and the structure (the semiconductor layers 120, the gate insulating films 130, and the insulating layers 125) inside the memory holes MH supporting these insulating layers 101 is formed. This process is, for example, performed by a method, such as wet etching.

Figure 23:
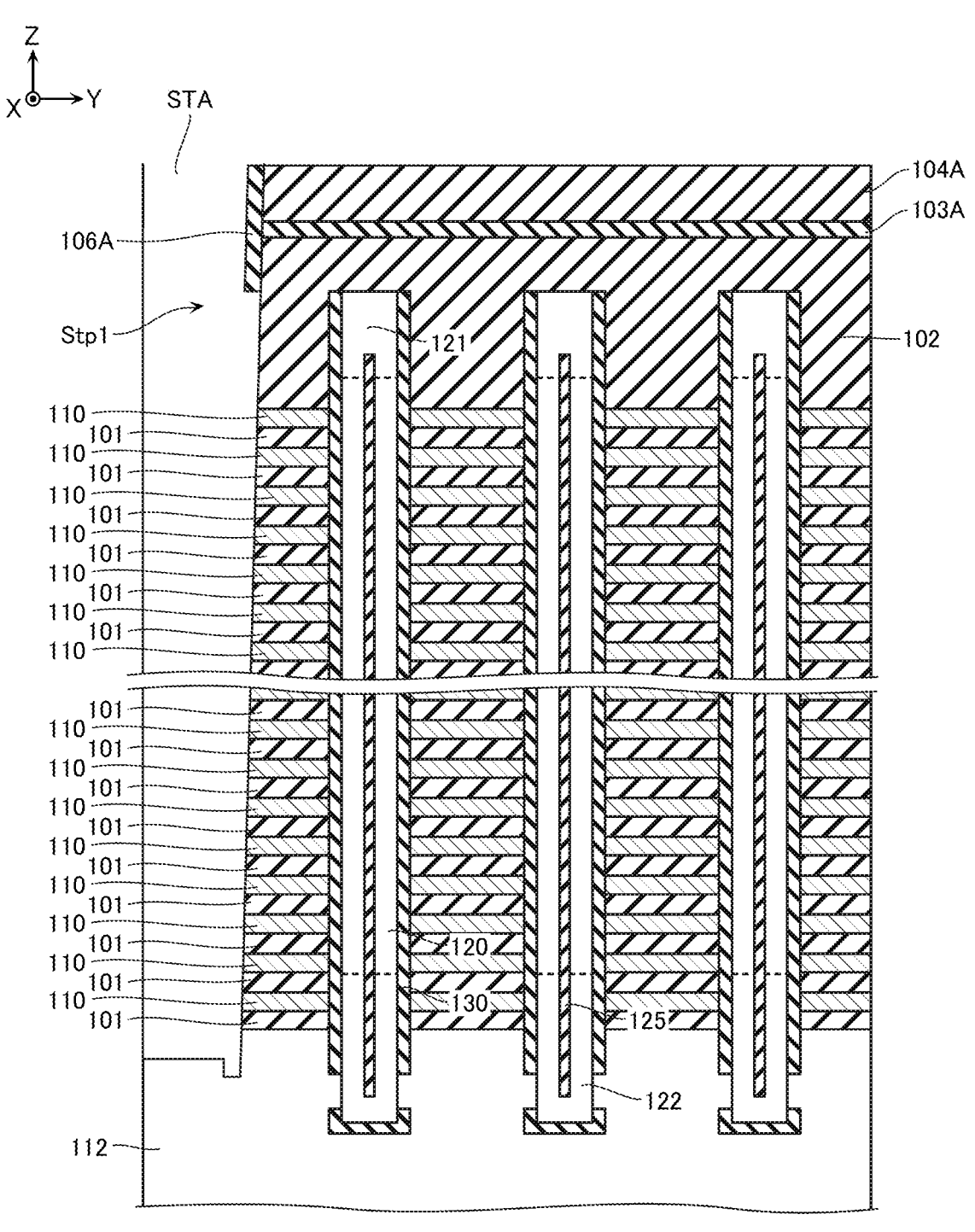
FIG. 23 is a schematic cross-sectional view for describing the same manufacturing method.

Next, for example, as illustrated in FIG. 23, the plurality of conductive layers 110 are formed in the plurality of cavities 110B arranged in the Z-direction. This process is, for example, performed by a method, such as CVD. Note that, while the illustration is omitted in FIG. 23, in this process, the high-dielectric-constant insulating layer 111, described with reference to FIG. 4 and FIG. 5, is formed before forming the conductive layers 110 in the cavities 110B.

Figure 24:
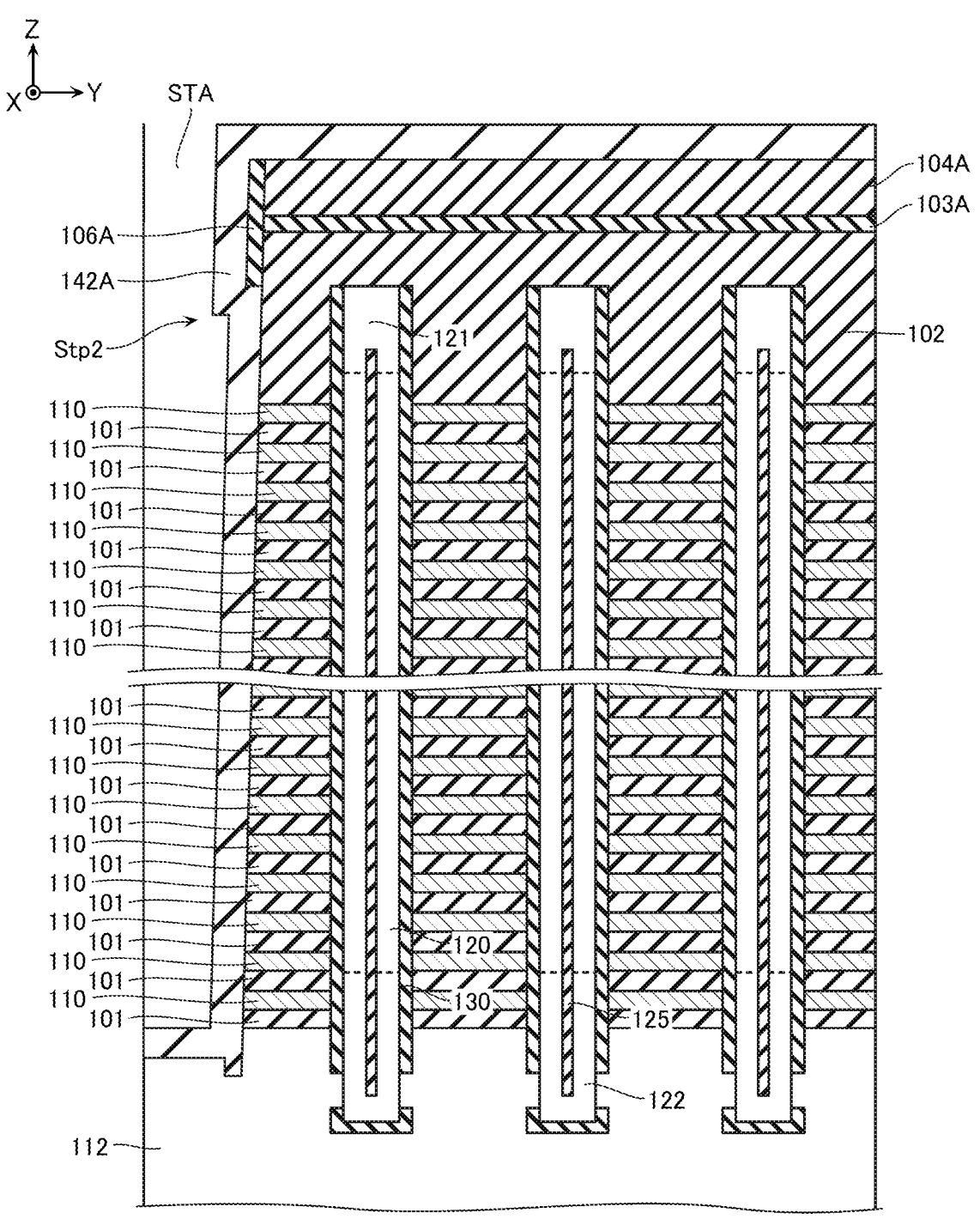
FIG. 24 is a schematic cross-sectional view for describing the same manufacturing method.

Next, for example, as illustrated in FIG. 24, an insulating layer 142A is formed on the upper surface of the insulating layer 104A, and the Y-direction side surfaces and a bottom surface of the trench STA. This process is, for example, performed by a method, such as CVD. Note that, on the Y-direction side surface of the trench STA, the insulating layer 142A is formed along the step Stp1. This forms a step Stp2 on the Y-direction side surface of the trench STA.

Figure 25:
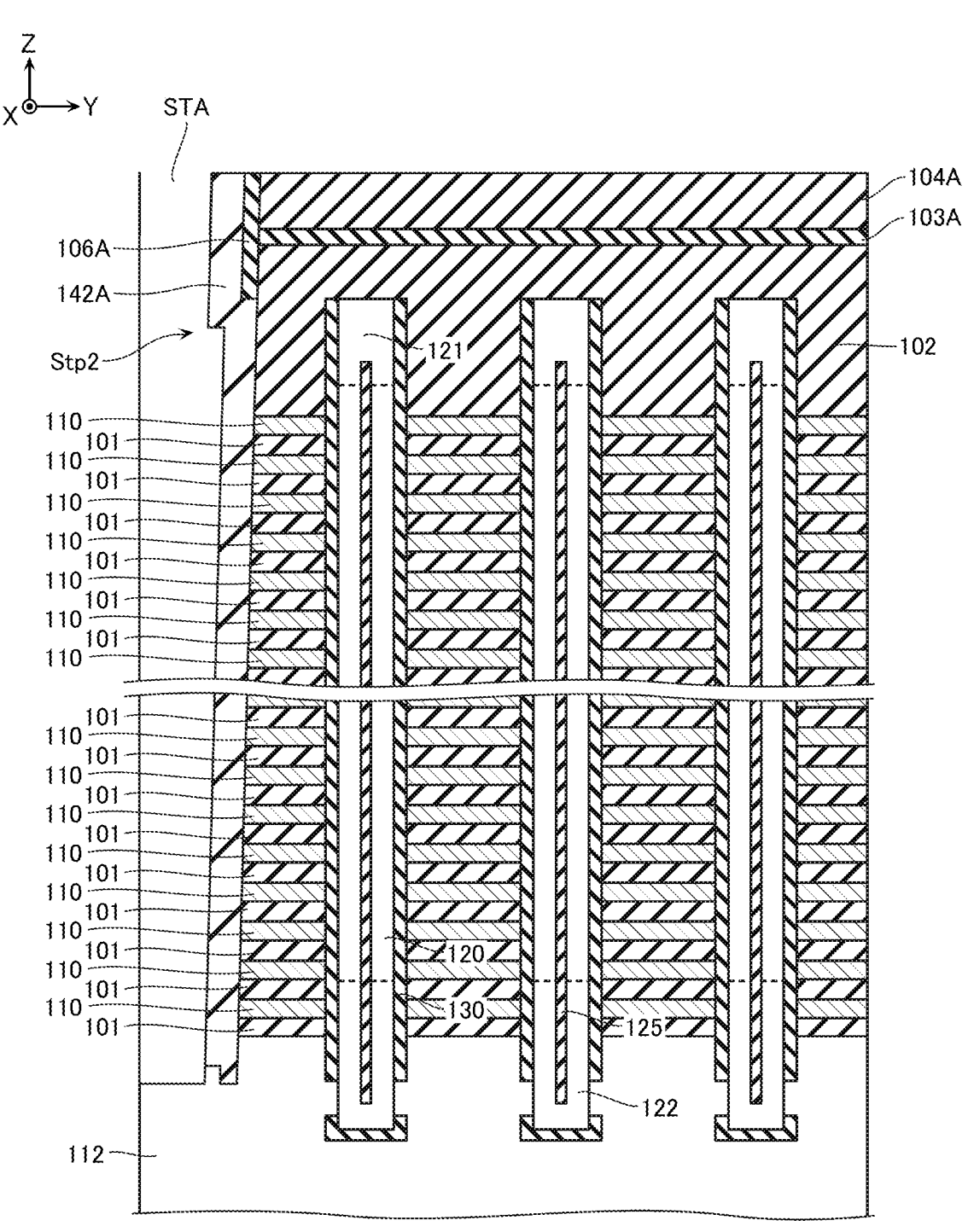
FIG. 25 is a schematic cross-sectional view for describing the same manufacturing method.

Next, for example, as illustrated in FIG. 25, parts of the insulating layer 142A are removed to expose the upper surfaces of the insulating layer 104A and the wiring layer 112. This process is performed such that a portion disposed on the Y-direction side surface of the trench STA of the insulating layer 142A remains. This process is, for example, performed by anisotropic etching, such as RIE.

Figure 26:
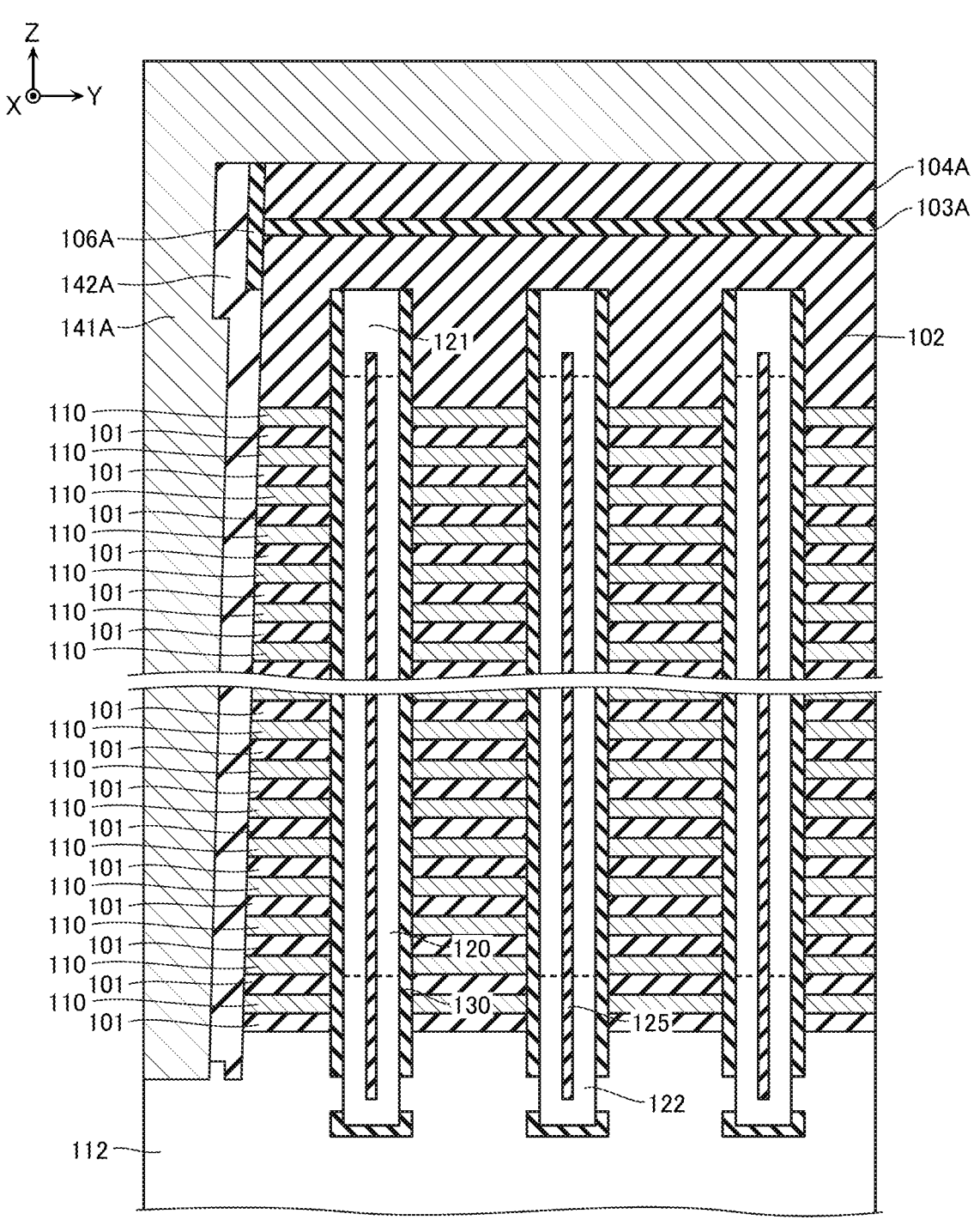
FIG. 26 is a schematic cross-sectional view for describing the same manufacturing method.

Next, for example, as illustrated in FIG. 26, a conductive member 141A is formed on the upper surfaces of the insulating layers 104A, 142A, and 106A, and the inside of the trench STA. This process is, for example, performed by a method, such as CVD. Note that, a portion disposed below the step Stp2 of the conductive member 141A turns into the portion 141a described with reference to FIG. 6. A portion disposed above the step Stp2 and below the upper surface of the insulating layer 103A of the conductive member 141A turns into the portion 141b described with reference to FIG. 6. Note that, in this process, a semiconductor member may be formed instead of the conductive member 141A.

Figure 27:
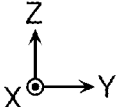
FIG. 27 is a schematic cross-sectional view for describing the same manufacturing method.

Next, for example, as illustrated in FIG. 27, a part of the conductive member 141A, parts of the insulating layers 142A and 106A, and the insulating layer 104A are removed to expose the upper surface of the insulating layer 103A. This process is, for example, performed by a flattening process, such as Chemical Mechanical Polishing (CMP) with the insulating layer 103A as a stopper. In this process, the inter-finger structure ST is formed.

Figure 28:
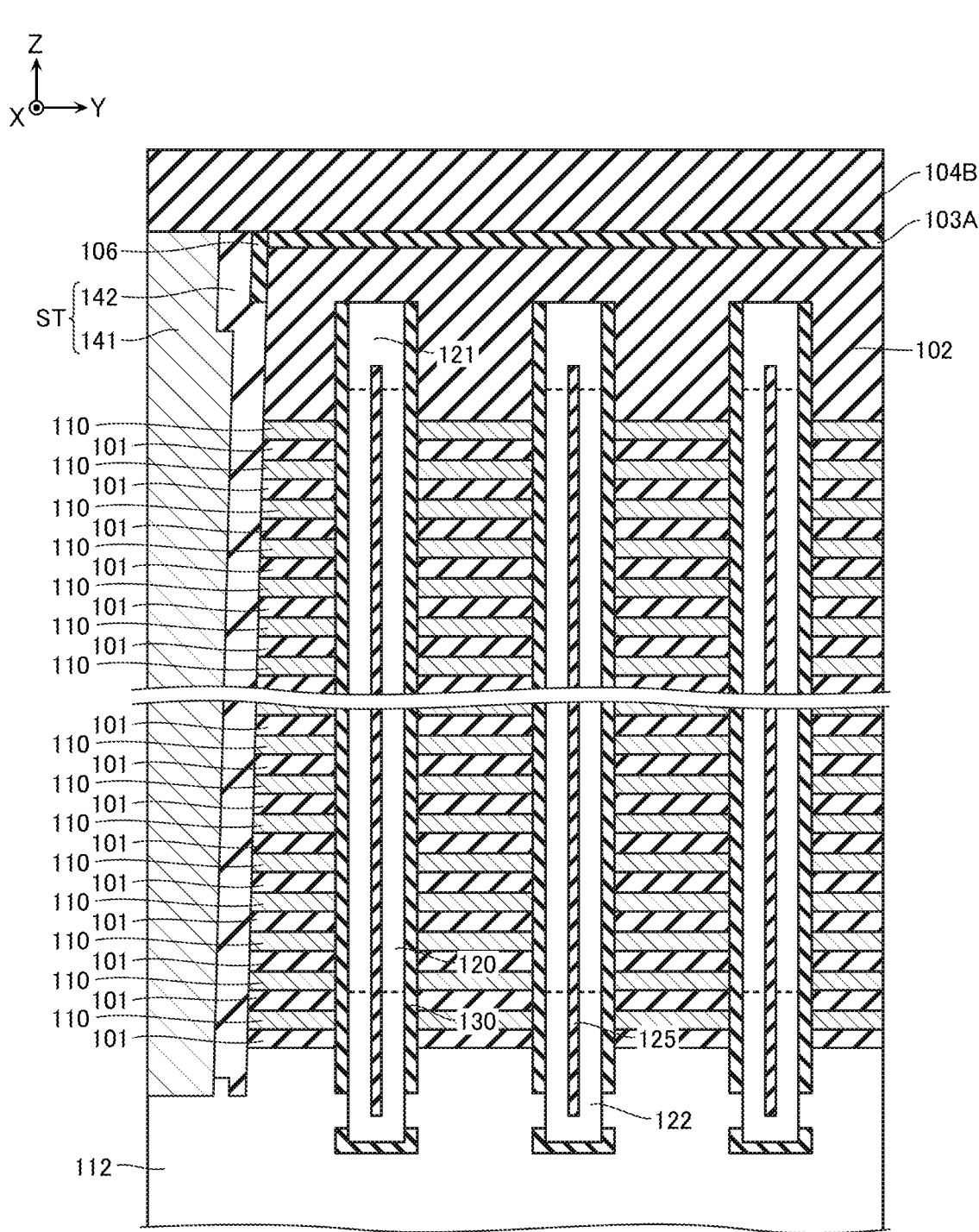
FIG. 28 is a schematic cross-sectional view for describing the same manufacturing method.

Next, for example, as illustrated in FIG. 28, an insulating layer 104B of silicon oxide ($SiO_2$) or the like is formed on an upper surface of the structure as illustrated in FIG. 27. This process is, for example, performed by a method, such as CVD.

Figure 29:
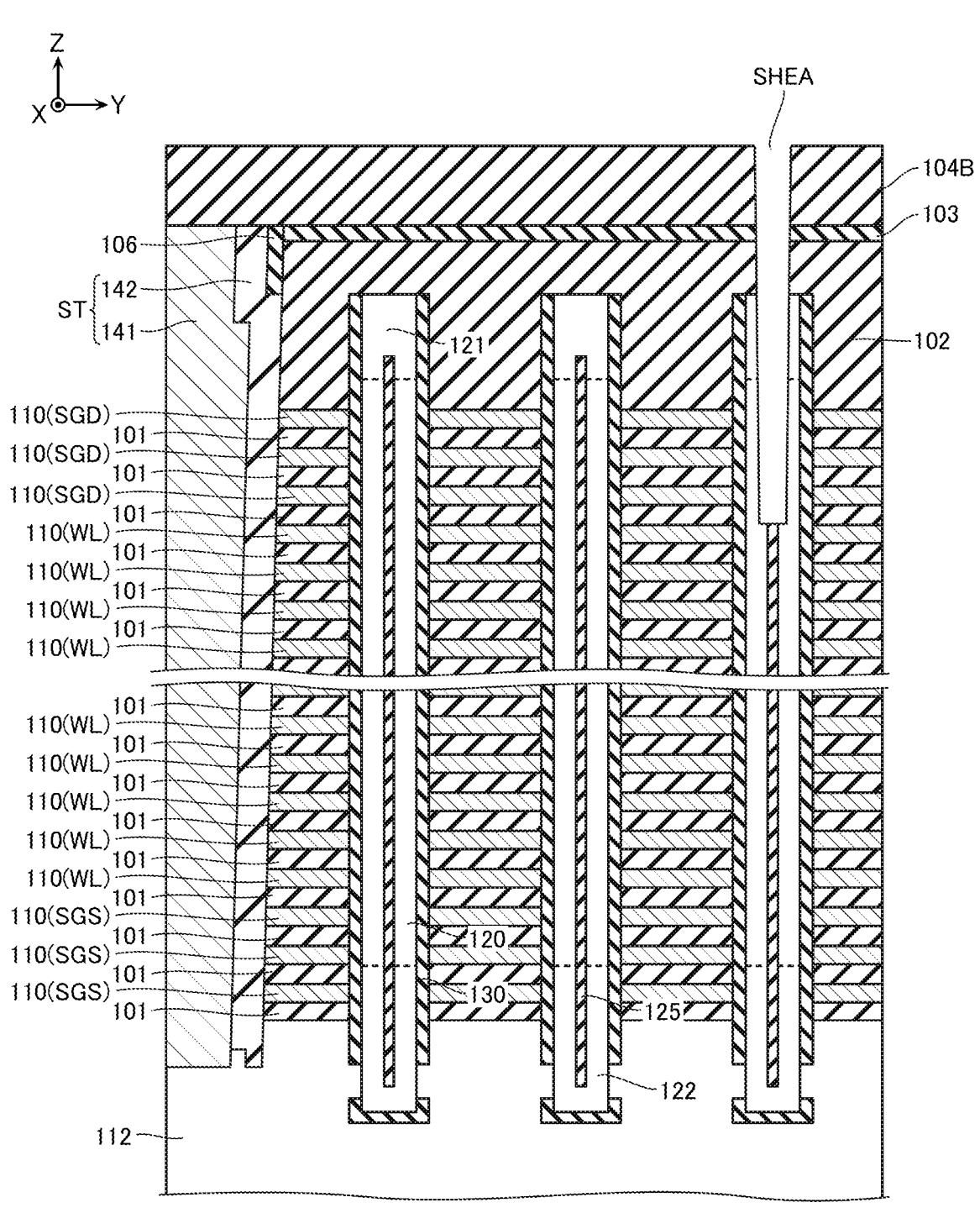
FIG. 29 is a schematic cross-sectional view for describing the same manufacturing method.

Next, for example, as illustrated in FIG. 29, a trench SHEA is formed at a position corresponding to the inter-string unit insulating layer SHE. The trench SHEA extends in the Z-direction and the X-direction and separates the insulating layers 104B, 103A, and 102, and the plurality of conductive layers 110 (SGD) and the insulating layers 101 disposed between each two of the plurality of conductive layers 110 (SGD) in the Y-direction. This process is, for example, performed by a method, such as RIE. Note that, in this process, the insulating layer 103A is separated in the Y-direction to form the insulating layer 103.

Figure 30:
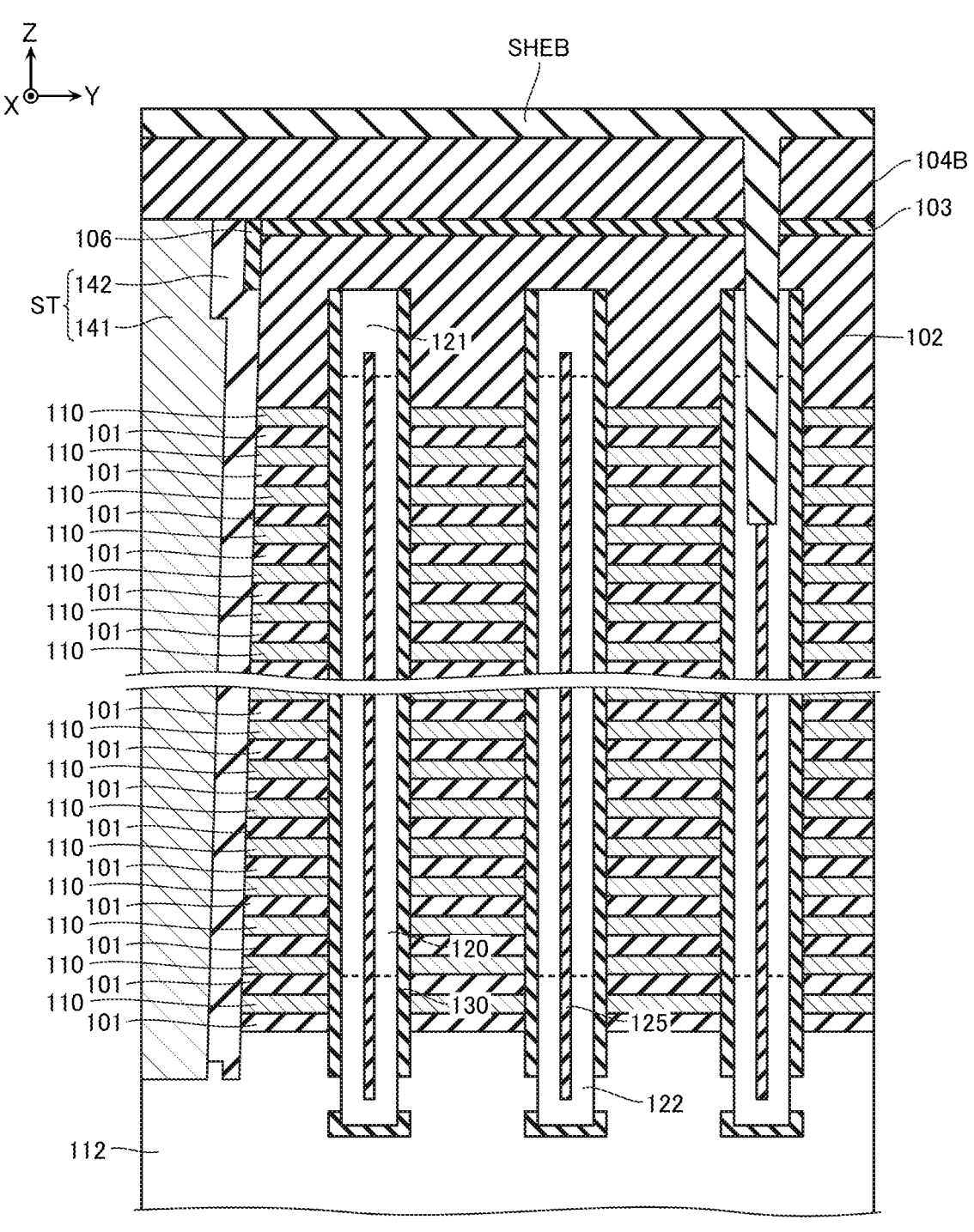
FIG. 30 is a schematic cross-sectional view for describing the same manufacturing method.

Next, for example, as illustrated in FIG. 30, an insulating layer SHEB is formed on the upper surface of the insulating layer 104B and inside the trench SHEA. This process is, for example, performed by a method, such as CVD.

Figure 31:
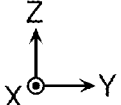
FIG. 31 is a schematic cross-sectional view for describing the same manufacturing method.

Next, for example, as illustrated in FIG. 31, the insulating layer 104B and a part of the insulating layer SHEB are removed to expose the upper surface of the insulating layer 103. This process is, for example, performed by a method, such as CMP, with the insulating layer 103 as a stopper. In this process, the inter-string unit insulating layer SHE is formed.

Figure 32:
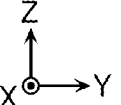
FIG. 32 is a schematic cross-sectional view for describing the same manufacturing method.

Next, for example, as illustrated in FIG. 32, the insulating layer 104 is formed on an upper surface of the structure as illustrated in FIG. 31. This process is, for example, performed by a method, such as CVD.

Figure 33:
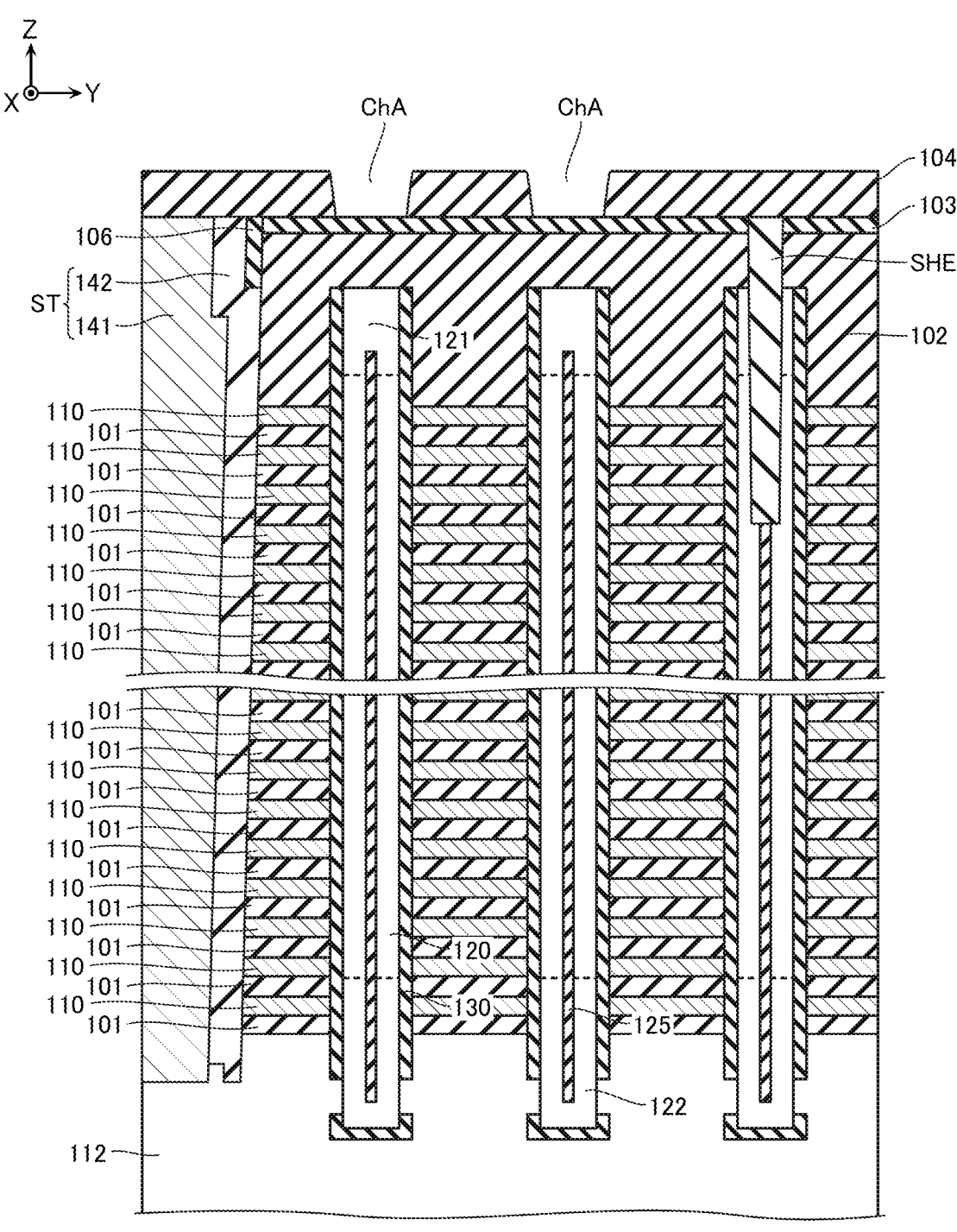
FIG. 33 is a schematic cross-sectional view for describing the same manufacturing method.

Next, for example, as illustrated in FIG. 33, contact holes ChA are formed at positions corresponding to the via-contact electrodes Ch. The contact hole ChA is a through-hole that extends in the Z-direction, passes through the insulating layer 104, and exposes the upper surface of the insulating layer 103. This process is, for example, performed by a method, such as RIE.

Figure 34:
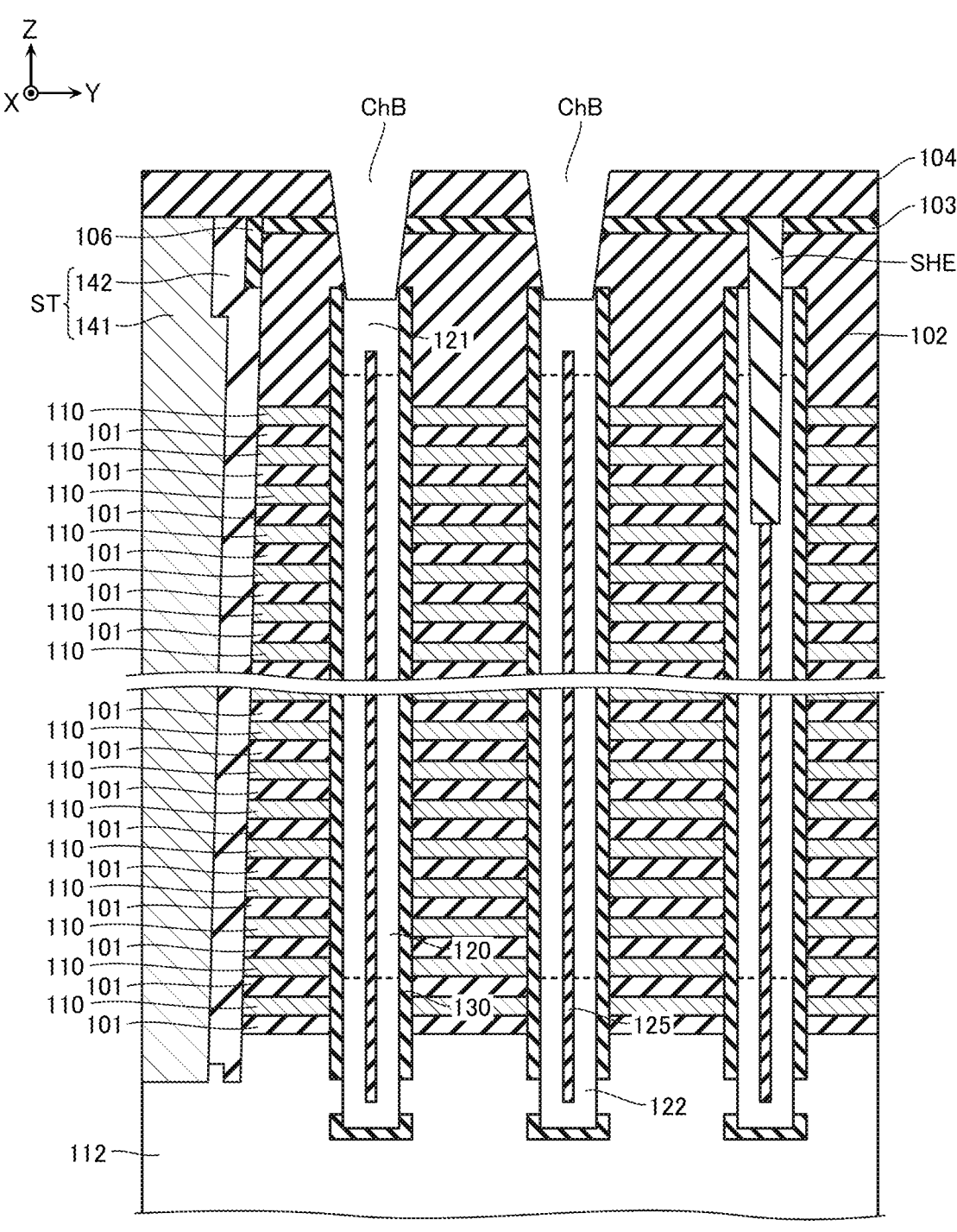
FIG. 34 is a schematic cross-sectional view for describing the same manufacturing method.

Next, for example, as illustrated in FIG. 34, contact holes ChB are formed at the positions corresponding to the via-contact electrodes Ch. The contact hole ChB is a through-hole that extends in the Z-direction, passes through the insulating layers 104 and 103 and a part of the insulating layer 102, and exposes an upper surface of the impurity region 121 of the semiconductor layer 120. This process is, for example, performed by a method, such as RIE.

Figure 35:
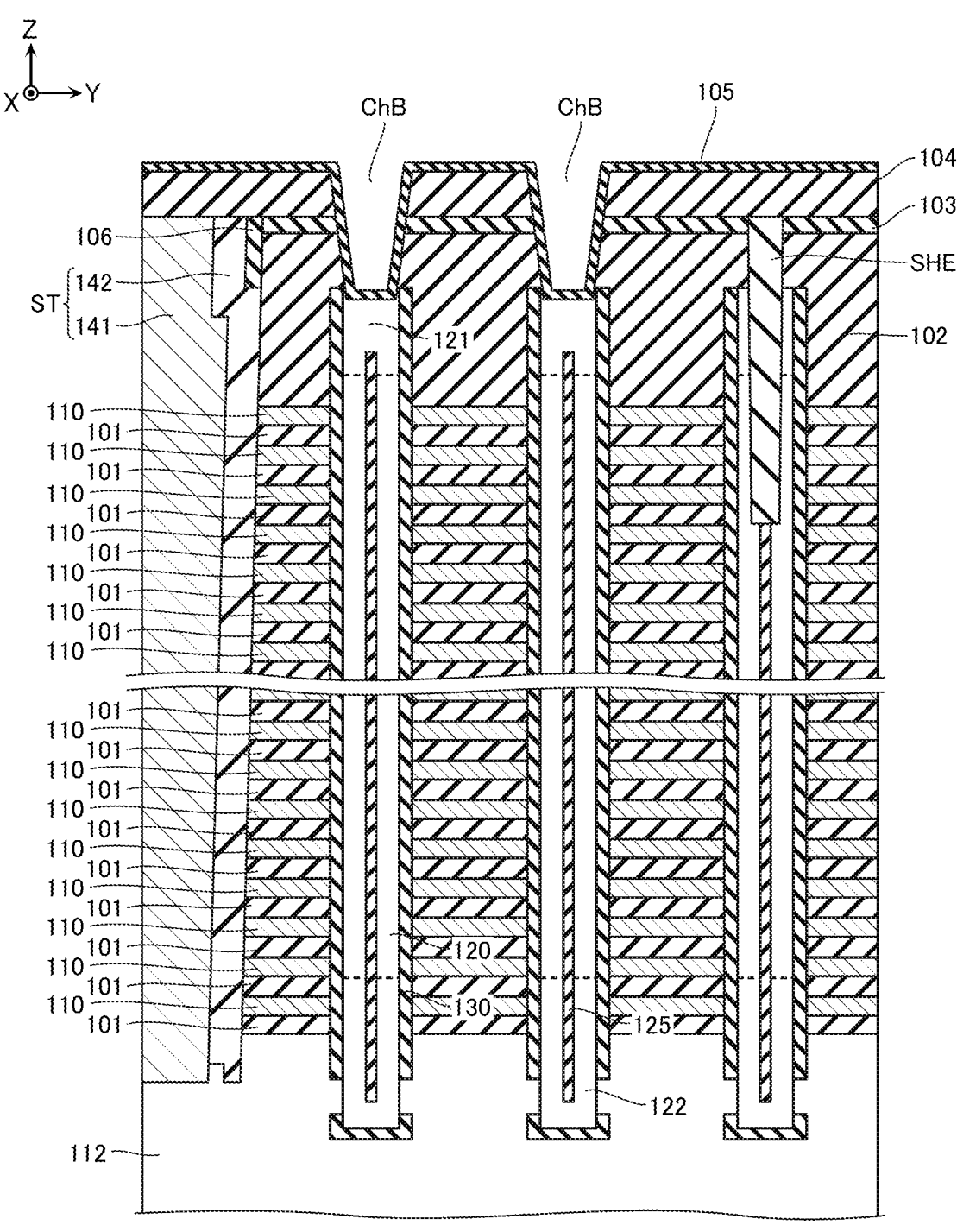
FIG. 35 is a schematic cross-sectional view for describing the same manufacturing method.

Next, for example, as illustrated in FIG. 35, the insulating layer 105 is formed on the upper surface of the insulating layer 104 and inner peripheral surfaces and bottom surfaces of the contact holes ChB. This process is, for example, performed by a method, such as CVD.

Figure 36:
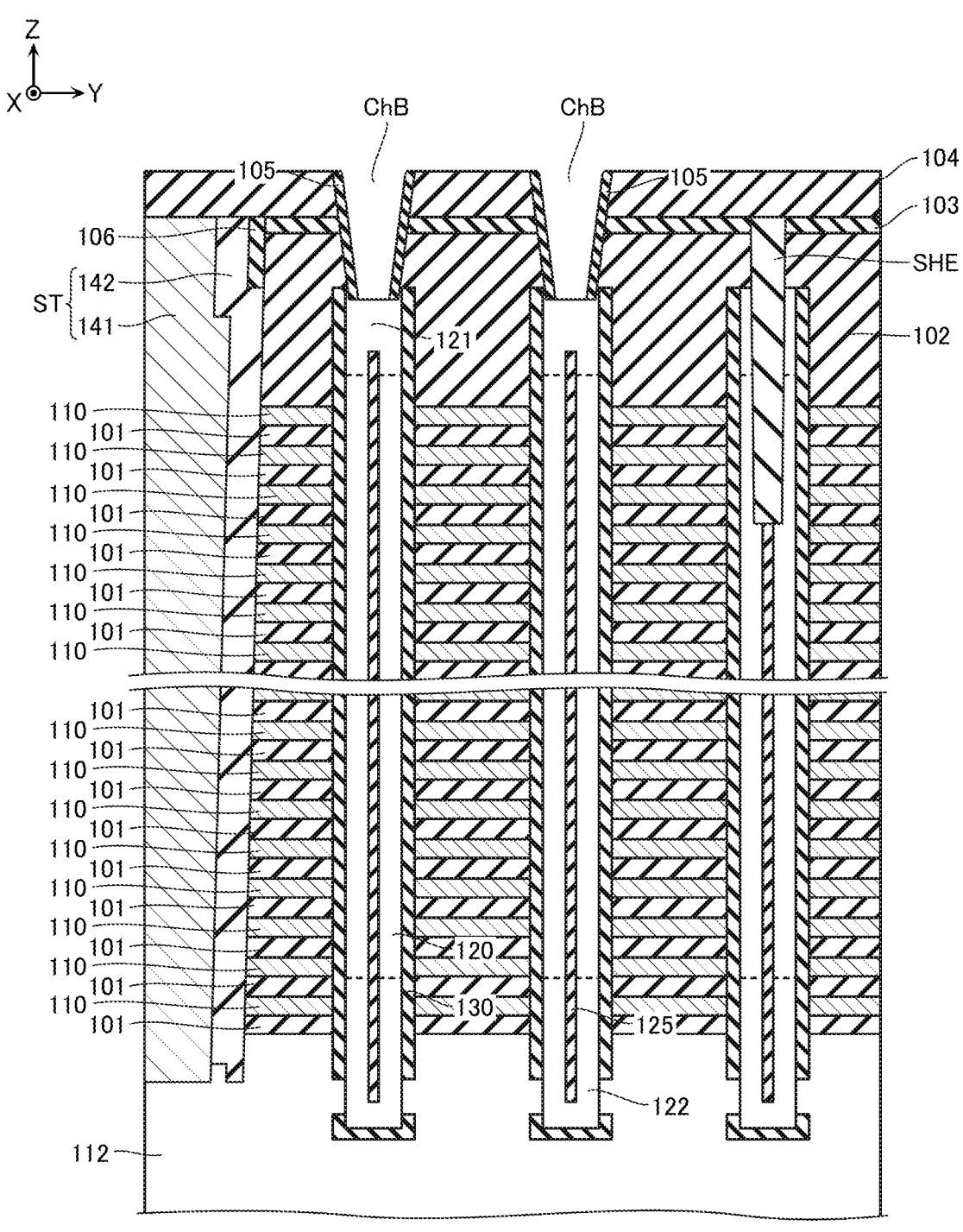
FIG. 36 is a schematic cross-sectional view for describing the same manufacturing method.

Next, for example, as illustrated in FIG. 36, parts of the insulating layer 105 are removed to expose the upper surfaces of the insulating layer 104 and the impurity regions 121 of the semiconductor layers 120. This process is performed such that portions of the insulating layer 105 disposed on the inner peripheral surfaces of the contact holes ChB remain. This process is, for example, performed by anisotropic etching, such as RIE.

Figure 37:
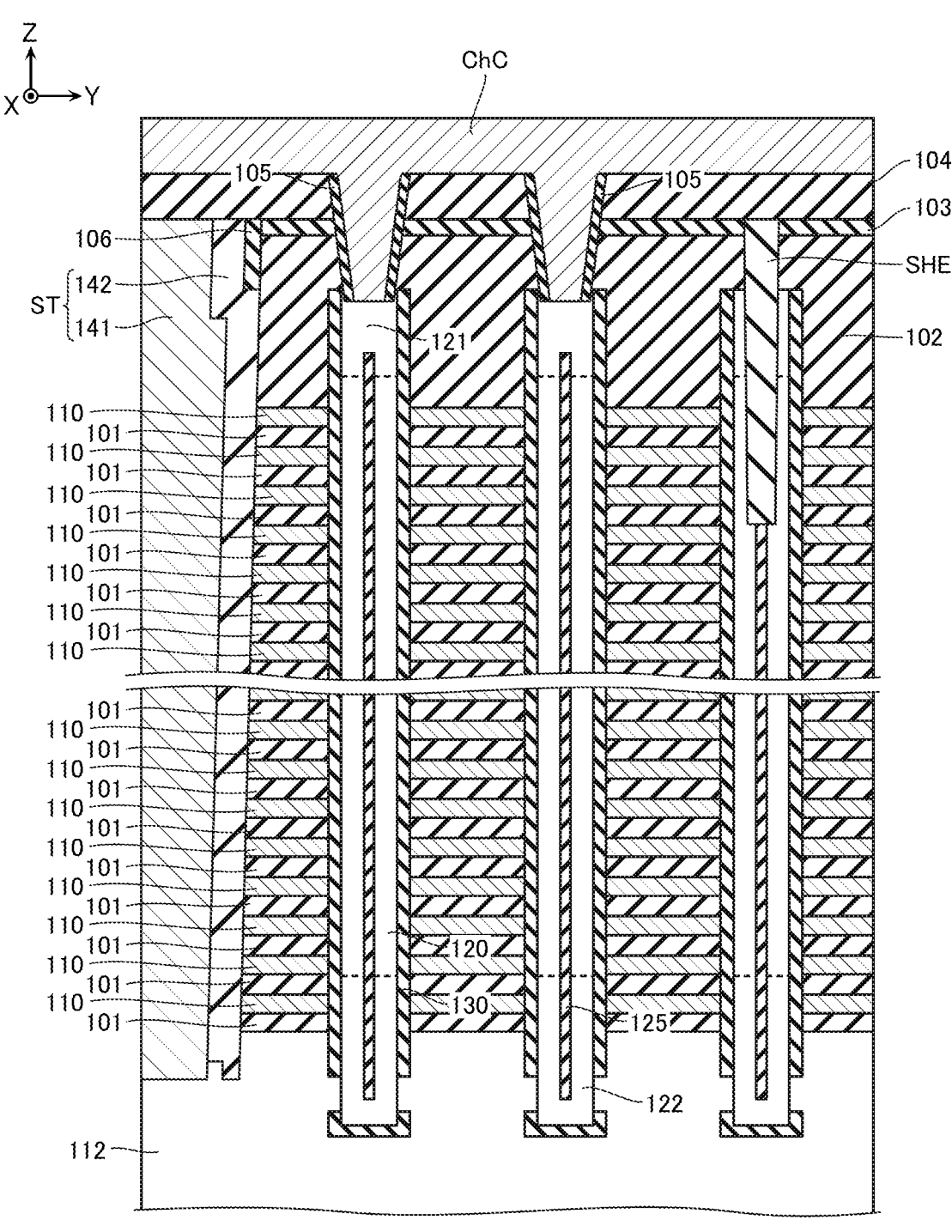
FIG. 37 is a schematic cross-sectional view for describing the same manufacturing method.

Next, for example, as illustrated in FIG. 37, a conductive member ChC is formed on the upper surfaces of the insulating layers 104 and 105 and inside the contact holes ChB. This process is, for example, performed by a method, such as CVD.

Figure 38:
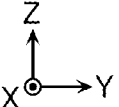
FIG. 38 is a schematic cross-sectional view for describing the same manufacturing method.

Next, for example, as illustrated in FIG. 38, parts of the conductive member ChC are removed to expose the upper surface of the insulating layer 104. This process is, for example, performed by a method, such as CMP, with the insulating layer 104 as a stopper. In this process, the via-contact electrodes Ch are formed.

Thereafter, the bit lines BL, the via-contact electrodes Vy, and the like described with reference to FIG. 3 are formed, thereby forming the semiconductor memory device according to the first embodiment.

[Comparative Example]

Figure 39:
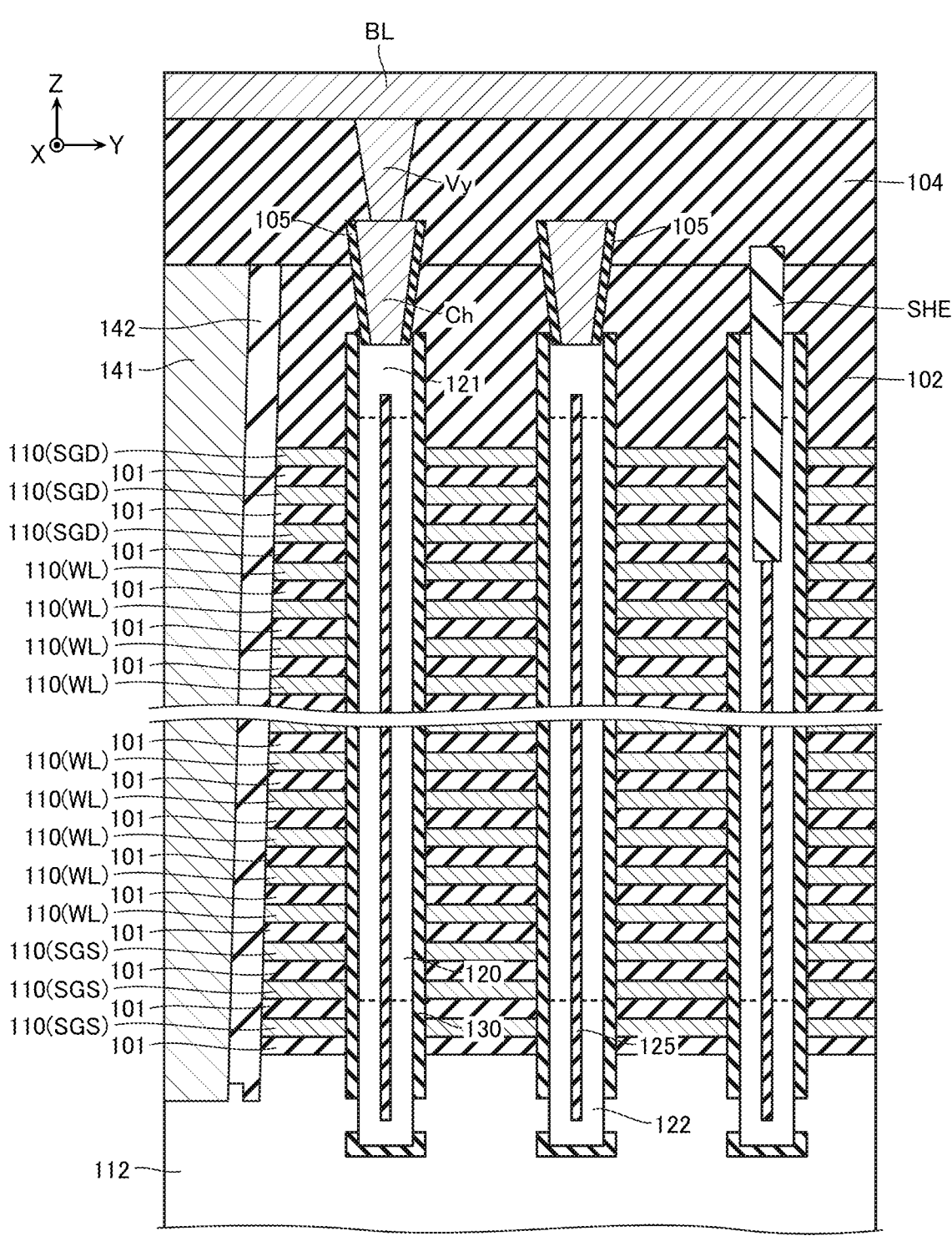
FIG. 39 is a schematic cross-sectional view illustrating a configuration of a semiconductor memory device according to a comparative example.

FIG. 39 is a schematic cross-sectional view illustrating a configuration of a semiconductor memory device according to a comparative example. The semiconductor memory device according to the comparative example does not include the insulating layer 103 or 106.

In manufacturing the semiconductor memory device according to the comparative example, the insulating layer 103A is not formed in the process described with reference to FIG. 14. The process described with reference to FIG. 16 to FIG. 20 is not performed. In the process described with reference to FIG. 27 and FIG. 31, an insulating layer of silicon oxide (SiO$_2$) or the like is used as the stopper of the CMP instead of the insulating layer 103.

Figure 40:
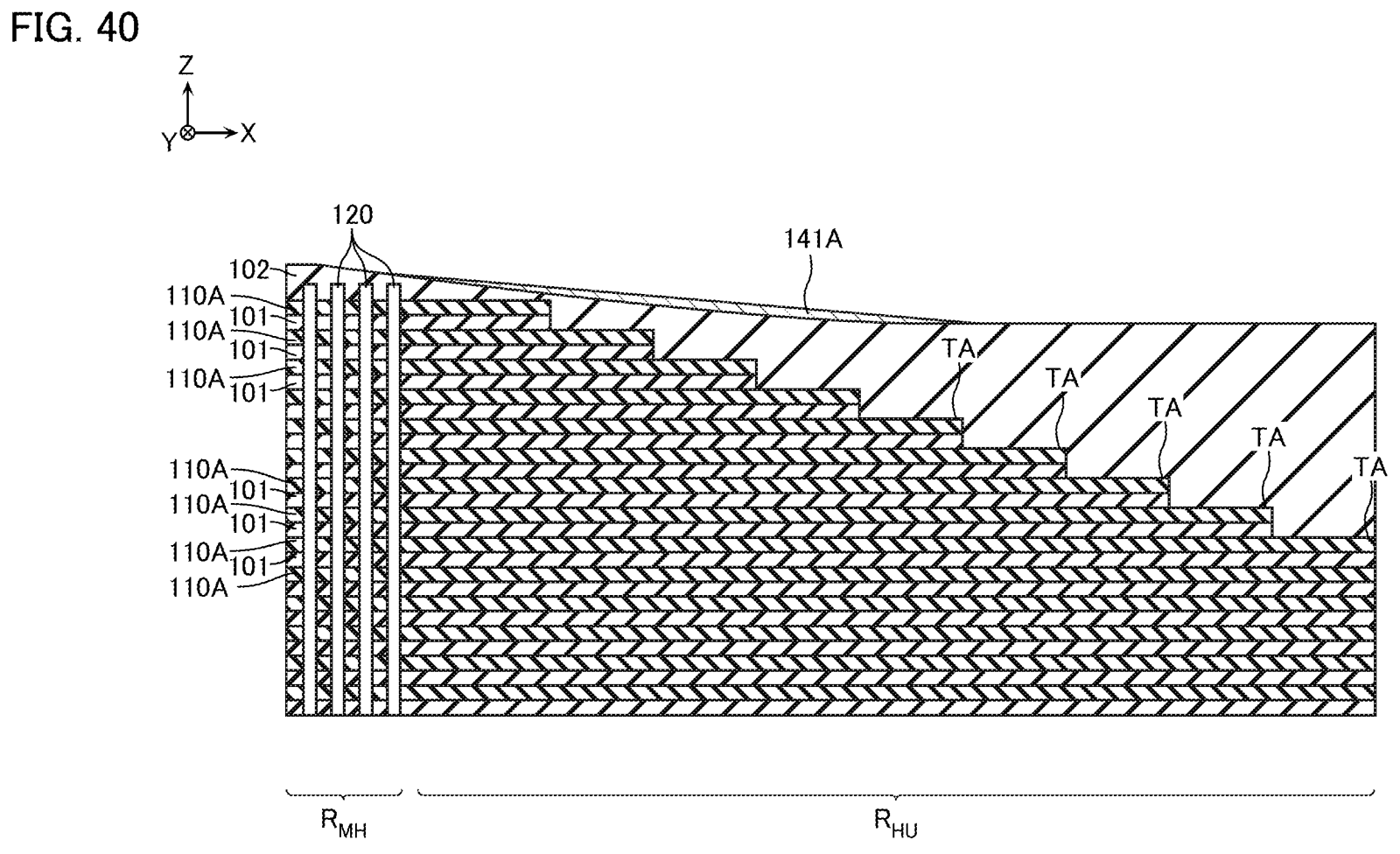
Figure 41:
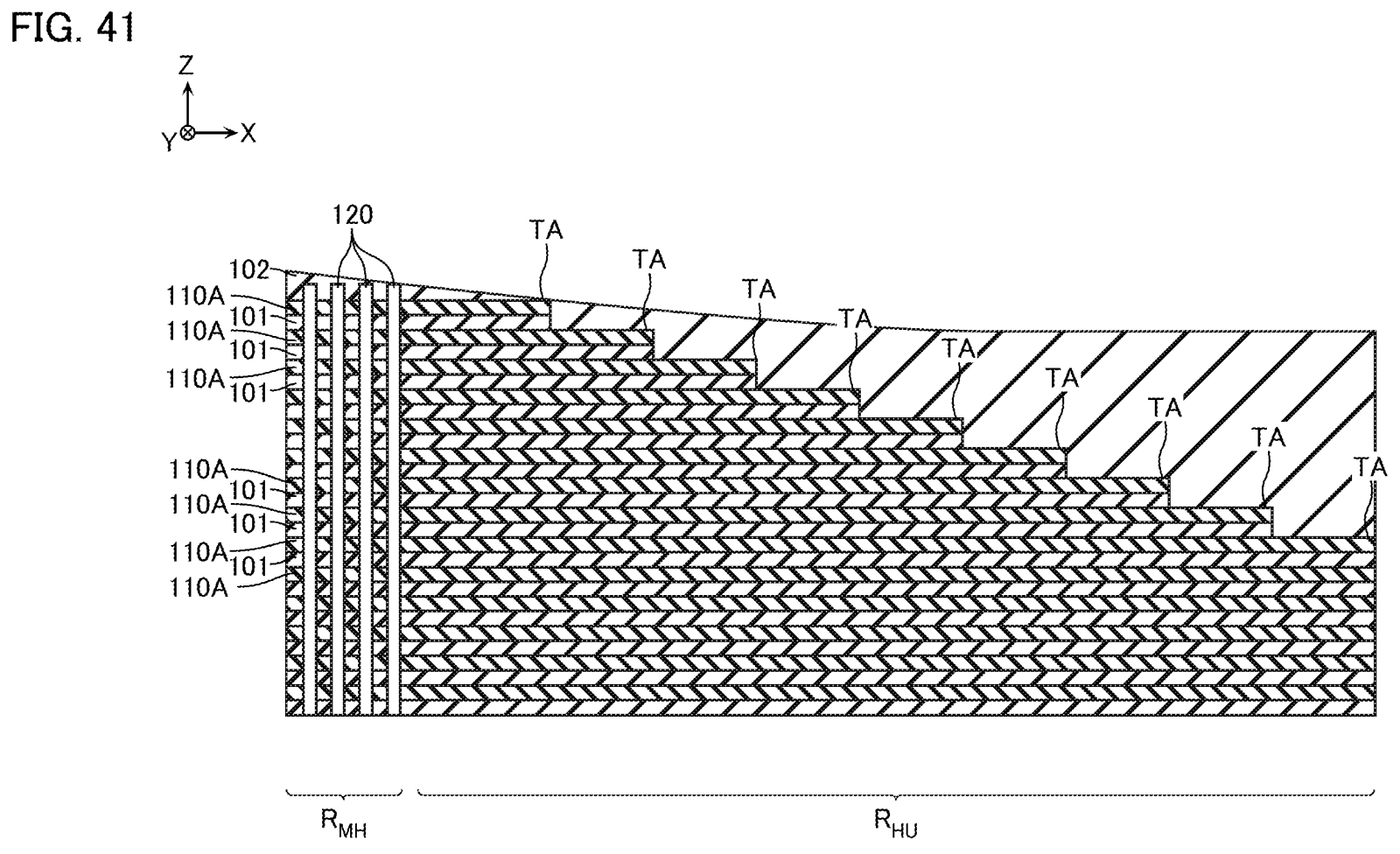

FIG. 40 and FIG. 41 are schematic cross-sectional views for describing the manufacturing process of the semiconductor memory device according to the comparative example.

In manufacturing the semiconductor memory device according to the comparative example, a step may be generated on the upper surface of the insulating layer 102 between the memory hole region R$_{MH}$ and the hook-up region R$_{HU}$ in the process described with reference to FIG. 10. In such a case, a part of the conductive member 141A possibly remains in such a stepped portion as illustrated in FIG. 40 in the process corresponding to FIG. 27 (the process of removing the part of the conductive member 141A). As the result, the contact holes ChB are difficult to be preferably formed in the process corresponding to FIG. 34 (the process of forming the contact holes ChB) due to the remaining conductive member 141A. There is also a concern that a short circuit occurs between the via-contact electrodes Ch.

In order to reduce the occurrence of such a phenomenon, it is conceivable to excessively remove the conductive member 141A by means of, for example, performing the CMP for a longer period, in the process corresponding to FIG. 27. However, in such a case, the insulating layer 102 is excessively removed as well to possibly expose the structures (the semiconductor layers 120, the gate insulating films 130, and the insulating layers 125) inside the memory holes MH as illustrated in FIG. 41. For example, in the case where the impurity region 121 in an upper end portion of the semiconductor layer 120 is removed, a contact resistance between the via-contact electrode Ch and the semiconductor layer 120 increases to possibly cause a failure in preferably operating the memory cell corresponding to this semiconductor layer 120.

Effect of First Embodiment

In manufacturing the semiconductor memory device according to the first embodiment, the insulating layer 103A of silicon nitride (SiN) or the like is formed on the upper surface of the insulating layer 102 in the process described with reference to FIG. 14. The insulating layer 103A has a different material from those of the insulating layers 104A and 102. When the conductive member 141A is removed in the process described with reference to FIG. 27, the CMP with the insulating layer 103A as the stopper is performed. With such a method, the insulating layer 102 is not removed even when the CMP is performed for a relatively long period. Accordingly, it is possible to preferably suppress the exposure of the structures (the semiconductor layers 120, the gate insulating films 130, and the insulating layers 125) inside the memory holes MH in the process described with reference to FIG. 27.

Note that, since the semiconductor memory device according to the first embodiment is manufactured by such a method, as described with reference to FIG. 3, the Z-direction positions of the upper ends of the inter-finger electrode 141 and the inter-finger insulating layers 142 approximately coincide with the Z-direction position of the upper surface of the insulating layer 103.

In manufacturing the semiconductor memory device according to the first embodiment, since the insulating layer 103A is formed in the process described with reference to FIG. 14, and thereafter, the inter-finger electrode 141 and the inter-finger insulating layers 142 are formed in the process described with reference to FIG. 24 to FIG. 27, the inter-finger electrode 141 is spaced in the Y-direction from the insulating layer 103 via the inter-finger insulating layers 142.

In the semiconductor memory device according to the first embodiment, the insulating layer 103A contains silicon nitride (SiN) or the like similarly to the sacrifice layer 110A. Accordingly, in the case where the insulating layer 103A is exposed in the trench STA in the process described with reference to, for example, FIG. 22, not only the sacrifice layers 110A, but also the insulating layer 103A is removed.

Therefore, in manufacturing the semiconductor memory device according to the first embodiment, the insulating layer 106A that protects the insulating layer 103A is formed in the process described with reference to FIG. 16 to FIG. 20. This allows preventing or reducing the insulating layer 103A from being removed in the process described with reference to FIG. 22.

Note that, since the semiconductor memory device according to the first embodiment is manufactured by such a method, the insulating layer 106 is formed on the Y-direction side surfaces of the insulating layers 102 and 103 as described with reference to FIG. 3. Since the step Stp1 (FIG. 20) is formed in association with the formation of the insulating layer 106, the steps are formed on both the Y-direction side surfaces of the inter-finger electrode 141 and the inter-finger insulating layers 142 as described with reference to FIG. 3 and the like.

In manufacturing the semiconductor memory device according to the first embodiment, the insulating layer 103A is not removed. That is, the insulating layer 103A is separated in the Y-direction together with one or the plurality of conductive layers 110 (SGD) in the process described with reference to FIG. 29, to turn into a plurality of the insulating layers 103 arranged in the Y-direction. Accordingly, in manufacturing the semiconductor memory device according to the first embodiment, the unremoved insulating layer 103A or insulating layer 103 can be used as a stopper for CMP and an intermediate stopper for etching in another process.

For example, in manufacturing the semiconductor memory device according to the first embodiment, the CMP with the insulating layer 103 as the stopper is performed in the process described with reference to FIG. 31 (the process of removing the part of the insulating layer SHEB). With such a method, in the process described with reference to FIG. 31, a variation of height positions of the upper surfaces of the structure as illustrated in FIG. 31 can be preferably suppressed.

Note that, since the semiconductor memory device according to the first embodiment is manufactured by such a method, the Z-direction position of the upper end of the inter-string unit insulating layer SHE approximately coincides with the Z-direction position of the upper surface of the insulating layer 103 as described with reference to FIG. 3.

Second Embodiment

The first embodiment illustrates the example in which the insulating layer 103 is used as the stopper for the CMP in the process described with reference to FIG. 31. However, such a method is merely an exemplary illustration, and the insulating layer 103A or the insulating layer 103 can be used as the stopper for the CMP in another process.

An example in which the insulating layer 103A or the insulating layer 103 is used as the stopper for the CMP in a process other than the process described with reference to FIG. 27 and FIG. 31 is described.

Figure 42:
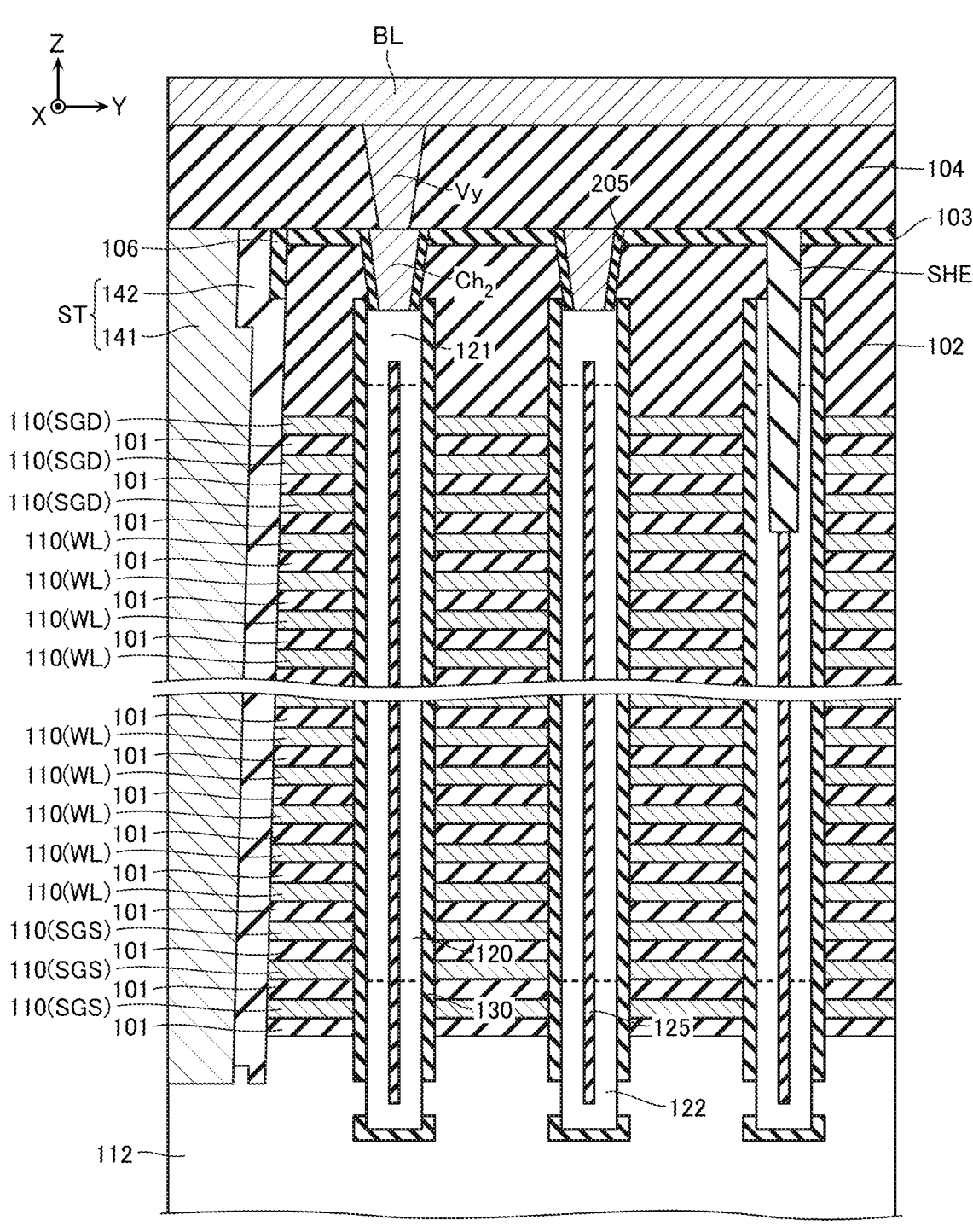
FIG. 42 is a schematic cross-sectional view illustrating a configuration of a semiconductor memory device according to a second embodiment.

FIG. 42 is a schematic cross-sectional view illustrating a configuration of a semiconductor memory device according to a second embodiment. In the following description, similar reference numerals are attached to parts similar to those in the first embodiment, and their descriptions are omitted.

The semiconductor memory device according to the second embodiment is basically configured similarly to the semiconductor memory device according to the first embodiment. However, the semiconductor memory device according to the second embodiment includes via-contact electrodes Ch 2 and insulating layers 205 instead of the via-contact electrodes Ch and the insulating layers 105 described with reference to FIG. 3.

The via-contact electrode Ch 2 is basically configured similarly to the via-contact electrode Ch. The insulating layer 205 is basically configured similarly to the insulating layer 105. However, Z-direction positions of upper ends of the via-contact electrode Ch 2 and the insulating layer 205 approximately coincide with the Z-direction position of the upper surface of the insulating layer 103. The Z-direction positions of the upper ends of the via-contact electrode Ch 2 and the insulating layer 205 may be lower than the Z-direction position of the upper surface of the insulating layer 103.

Figure 43:
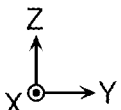
FIG. 43 is a schematic cross-sectional view for describing a method of manufacturing the semiconductor memory device according to the second embodiment.
Figure 43:
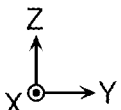

FIG. 43 is a schematic cross-sectional view for describing a method of manufacturing the semiconductor memory device according to the second embodiment. FIG. 43 illustrates a cross-sectional surface corresponding to FIG. 42.

The semiconductor memory device according to the second embodiment is basically manufactured similarly to the semiconductor memory device according to the first embodiment. However, in manufacturing the semiconductor memory device according to the first embodiment, the insulating layer 104 is used as the stopper for the CMP in the process described with reference to FIG. 38. On the other hand, in manufacturing the semiconductor memory device according to the second embodiment, the insulating layer 103 is used as the stopper for the CMP as illustrated in FIG. 43.

With such a method, a variation of height positions of upper surfaces of the structure as illustrated in FIG. 43 can be preferably suppressed in the process described with reference to FIG. 43.

With such a method, in manufacturing the contact hole corresponding to the via-contact electrode Vy, both the via-contact electrode Ch 2 and the insulating layer 103 can be used as etching stoppers. Accordingly, it is possible to, while preferably exposing an upper surface of the via-contact electrode Ch 2 on a bottom surface of such a contact hole, preferably suppress the exposure of other wirings and the like to an inside of the contact hole. This ensures preferably forming the via-contact electrode Vy.

Note that, since the semiconductor memory device according to the second embodiment is manufactured by such a method, as described with reference to FIG. 42, the Z-direction positions of the upper ends of the via-contact electrode Ch 2 and the insulating layer 205 approximately coincide with the Z-direction position of the upper surface of the insulating layer 103.

Third Embodiment

As described above, in manufacturing the semiconductor memory device according to the first embodiment, the insulating layer 106A that protects the insulating layer 103A is formed in the process described with reference to FIG. 16 to FIG. 20. This suppresses the insulating layer 103A from being removed in the process described with reference to FIG. 22. However, such a method is merely an exemplary illustration, and the specific method is adjustable as necessary.

For example, in the manufacturing method according to the first embodiment, the insulating layer 106A is formed by film formation, such as CVD, in the process described with reference to FIG. 18. However, a layer that protects the insulating layer 103A can be formed by a method, such as oxidation, instead of film formation. A layer that protects the insulating layer 103A can be formed by, for example, removing a part of the insulating layer 103A in the structure as illustrated in FIG. 17 by a method, such as wet etching, to form a recessed portion, and forming a layer other than silicon nitride (SiN) in this recessed portion.

Such an example is described below.

Figure 44:
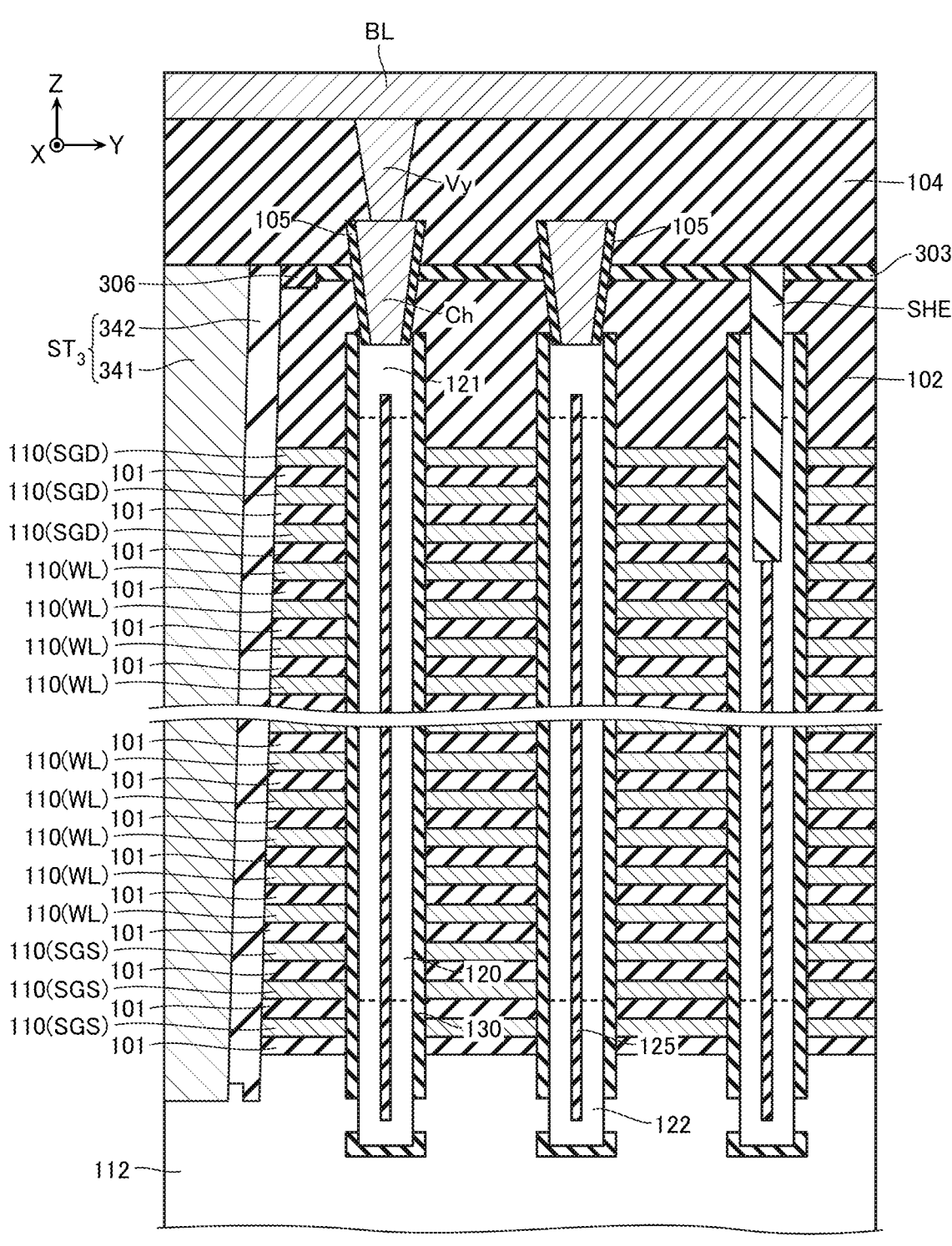
FIG. 44 is a schematic cross-sectional view illustrating a configuration of a semiconductor memory device according to a third embodiment.
Figure 45:
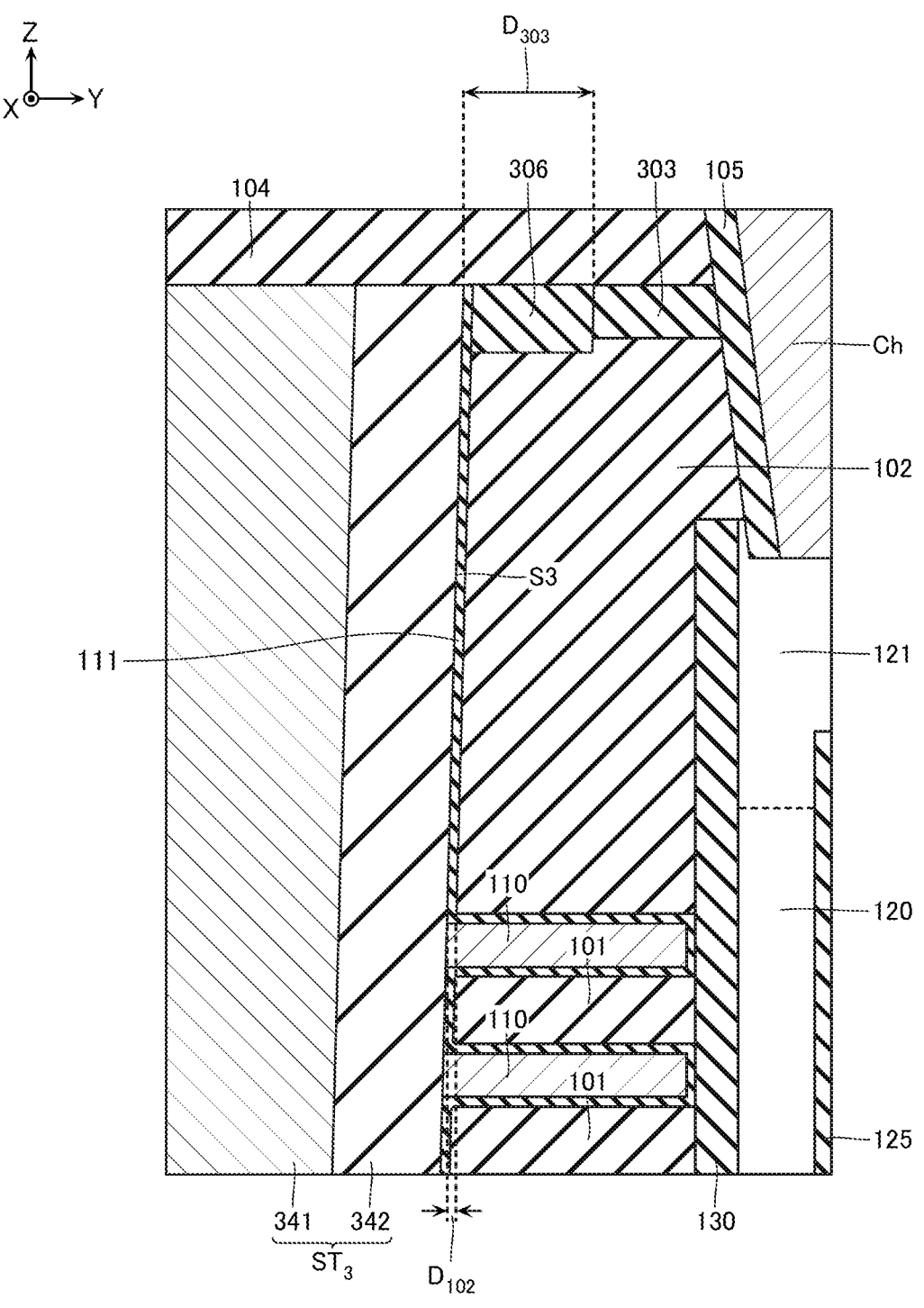
FIG. 45 is a schematic cross-sectional view illustrating the configuration of the semiconductor memory device according to the third embodiment.

FIG. 44 is a schematic cross-sectional view illustrating a configuration of a semiconductor memory device according to a third embodiment. FIG. 45 is a schematic cross-sectional view illustrating the configuration of the same semiconductor memory device and illustrates an enlarged part of FIG. 44. In the following description, similar reference numerals are attached to parts similar to those in the first embodiment, and their descriptions are omitted.

The semiconductor memory device according to the third embodiment is basically configured similarly to the semiconductor memory device according to the first embodiment. However, the semiconductor memory device according to the third embodiment includes an insulating layer 303 instead of the insulating layer 103 described with reference to FIG. 3. The semiconductor memory device according to the third embodiment includes an insulating layer 306 instead of the insulating layer 106 described with reference to FIG. 3 and the like. The semiconductor memory device according to the third embodiment includes an inter-finger structure $ST_3$ instead of the inter-finger structure ST described with reference to FIG. 6 and the like.

The insulating layer 303 is basically configured similarly to the insulating layer 103. However, the insulating layer 103 entirely covers the upper surface of the insulating layer 102. On the other hand, the insulating layer 303 does not cover the upper surface of the insulating layer 102 in a region at the proximity of the inter-finger structure $ST_3$.

The insulating layer 306 is formed by oxidizing a part of the insulating layer 103A containing silicon nitride (SiN) as described later with reference to FIG. 46 and FIG. 47.

Accordingly, the insulating layer 306 is, for example, a layer containing oxygen (O) and silicon (Si), such as silicon oxide (SiO$_2$) and silicon oxynitride (SiON). However, the insulating layer 306 can also be formed by removing a part of the insulating layer 103A in the structure as illustrated in FIG. 17 by a method, such as wet etching, to form a recessed portion, and implanting a layer other than silicon nitride (SiN) in this recessed portion, as described above. In such a case, the insulating layer 306 need not contain at least one of the oxygen (O) and the silicon (Si).

The insulating layer 306 covers a portion of the upper surface of the insulating layer 102 not covered by the insulating layer 303. The insulating layer 306 has one end in the Y-direction connected to the insulating layer 303, and the other end in the Y-direction opposed to Y-direction side surface of an inter-finger insulating layer 342 via the high-dielectric-constant insulating layer 111.

The inter-finger structure ST$_3$ includes an inter-finger electrode 341 and the inter-finger insulating layer 342.

The inter-finger electrode 341 and the inter-finger insulating layer 342 are basically configured similarly to the inter-finger electrode 141 and the inter-finger insulating layer 142. However, as described with reference to FIG. 6, the steps are formed along the steps (the step Stp1 in FIG. 20) formed by the insulating layers 102 and 106 on both the Y-direction side surfaces of the inter-finger electrode 141 and the inter-finger insulating layers 142. On the other hand, such a step is not formed on both Y-direction side surfaces of the inter-finger electrode 341 and the inter-finger insulating layers 342.

For example, in the example in FIG. 45, a Y-direction side surface, on the side opposite to the inter-finger electrode 341, of the inter-finger insulating layer 342 has a surface S3 that is opposed to the insulating layers 102 and 306 via the high-dielectric-constant insulating layer 111. The surface S3 continues in the Z-direction from the height position corresponding to the lower surface of the insulating layer 102 to a height position corresponding to an upper surface of the insulating layer 303.

In the illustrated example, the distance D$_{102}$ in the Y-direction between the insulating layer 102 and the inter-finger insulating layer 342 is approximately the same as the Y-direction length (the layer thickness) of the high-dielectric-constant insulating layer 111 from the height position corresponding to the lower surface of the insulating layer 102 to the height position corresponding to the upper surface of the insulating layer 102. A distance D$_{303}$ in the Y-direction between the insulating layer 303 and the inter-finger insulating layer 342 is approximately the same as a Y-direction total length (a total layer thickness) of the high-dielectric-constant insulating layer 111 and the insulating layer 306 from a height position corresponding to a lower surface of the insulating layer 303 to a height position corresponding to the upper surface of the insulating layer 303. Accordingly, the distance D$_{303}$ is larger than the distance D$_{102}$. Even though variations are present in the distances D$_{102}$ and D$_{303}$, a minimum value of the distance D$_{303}$ is larger than the maximum value of the distance D$_{102}$. The difference between the distances D$_{303}$ and D$_{102}$, which are the distances between the insulating layers 303 and 102 and the inter-finger insulating layers 342, is approximately equal to one another on both the Y-direction side surfaces of the inter-finger structure ST$_3$.

Note that, Z-direction positions of upper ends of the inter-finger electrode 341, the inter-finger insulating layer 342, and the insulating layer 306 approximately coincide with Z-direction position of the upper surface of the insulating layer 303. However, the Z-direction positions of the upper ends of the inter-finger electrode 341, the inter-finger insulating layer 342, and the insulating layer 306 may be lower than the Z-direction position of the upper surface of the insulating layer 303.

Figure 46:
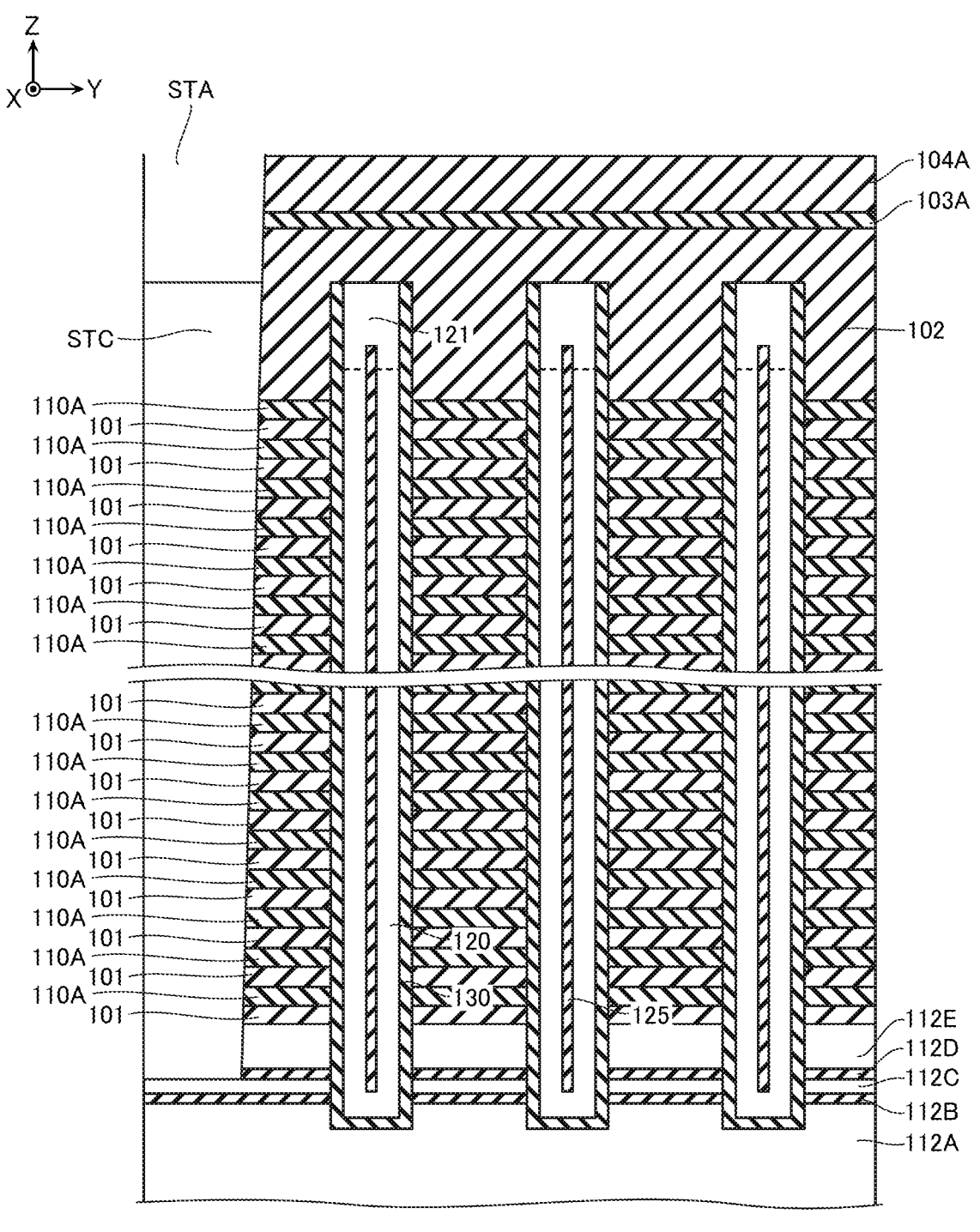
FIG. 46 is a schematic cross-sectional view for describing a method of manufacturing the semiconductor memory device according to the third embodiment.
Figure 47:
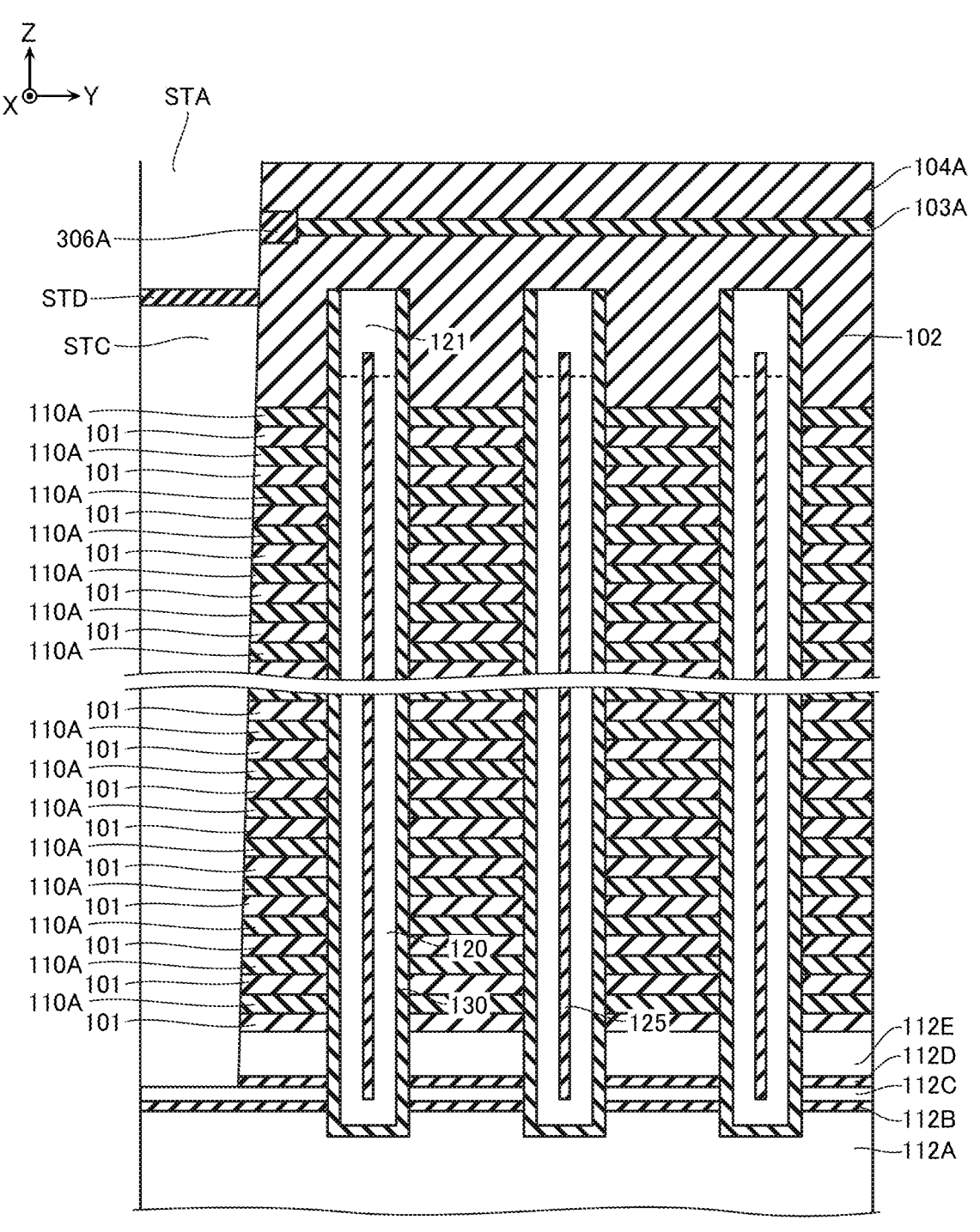
FIG. 47 is a schematic cross-sectional view for describing the method of manufacturing the semiconductor memory device according to the third embodiment.

FIG. 46 and FIG. 47 are schematic cross-sectional views for describing a method of manufacturing the semiconductor memory device according to the third embodiment. FIG. 46 and FIG. 47 illustrate cross-sectional surfaces corresponding to FIG. 44.

The semiconductor memory device according to the third embodiment is basically manufactured similarly to the semiconductor memory device according to the first embodiment.

However, in manufacturing the semiconductor memory device according to the first embodiment, the resist STB is formed in the process described with reference to FIG. 16. On the other hand, in manufacturing the semiconductor memory device according to the third embodiment, a sacrifice layer STC (FIG. 46) of silicon (Si) or the like is formed in the process corresponding to FIG. 16.

In manufacturing the semiconductor memory device according to the first embodiment, the insulating layer 106A is formed by film formation in the process described with reference to FIG. 18. On the other hand, in manufacturing the semiconductor memory device according to the third embodiment, an oxidation process is performed as illustrated in FIG. 47 in the process corresponding to FIG. 18 to form an insulating layer 306A on the exposed portion of the insulating layer 103A to the trench STA. In the illustrated example, an insulating layer STD is formed also on an upper surface of the sacrifice layer STC. This process may, for example, be performed under a condition in which silicon nitride (SiN) is oxidized more easily than silicon (Si).

The semiconductor memory device according to the third embodiment can also provide an effect similar to that of the semiconductor memory device according to the first embodiment.

Note that, in the example in FIG. 44, the semiconductor memory device according to the third embodiment includes the via-contact electrodes Ch and the insulating layers 105. However, the semiconductor memory device according to the third embodiment may include the via-contact electrodes Ch e and the insulating layers 205 described with reference to FIG. 42 instead of the via-contact electrodes Ch and the insulating layers 105. In such a case, instead of the process described with reference to FIG. 38, the process described with reference to FIG. 43 may be performed.

Other Embodiments

In the example in FIG. 5, the high-dielectric-constant insulating layer 111 is disposed on the Y-direction side surface of the insulating layer 102 and a Y-direction side surface and a lower surface of the insulating layer 106. However, in the first embodiment and the second embodiment, the high-dielectric-constant insulating layer 111 need not be disposed on the Y-direction side surface of the insulating layer 102 and the Y-direction side surface and the lower surface of the insulating layer 106. In this case, the inter-finger insulating layer 142 may be in contact with the Y-direction side surface of the insulating layer 102 and the Y-direction side surface and the lower surface of the insulating layer 106. The distance D$_{102}$ may be zero, and the distance D$_{103}$ may correspond to the length (the layer thickness) in the Y-direction of the insulating layer 106.

Similarly, in the example in FIG. 45, the high-dielectric-constant insulating layer 111 is disposed on the Y-direction side surfaces of the insulating layers 102 and 306. However, in the third embodiment, the high-dielectric-constant insulating layer 111 need not be disposed on the Y-direction side surfaces of the insulating layers 102 and 306. In this case, the inter-finger insulating layer 342 may be in contact with the Y-direction side surfaces of the insulating layers 102 and 306. The distance $D_{102}$ may be zero, and the distance $D_{303}$ may correspond to the length (the layer thickness) in the Y-direction of the insulating layer 306.

In the first embodiment to the third embodiment, the configuration of the inter-finger structure ST is adjustable as necessary. For example, the inter-finger structure ST need not contain at least one of the conductive member and the semiconductor member.

Others

While certain embodiments have been described, these embodiments have been presented by way of example only, and are not intended to limit the scope of the inventions. Indeed, the novel methods and systems described herein may be embodied in a variety of other forms: furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor memory device comprising:
a plurality of finger structures arranged in a first direction;
a bit line extending in the first direction and disposed on one side in a stacking direction intersecting with the first direction with respect to the plurality of finger structures; and
an inter-finger insulating layer disposed between a first finger structure and a second finger structure adjacent in the first direction of the plurality of finger structures, the first finger structure including:
a plurality of conductive layers arranged in the stacking direction;
a semiconductor layer extending in the stacking direction and opposed to the plurality of conductive layers, the semiconductor layer being electrically connected to the bit line;
an electric charge accumulating film disposed between the plurality of conductive layers and the semiconductor layer;
a first insulating layer disposed between the bit line and the plurality of conductive layers, the first insulating layer containing nitrogen (N) and silicon (Si); and
a second insulating layer disposed between the first insulating layer and the plurality of conductive layers, wherein
the inter-finger insulating layer extends in the stacking direction from a position closer to the bit line than the plurality of conductive layers to a position farther from the bit line than the plurality of conductive layers along a surface on a side of the second finger structure in the first direction of the plurality of conductive layers,
the first insulating layer and the second insulating layer are made of mutually different materials, and
when a distance in the first direction between the first insulating layer and the inter-finger insulating layer at a first position corresponding to a surface on a side of the bit line in the stacking direction of the first insulating layer is a first distance, and
when a distance in the first direction between the second insulating layer and the inter-finger insulating layer at a second position corresponding to a surface on an opposite side of the bit line in the stacking direction of the second insulating layer is a second distance,
the first distance is larger than the second distance.

2. The semiconductor memory device according to claim 1, further comprising
a high-dielectric-constant insulating layer disposed between the inter-finger insulating layer and the second insulating layer.

3. The semiconductor memory device according to claim 1, further comprising
at least one of a conductive member and a semiconductor member disposed between the inter-finger insulating layer and the second finger structure, wherein
the at least one of the conductive member and the semiconductor member has an end portion on a side of the bit line in the stacking direction which has a position in the stacking direction approximately coinciding with the first position.

4. The semiconductor memory device according to claim 1, wherein
the inter-finger insulating layer has an end portion on a side of the bit line in the stacking direction which has a position in the stacking direction approximately coinciding with the first position.

5. The semiconductor memory device according to claim 1, wherein
the inter-finger insulating layer has a surface on a side of the first finger structure in the first direction which includes:
a first part continuing in the stacking direction from the second position to a third position between the first position and the second position along a surface on a side of the second finger structure in the first direction of the second insulating layer; and
a second part continuing in the stacking direction from the third position to the first position, and
in the first direction, the second part has an end portion on an opposite side of the bit line in the stacking direction which is disposed on a side of the second finger structure in the first direction with respect to an end portion on a side of the bit line in the stacking direction of the first part.

6. The semiconductor memory device according to claim 5, further comprising
a third insulating layer disposed on surfaces on a side of the second finger structure in the first direction of the second insulating layer and the first insulating layer, wherein
the third insulating layer extends in the stacking direction from the third position or a position on a side of the bit line in the stacking direction with respect to the third position to the first position.

7. The semiconductor memory device according to claim 6, wherein
the third insulating layer has an end portion on a side of the bit line in the stacking direction which has a position in the stacking direction approximately coinciding with the first position.

8. The semiconductor memory device according to claim 5, wherein
when a minimum value of a distance in the first direction between the first insulating layer and the inter-finger insulating layer from the first position to a fourth position corresponding to a surface on an opposite side of the bit line in the stacking direction of the first insulating layer is a first minimum distance, and when a maximum value of a distance in the first direction between the second insulating layer and the inter-finger insulating layer from the second position to the third position is a first maximum distance, the first minimum distance is larger than the first maximum distance.

9. The semiconductor memory device according to claim 1, wherein the inter-finger insulating layer has a surface on a side of the first finger structure in the first direction which continues in the stacking direction from the second position to the first position.

10. The semiconductor memory device according to claim 9, further comprising a fourth insulating layer disposed on a surface on a side of the second finger structure in the first direction of the first insulating layer, wherein the fourth insulating layer has an end portion on an opposite side of the bit line in the stacking direction which is in contact with the second insulating layer.

11. The semiconductor memory device according to claim 10, wherein the fourth insulating layer has an end portion on a side of the bit line in the stacking direction which has a position in the stacking direction approximately coinciding with the first position.

12. The semiconductor memory device according to claim 10, wherein when a minimum value of a distance in the first direction between the first insulating layer and the inter-finger insulating layer from the first position to a fourth position corresponding to a surface on an opposite side of the bit line in the stacking direction of the first insulating layer is a second minimum distance, and when a maximum value of a distance in the first direction between the second insulating layer and the inter-finger insulating layer from the second position to a fifth position corresponding to a surface on an opposite side of the bit line in the stacking direction of the fourth insulating layer is a second maximum distance, the second minimum distance is larger than the second maximum distance.

13. The semiconductor memory device according to claim 1, further comprising a via-contact electrode connected to an end portion on a side of the bit line in the stacking direction of the semiconductor layer, wherein the via-contact electrode has an end portion on a side of the bit line in the stacking direction which has a position in the stacking direction closer to the bit line than the first position.

14. The semiconductor memory device according to claim 1, further comprising a via-contact electrode connected to an end portion on a side of the bit line in the stacking direction of the semiconductor layer, wherein the via-contact electrode has an end portion on a side of the bit line in the stacking direction which has a position in the stacking direction approximately coinciding with the first position.

15. A semiconductor memory device comprising:

a plurality of first conductive layers arranged in a stacking direction;

a bit line disposed on one side in the stacking direction with respect to the plurality of first conductive layers and extending in a first direction intersecting with the stacking direction;

a plurality of second conductive layers disposed at a position between the plurality of first conductive layers and the bit line, the position overlapping with the plurality of first conductive layers viewing from the stacking direction, the plurality of second conductive layers being arranged in the first direction;

a semiconductor layer extending in the stacking direction and opposed to the plurality of first conductive layers and one of the plurality of second conductive layers, the semiconductor layer being electrically connected to the bit line;

an electric charge accumulating film disposed between the plurality of first conductive layers and the semiconductor layer;

a plurality of first insulating layers disposed between the semiconductor layer and the bit line in the stacking direction and arranged in the first direction corresponding to the plurality of second conductive layers, the plurality of first insulating layers containing nitrogen (N) and silicon (Si);

a plurality of second insulating layers disposed between the plurality of first insulating layers and the plurality of second conductive layers and arranged in the first direction corresponding to the plurality of second conductive layers; and an inter-stacked structure insulating layer extending in the stacking direction from a position closer to the bit line than the plurality of second conductive layers to a position farther from the bit line than the plurality of first conductive layers along side surfaces in the first direction of the plurality of first conductive layers, one of the plurality of second conductive layers, one of the plurality of first insulating layers, and one of the plurality of second insulating layers, wherein the plurality of first insulating layers and the plurality of second insulating layers are made of mutually different materials, and when a distance in the first direction between the one of the plurality of first insulating layers and the inter-stacked structure insulating layer at a first position corresponding to surfaces on a side of the bit line in the stacking direction of the plurality of first insulating layers is a first distance, and when a distance in the first direction between the one of the plurality of second insulating layers and the inter-stacked structure insulating layer at a second position corresponding to surfaces on an opposite side of the bit line in the stacking direction of the plurality of second insulating layers is a second distance, the first distance is larger than the second distance.

16. The semiconductor memory device according to claim 15, further comprising an inter-conductive layer insulating layer extending in the stacking direction and disposed between two second conductive layers adjacent in the first direction of the plurality of second conductive layers, wherein one of the plurality of first insulating layers has a surface on a side of the bit line in the stacking direction which has a position in the stacking direction approximately coinciding with a position in the stacking direction of an end portion on a side of the bit line in the stacking direction of the inter-conductive layer insulating layer.

*    *    *    *    *